United States Patent
Toshiro et al.

(10) Patent No.: US 8,673,721 B2
(45) Date of Patent: Mar. 18, 2014

(54) THREE-DIMENSIONAL SEMICONDUCTOR MEMORY DEVICE AND METHOD FOR MANUFACTURING THE SAME

(75) Inventors: Nakanishi Toshiro, Seongnam-si (KR); Choong Man Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 285 days.

(21) Appl. No.: 13/117,489

(22) Filed: May 27, 2011

(65) Prior Publication Data

US 2011/0294290 A1    Dec. 1, 2011

(30) Foreign Application Priority Data

May 28, 2010   (KR) .................. 10-2010-0050479

(51) Int. Cl.
*H01L 21/336* (2006.01)
(52) U.S. Cl.
USPC ........................................................ 438/287
(58) Field of Classification Search
None
See application file for complete search history.

(56) References Cited

U.S. PATENT DOCUMENTS

| | | | |
|---|---|---|---|
| 7,383,476 B2 * | 6/2008 | Crowley et al. | 714/723 |
| 8,120,089 B2 * | 2/2012 | Kim et al. | 257/314 |
| 2008/0242034 A1 * | 10/2008 | Mokhlesi et al. | 438/287 |
| 2009/0302377 A1 * | 12/2009 | Son et al. | 257/329 |
| 2010/0163968 A1 * | 7/2010 | Kim et al. | 257/324 |
| 2010/0181610 A1 * | 7/2010 | Kim et al. | 257/314 |

FOREIGN PATENT DOCUMENTS

| | | |
|---|---|---|
| JP | 2008-160004 | 7/2008 |
| JP | 2008-181978 | 8/2008 |
| KR | 10-0855990 B1 | 8/2008 |
| KR | 10-2009-0047614 A | 5/2009 |

* cited by examiner

*Primary Examiner* — Charles Garber
*Assistant Examiner* — Andre' C Stevenson
(74) *Attorney, Agent, or Firm* — Lee & Morse, P.C.

(57) ABSTRACT

A three-dimensional semiconductor memory device includes a stacked structure including a plurality of conductive patterns, an active pillar penetrating the stacked structure, and a data storage pattern between the active pillar and the conductive patterns, wherein the active pillar includes a vertical semiconductor pattern penetrating the stacked structure and protruding semiconductor patterns between the vertical semiconductor pattern and the data storage pattern, the protruding semiconductor patterns having a different crystalline structure from that of the vertical semiconductor pattern.

10 Claims, 41 Drawing Sheets

THREE-DIMENSIONAL SEMICONDUCTOR MEMORY DEVICE AND METHOD FOR MANUFACTURING THE SAME

CROSS-REFERENCE TO RELATED APPLICATIONS

This U.S. non-provisional patent application claims priority under 35 U.S.C. §119 of Korean Patent Application No. 10-2010-0050479, filed on May 28, 2010, the entire contents of which are hereby incorporated by reference.

BACKGROUND

1. Field

The present disclosure herein relates to a semiconductor memory device and a method of manufacturing the same, and more particularly, to a three-dimensional semiconductor memory device having improved electrical characteristics and a method of manufacturing the same.

2. Description of the Related Art

In order to satisfy user's demand for excellent performance and low price, it is required to increase degree of integration of a semiconductor device. In the case of a semiconductor memory device, since the integration degree is an important factor which determines a product price, higher integration degree is particularly required. In the case of a typical two-dimensional or planar semiconductor memory device, the integration degree is mostly determined by an area occupied by a unit memory cell. Therefore, the typical memory device is greatly affected by a level of a technology for forming a micro pattern. However, since high-priced equipment is needed for forming the micro pattern, increasing the integration degree of the two-dimensional semiconductor memory device is limited.

For overcoming this limitation, a three-dimensional semiconductor memory device provided with three dimensionally arranged memory cells has been proposed. However, for mass production of the three-dimensional semiconductor memory device, it is required to develop fabricating technology so that manufacturing cost per bit may be lower than that of the two-dimensional semiconductor memory device and reliable production properties may also be obtained.

SUMMARY

The present disclosure provides a three-dimensional semiconductor memory device having improved electrical characteristics.

The present disclosure also provides a method of manufacturing a three-dimensional semiconductor memory device having improved electrical characteristics.

Embodiments of the inventive concept provide three-dimensional semiconductor memory devices including a stacked structure including a plurality of conductive patterns, an active pillar penetrating the stacked structure, and a data storage pattern between the active pillar and the conductive patterns, wherein the active pillar includes a vertical semiconductor pattern penetrating the stacked structure and protruding semiconductor patterns between the vertical semiconductor pattern and the data storage pattern, the protruding semiconductor patterns having a different crystalline structure from that of the vertical semiconductor pattern.

The active pillar may include a discontinuous boundary surface between the vertical semiconductor pattern and the protruding semiconductor patterns.

A mean grain size in the protruding semiconductor pattern may be larger than the mean grain size in the vertical semiconductor pattern.

The stacked structure may include insulation patterns between the conductive patterns, the vertical semiconductor pattern including a first thickness adjacent to the insulation patterns and a second thickness, thicker than the first thickness, adjacent to the conductive pattern.

The protruding semiconductor patterns may have ring shapes surrounding the vertical semiconductor pattern.

The vertical semiconductor pattern may have a hollow cylinder shape or a pillar shape.

The data storage pattern may include a plurality of data storage patterns at least partially separated from each other along a vertical direction.

The data storage pattern may further include a gate insulation layer contacting the protruding semiconductor pattern, an inter-gate insulation layer contacting the conductive pattern, and a floating gate electrode between the gate insulation layer and the inter-gate insulation layer.

The data storage patterns may be completely separated from each other, each data storage pattern extending along an upper surface and a lower surface of the protruding semiconductor pattern.

The data storage patterns may be completely separated from each other, each data storage pattern extending along an upper surface and a lower surface of the conductive pattern.

In other embodiments of the inventive concept, methods for manufacturing a three-dimensional semiconductor memory device include forming a stacked structure including a plurality of first and second material layers alternately stacked on a substrate, forming a first penetration region through the stacked structure to expose the substrate, forming recess regions between the second material layers by recessing sidewalls of the first material layers exposed to the first penetration region, forming preliminary semiconductor patterns partially in the recess regions, forming first semiconductor patterns by recrystallizing the preliminary semiconductor patterns exposed to the first penetration region, and forming second semiconductor patterns to contact the first semiconductor patterns and the substrate in the first penetration region.

A mean grain size in the first semiconductor pattern may be larger than that in the second semiconductor pattern.

Forming the preliminary semiconductor patterns may include depositing a preliminary semiconductor layer in the first penetration region filling the recess regions, and forming the preliminary semiconductor patterns vertically-separated from each other by removing the preliminary semiconductor layer from the first penetration region.

Forming the first semiconductor patterns may include annealing the preliminary semiconductor patterns exposed to the first penetration region by directly irradiating a laser to the preliminary semiconductor patterns.

Forming the preliminary semiconductor patterns and the second semiconductor pattern may include depositing a polycrystalline semiconductor layer using a deposition method.

The method may further include forming data storage patterns on sidewalls of the first material layers exposed to the recess regions before forming the preliminary semiconductor patterns, wherein the first material layer includes a conductive material and the second material layer includes a dielectric material.

The data storage patterns may be locally formed in the recess regions and vertically-separated from each other.

The method may further include forming a second penetration region which is separated from the second semiconductor pattern and exposes the substrate penetrating the thin layer structure, forming gate electrode regions which expose the recrystallized first semiconductor patterns by removing the first material layers, conformally forming a data storage pattern in the gate electrode regions, and locally forming a gate conductive pattern in the gate electrode regions where the data storage pattern is formed, wherein the first material layer and the second material layer include dielectric materials having different etch selectivity for an isotropic etching process.

Forming the data storage pattern may include locally and conformally forming a charge trap insulation pattern at each of the gate electrode regions.

In yet other embodiments of the inventive concept, methods for manufacturing a three-dimensional semiconductor memory device include forming a stacked structure including a plurality of conductive patterns, forming an active pillar to have a vertical semiconductor pattern through the stacked structure and a plurality of protruding semiconductor patterns extending from the vertical semiconductor pattern, such that the protruding semiconductor patterns have a different crystalline structure from that of the vertical semiconductor pattern, and forming a data storage pattern between the active pillar and the conductive patterns, such that the protruding semiconductor patterns are between the vertical semiconductor pattern and the data storage pattern.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
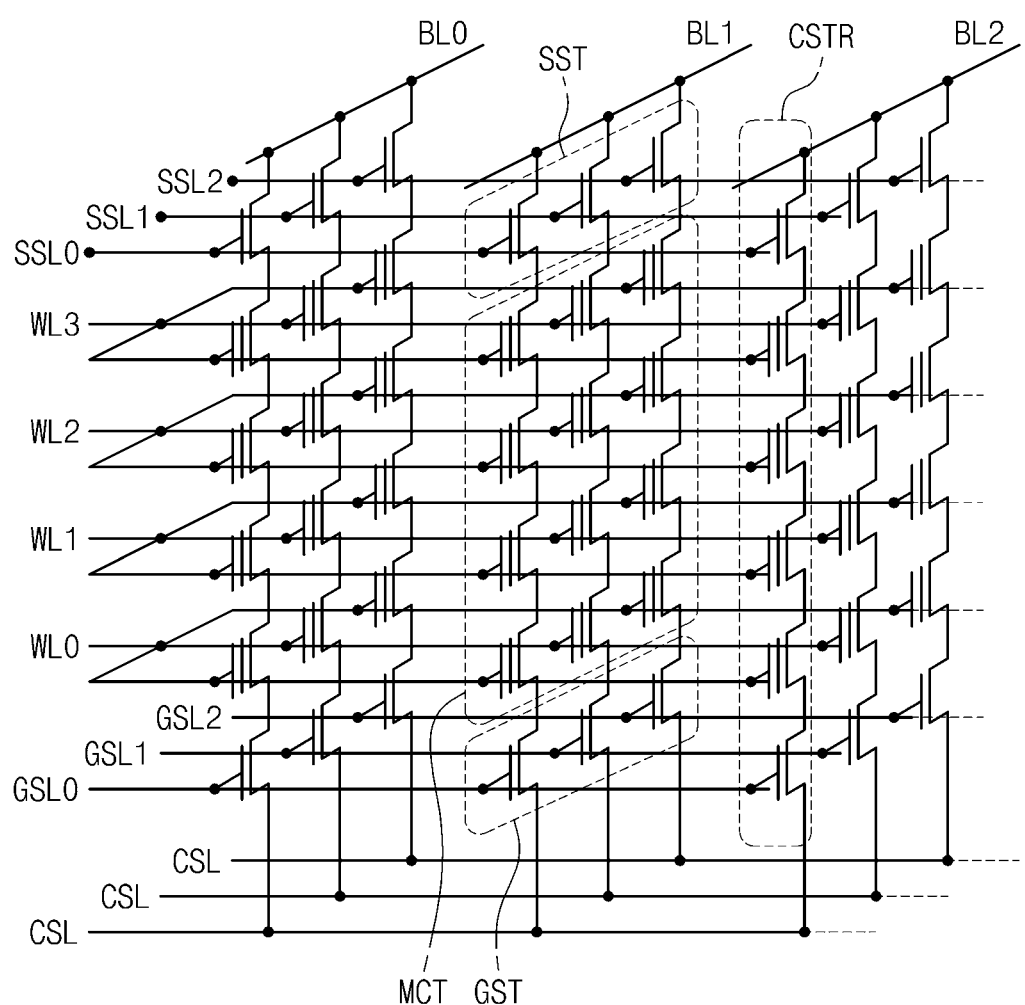
FIG. 1 illustrates a circuit diagram of a three-dimensional semiconductor memory device according to embodiments of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout.

The terms used in this disclosure are not for limiting the inventive concept but for explaining the embodiments. The terms of a singular form may include plural forms unless otherwise specified. Also, the meaning of "include," "comprise," "including," or "comprising," specifies a property, a region, a fixed number, a step, a process, an element and/or a component but does not exclude other properties, regions, fixed numbers, steps, processes, elements and/or components. It will also be understood that when a layer (or film) is referred to as being 'on' another layer or substrate, it can be directly on the other layer or substrate, or intervening layers may also be present.

Also, the embodiments of the inventive concept will be described with reference to exemplary diagrams such as cross-sectional views and plane views. In the drawings, the dimensions of layers and regions are exaggerated for clarity of illustration. Therefore, forms of the diagrams may be changed due to manufacturing technology and/or allowable errors. Therefore, the embodiments of the inventive concept are not limited to the illustrated particular forms but may also include the changed forms generated according to a manufacturing process. For instance, an etch region illustrated in a rectangular form may be round or may have predetermined curvature. Therefore, the regions illustrated in the drawings are schematic, and the forms of the regions illustrated in the drawings are not for limiting the scope of the inventive concept but for exemplarily specifying the forms of the regions.

Hereinafter, exemplary embodiments of the inventive concept will be described in detail with reference to the accompanying drawings.

[VNAND Basic Structure]

Figure 2:
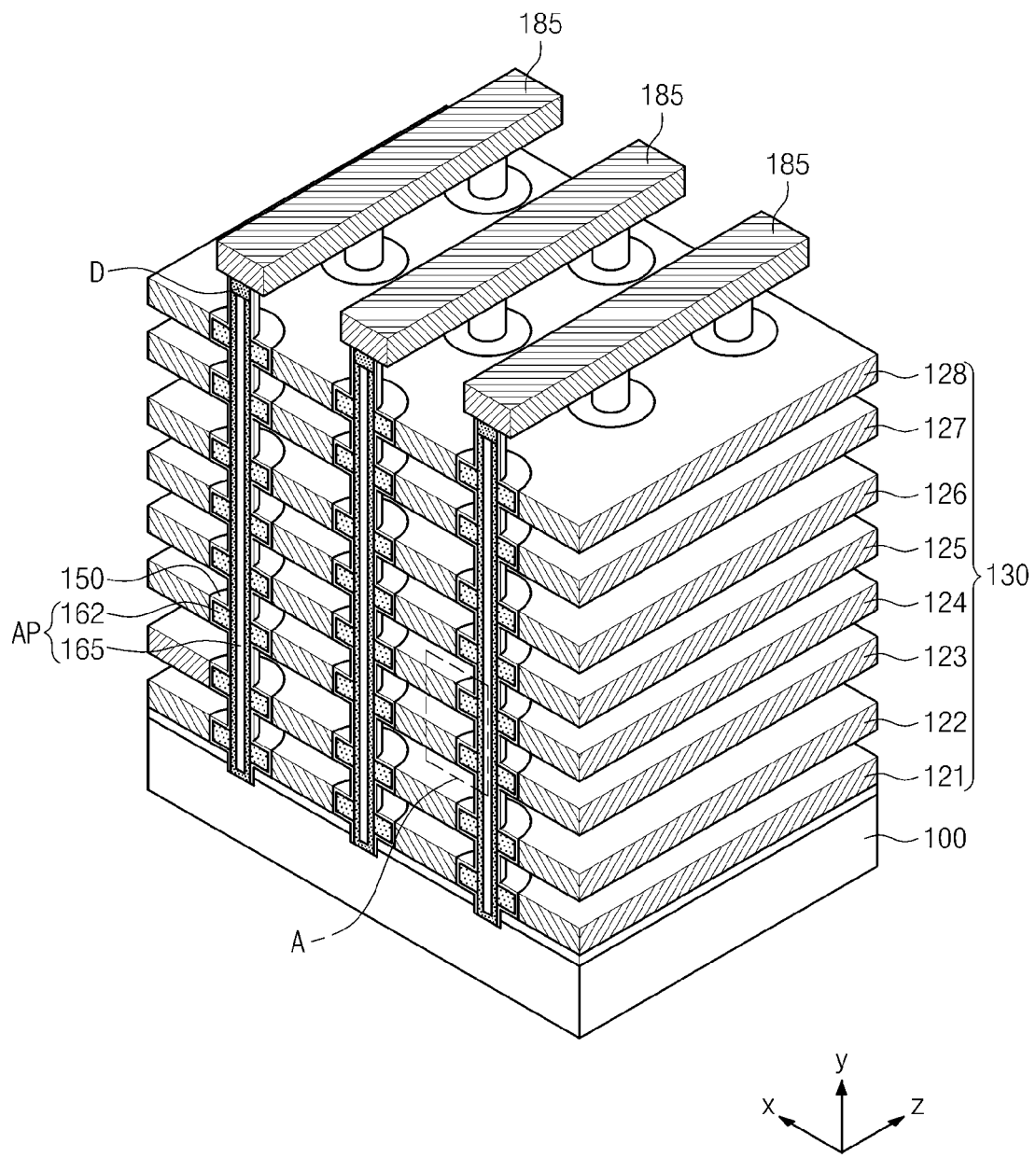
FIG. 2 illustrates a perspective view of the three-dimensional semiconductor memory device according to a first embodiment of the inventive concept.

FIG. 1 is a circuit diagram illustrating a three-dimensional semiconductor memory device according to embodiments of the inventive concept. FIG. 2 is a perspective view illustrating a three-dimensional semiconductor memory device according to a first embodiment of the inventive concept. FIGS. 3 to 6 are diagrams illustrating a part of the three-dimensional semiconductor memory device according to the first embodiment of the inventive concept, where a portion 'A' of FIG. 2 is magnified.

Referring to FIG. 1, the three-dimensional semiconductor memory device according to the embodiments may include a common source line CSL, a plurality of bit lines BL0 to BL2, and a plurality of cell strings CSTR arranged between the common source line CSL and the bit lines BL0 to BL2.

The common source line CSL may be a conductive thin layer on a substrate or may be a region of impurities formed within the substrate. The bit lines BL0 to BL2 may be conductive patterns (e.g., metal lines) arranged over the substrate being separated from the substrate. The bit lines BL0 to BL2 are two-dimensionally arranged, and the cell strings CSTR are connected in parallel to each of the bit lines BL0 to BL2. Accordingly, the cell strings CSTR are two-dimensionally arranged on the common source line CSL or the substrate.

Each of the cell strings CSTR may include a ground selection transistor GST connected to the common source line CSL, a string selection transistor SST connected to the bit lines BL0 to BL2, and a plurality of memory cell transistors MCT arranged between the ground selection transistor GST and the string selection transistor SST. The ground selection transistor GST, the string selection transistor SST, and the memory cell transistors MCT may be connected to each other in series. In addition, ground selection lines GSL0 to GSL2, a plurality of word lines WL0 to WL3, and a plurality of string selection lines SSL0 to SSL2 arranged between the common source line CSL and the bit lines BL0 to BL2 may be used as gate electrodes of the ground selection transistor GST, the memory cell transistors MCT, and the string selection transistors SST, respectively.

All the ground selection transistors GST may be arranged at the substantially same distance from the substrate, and their gate electrodes may be commonly connected to the ground selection lines GSL0 to GSL2 so that they may be in an equipotential state. Similarly, the gate electrodes of the memory cell transistors MCT arranged at the substantially same distance from the common source line CSL may also be commonly connected to one of the word lines WL0 to WL3 so that they may be in the equipotential state. Meanwhile, since one cell string CSTR includes the memory cell transistors MCT with different distances from the common source line CSL, multi-stacked word lines WL0 to WL3 may be arranged between the common source line CSL and the bit lines BL0 to BL2.

According to embodiments, each of the cell strings CSTR may include an active pillar, e.g., an active pillar AP in FIG. 2, vertically extended from the substrate and connected to the bit lines BL0 to BL2, i.e., bit lines 185 in FIG. 2. A semiconductor pattern, e.g., a second semiconductor pattern 165 in FIG. 2, may be included in the active pillar AP, so as to penetrate the ground selection lines GSL0 to GSL2 and the word lines WL0 to WL3.

A data storage layer, e.g., a data storage layer 150 in FIG. 2, may be arranged between the word lines WL0 to WL3 and the semiconductor pattern. According to the embodiment, the data storage layer may be a charge storage layer. For instance, the data storage layer may be one of a charge trap insulation layer and an insulation layer including a floating gate electrode or conductive nano dots.

A dielectric layer used as a gate insulation layer of the ground selection transistor GST or the string selection string SST may be arranged between the ground selection lines GSL0 to GSL2 and the semiconductor pattern or between the string selection lines SSL and the semiconductor pattern. The gate insulation layer of at least one of the ground and string selection transistors GST and SST may be formed of the same material as that of the data storage layer of the memory cell transistor MCT; however, it may also be a gate insulation layer (e.g., silicon oxide layer) for a typical Metal Oxide Semiconductor Field Effect Transistor (MOSFET).

The ground and string selection transistors GST and SST and the memory cell transistors MCT may be MOSFETs where the semiconductor pattern is used for a channel region. According to another embodiment, the semiconductor pattern may structure a MOS capacitor with the ground selection lines GSL0 to GSL2, the word lines WL0 to WL3, and the string selection lines SSL. In this case, the ground selection transistor GST, the memory cell transistor MCT, and the string selection transistor SST may be electrically connected to each other by sharing inversion layers formed due to a fringing field from the ground selection lines GSL0 to GSL2, the word lines WL0 to WL2, and the string selection lines SSL.

BICS Embodiment

Structure

Referring to FIGS. 2 to 7, a structure of the three-dimensional semiconductor memory device according to the embodiment will be described in detail.

Figure 7:
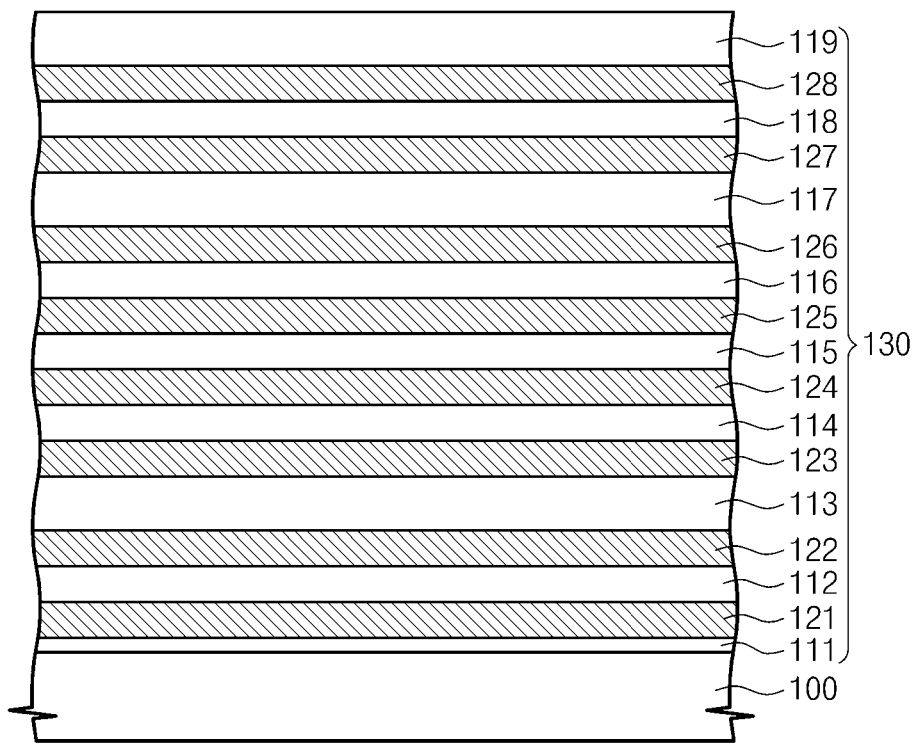
FIGS. 7 to 13 illustrate cross-sectional views for explaining a method for manufacturing the three-dimensional semiconductor memory device according to the first embodiment of the inventive concept.

Referring to FIGS. 2 and 7, the three-dimensional semiconductor memory device according to the embodiment may include a thin layer structure 130 and the active layer AP extending therethrough. The thin layer structure 130 may include interlayer dielectric patterns 111 to 119 and gate conductive patterns 121 to 128 alternately and repeatedly stacked on a substrate 100, and the active layer AP may be connected to the substrate 100 and may penetrate the thin layer structure 130. The data storage pattern 150 may be arranged between the active pillar AP and the gate conductive patterns 121 to 128. Also, the bit lines 185 may be arranged on a plurality of the active pillars AP.

The substrate 100 may be a material having semiconductor characteristics (e.g., silicon wafer), a dielectric material (e.g., glass), and/or a semiconductor or conductor covered with a dielectric material. According to the embodiment, the substrate 100 may be a single-crystalline semiconductor layer and may include an impurity region as the common source line. In this case, the substrate 100 and the impurity region used as the common source line may have different conductive types.

In the thin layer structure 130, upper and lower gate conductive patterns 121, 122, 127, and 128 are used as the string and ground selection lines SSL and GSL described in FIG. 1, respectively. The other gate conductive patterns 123 to 126 are used as the word lines WL0 to WL3 described in FIG. 1. According to another embodiment, all the gate conductive patterns 121 to 128 included in the thin layer structure 130 may be used as gate electrodes of memory cells.

The lower gate conductive patterns 121 and 122 may be formed in a plate shape or lines separated from each other. The upper gate conductive patterns 127 and 128 may be formed in lines separated from each other and may cross the bit line 185. The gate conductive patterns 123 to 126 used as the gate electrodes of the memory cells may be formed in a plate shape or lines separated from each other. Also, an equal voltage may be applied to the word lines arranged on the same layer, and the word lines arranged on another layer may be electrically separated. Meanwhile, the conductive patterns 121, 122, 127, and 128 used as the ground or string selection lines GSL or SSL may include sequentially-stacked two or more conductive lines. Also, the gate conductive patterns used as the ground or string selection lines GSL or SSL may be thicker than the gate conductive patterns 123 to 126 used as the word lines WL0 to WL3.

The gate conductive patterns 121 to 128 may include at least one conductive material. For instance, the gate conductive patterns 121 to 128 may include at least one of doped semiconductors, metals, metal nitrides, and metal silicides.

Figure 3:
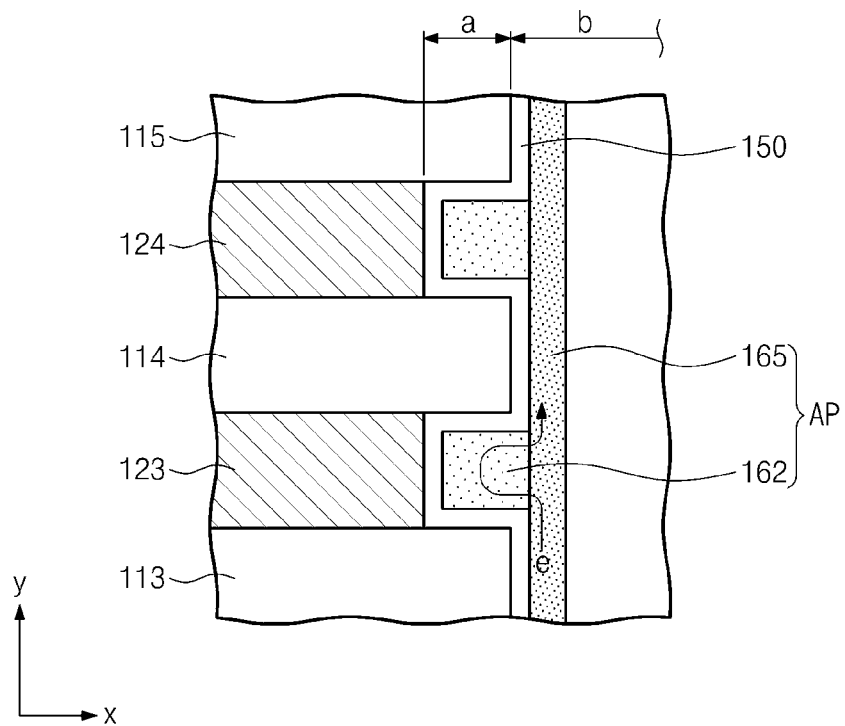
FIGS. 3 to 6 illustrate diagrams of a part of the three-dimensional semiconductor memory device according to the first embodiment of the inventive concept and magnifying a part 'A' of FIG. 2.

Referring to FIGS. 3 to 6, recess regions 'a' may be defined among the gate conductive patterns 121 to 128, and may be horizontally separated from each other, e.g., along the x-axis, in the thin layer structure 130. The recess regions 'a' may be defined by the vertically-neighboring interlayer dielectric patterns 111 to 119 and the gate conductive patterns 121 to 128 therebetween, e.g., one recess region 'a' may be between neighboring interlayer dielectric patterns 114 and 115 along the y-axis and may be adjacent to the gate conductive pattern 124 along the x-axis (FIG. 3). Also, in the thin layer structure 130, a penetration region 'b' may be defined among the vertically-separated interlayer dielectric patterns 111 to 119, e.g., the penetration region 'b' may be adjacent to the plurality of recess region 'a' and may penetrate through the entire thin layer structure 130.

The active pillar AP may penetrate the thin layer structure 130 and contact the substrate 100. The active pillar AP may be inserted into an upper part of the substrate 100 or may directly contact an upper surface of the substrate 100. The active pillar AP may include silicon (Si) and/or germanium (Ge). The active pillar AP may include at least one of amorphous semiconductor, single-crystalline semiconductor, and polycrystalline semiconductor. According to the embodiment, the semiconductor pillar AP may also be an intrinsic semiconductor. According to another embodiment, the active pillar AP may be formed to have the same conductive type as that of the substrate 100, i.e., which the active pillar contacts, so that the active pillar AP and the substrate 100 may be electrically connected to each other.

According to the embodiment, the active pillar AP may include a plurality of first semiconductor patterns 162 and a second semiconductor pattern 165. The first semiconductor patterns 162 are partially formed among the interlayer dielectric patterns 111 to 119 and adjacent to sidewalls of the gate conductive patterns 121 to 128. For example, one first semiconductor pattern 162 may be between two vertically adjacent interlayer dielectric patterns 114 and 115 along the y-axis, and may be horizontally adjacent, i.e., along the x-axis, to the gate conductive patter 124. The second semiconductor pattern 165 contacts the first semiconductor patterns 162 and penetrates the thin layer structure 130. The first semiconductor pattern 162 of the active pillar AP may be formed within the recess region 'a' defined in the thin layer structure 130, and the second semiconductor pattern 165 may be formed within the penetration region 'b' defined in the thin layer structure 130, e.g., the second semiconductor pattern 165 may extend along the penetration region 'b' within the active pillar AP from the substrate 100 to the bit lines 185.

In detail, the first semiconductor patterns 162 may be extended from one sidewall of the second semiconductor pattern 165 into the recess region 'a' in a direction vertical to a length of the second semiconductor pattern 165, i.e., along the x-axis. The first semiconductor patterns 162 may be formed among, e.g., between each pair of, the vertically-neighboring interlayer dielectric patterns 111 to 119, and each of the first semiconductor patterns 162 may have a ring shape surrounding the second semiconductor pattern 165. For example, a plurality of ring-shaped first semiconductor patterns 162 may be spaced apart from each other along the y-axis to surround one second semiconductor pattern 165, e.g., a plurality of the second semiconductor patterns 165 may be spaced apart from each other. Accordingly, a horizontal width of the active pillar AP adjacent to the gate conductive patterns 121 to 128, i.e., a portion of the active pillar AP including the first semiconductor patterns 162, may be wider than, e.g., along the x-axis, that of the active pillar AP adjacent to the interlayer dielectric patterns 111 to 119, i.e., a portion of the active pillar AP including only the second semiconductor pattern 165.

Figure 13:
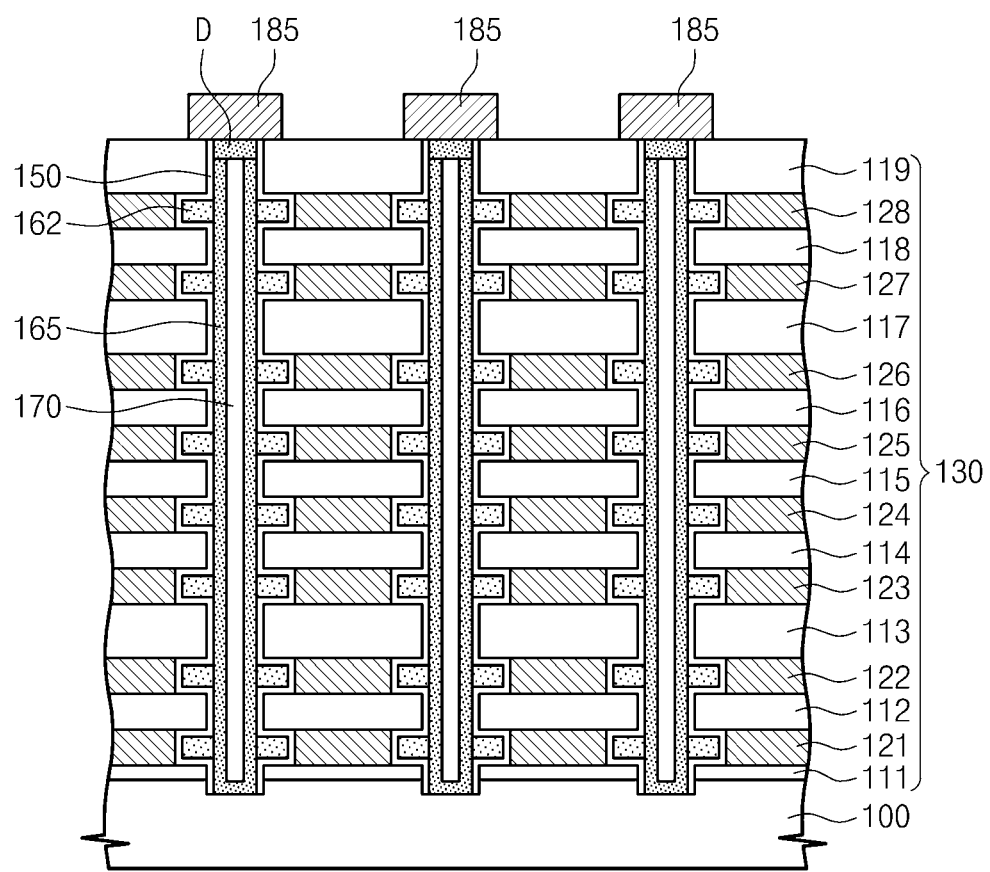
Figure 14:
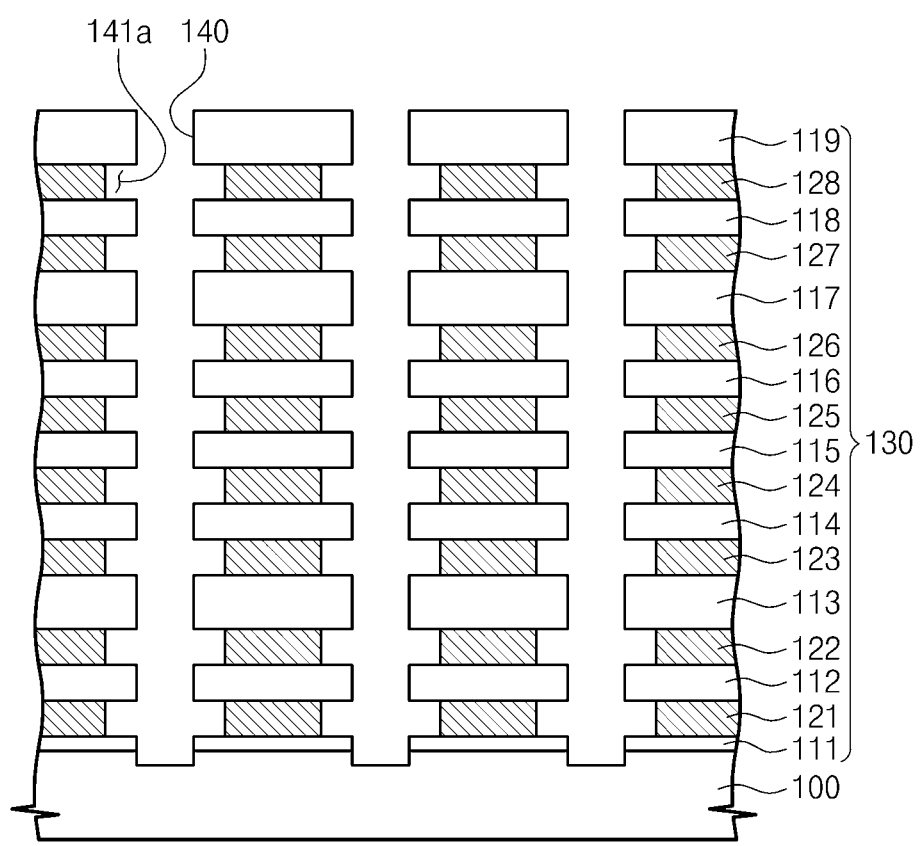
FIGS. 14 to 17 illustrate cross-sectional views of stages in a method for manufacturing the three-dimensional semiconductor memory device illustrated in FIG. 6.

Also, the second semiconductor pattern 165 may have a shape of, e.g., a vertical pillar, a hollow cylinder, or a cup. The second semiconductor pattern 165 having the hollow cylindrical shape may be filled with a buried dielectric pattern 170 (FIG. 13). Also, the second semiconductor pattern 165 of the active pillar AP may further include an impurity region D (FIG. 2) having a different conductive type from that of the active pillar AP at a connection region with the bit line 185.

Crystal structures of the first and second semiconductor patterns 162 and 165 in the active pillars AP may be different from each other. For example, the first semiconductor pattern 162 may have a single-crystalline structure, and the second semiconductor pattern 165 may have a polycrystalline structure. In another example, the first and second semiconductor patterns 162 and 165 may both have the polycrystalline structure, but mean grain sizes may be different from each other for the first and second semiconductor patterns 162 and 165. For instance, the mean grain size of the first semiconductor pattern 162 may be larger than that of the second semiconductor pattern 165.

The active pillar AP having the above-described structure may constitute a MOS capacitor by being capacitively coupled with the gate conductive patterns 121 to 128. In this case, a voltage applied to the gate conductive patterns 121 to 128 may variably control a potential of their neighboring active pillar AP, and the active pillar may be inversed according to the voltage applied to the gate conductive pattern 121 to 128. Accordingly, an electrical connection between the bit line 185 and the common source line CSL of FIG. 1 may be controlled by the voltage applied to the gate conductive patterns 121 to 128.

In detail, referring to FIG. 3, when a predetermined voltage is applied to the gate conductive patterns 121 to 128, an inversion region may be formed at the first semiconductor pattern 162 of the active pillar AP adjacent to the gate conductive patterns 121 to 128, and the inversion region may be extended to a surface of the second semiconductor pattern 165 among the gate conductive patterns 121 to 128 due to the fringing field from the gate conductive patterns 121 to 128. That is, if the predetermined voltage is applied to the stacked gate conductive patterns 121 to 128, inversion regions formed by the fringing field from each of the gate conductive patterns 121 to 128 are overlapped so that the inversion regions may be formed along a surface of the active pillar AP. Also, since the active pillar AP has the first semiconductor patterns 162 protruded from the second semiconductor pattern 165, the inversion regions may be formed at a surface portion of the first semiconductor pattern 162 and the surface of the semiconductor pattern 165 among the first semiconductor patterns 162 when the semiconductor memory device is operated. Accordingly, when charges are transferred from the common source line CSL to the bit line 185, the charges may pass the second semiconductor pattern 165 detouring to the surface portion of the first semiconductor pattern 162.

It may be understood that the cell string CSTR according to this embodiment may include memory cell transistors connected to each other in series as illustrated in FIG. 1. Herein, the gate conductive patterns 121 to 128 function as the gate electrode of the memory cell transistor, and the inversion regions overlapped by the fringing field function as source and drain electrodes. Also, the inversion region formed to be adjacent to the gate conductive patterns 121 to 128 functions as a channel region of the memory cell transistor. According to the formation of the inversion region at the surface portion of the active pillar AP, the charges may move from the common source line CSL of FIG. 1 to the bit line 185. To this end, a gap between the stacked gate conductive patterns 121 to 128 may be shorter than a maximum length of the inversion region formed by the voltage applied to the gate conductive patterns 121 to 128. A thickness of the first semiconductor pattern 162 protruded from the one sidewall of the second semiconductor pattern 165 may be thinner than a width of the channel region which is to be formed at the first semiconductor pattern 162 or may be smaller than the mean grain size of silicon grains composing the polycrystalline silicon for an electrical connection among the memory cells. Also, the thickness of the first semiconductor pattern 162 is adjusted for the inversion region to be extended to the surface portion of the second semiconductor pattern 165 adjacent to the interlayer dielectric patterns 111 to 119 by the fringing field generated when the predetermined voltage is applied to the gate conductive patterns 121 to 128.

A thickness of the second semiconductor pattern 165 may be thinner than a width of a depletion region which is to be formed at the second semiconductor pattern 165 or may be smaller than the average length of the silicon grains composing the polycrystalline silicon. In the case that the thickness of the second semiconductor pattern 165 is substantially the same as the width of the depletion region which is to be formed at the second semiconductor pattern 165, the second semiconductor pattern 165 may be fully depleted when the three-dimensional semiconductor memory device is operated.

Meanwhile, the active pillar AP where the inversion region is formed may be formed of polycrystalline semiconductor material. In the case that the active pillar AP has the polycrystalline structure, many grains may exist within the active pillar AP. Due to the many grains, many grain boundaries may exist within the active pillar AP, and the grain boundaries may obstruct the movement of charges when the semiconductor memory device is operated. Therefore, by reducing the grain boundaries within the active pillar AP, mobility of the charges is improved.

Also, in the case that the active pillar AP is formed of a polysilicon layer using a Chemical Vapor Deposition (CVD) method, the sizes of the grains may be not uniform so that the mobility of charges may be degraded. That is, crystallinity of the semiconductor material composing the active pillar AP may affect operation characteristics of the three-dimensional semiconductor memory device. Therefore, for improving the mobility of charges in the active pillar AP, it is needed to improve the crystallinity of the semiconductor material composing the active pillar AP. Particularly, the crystallinity of the semiconductor material should be improved at a part where a channel region of a transistor is formed.

In detail, for improving the mobility of charges, it is preferable to reduce the grain boundaries within the active pillar AP. For example, it may be preferable that the mean grain size of the grains within the active pillar AP is large. Further, it may be preferable that the mean grain size of the grains is large in the part where the channel region of the transistor is formed, i.e., in the first semiconductor pattern 162 of the semiconductor pattern. To this end, in the embodiments of the inventive concept, the first semiconductor patterns 162 adjacent to the gate conductive patterns 121 to 128 may be formed of semiconductor material which is recrystallized through a laser annealing treatment. As described later, if the laser annealing treatment is performed on the polycrystalline semiconductor material, the semiconductor material is recrystallized so that the grain size may be increased. According to the inventive concept, since the first semiconductor patterns 162 adjacent to the gate conductive patterns 121 to 128 are selectively laser-annealed, the mean grain size in the first semiconductor pattern 162 may be larger than that in the second semiconductor pattern 165.

In detail, referring to FIGS. 3 to 7, the first semiconductor patterns 162 adjacent to the gate conductive patterns 121 to 128 may be laser-annealed polycrystalline or single-crystalline semiconductor material, and the second semiconductor patterns 165 may be polycrystalline semiconductor material formed by a deposition method. Accordingly, the mean grain size in the first semiconductor pattern 162 may be larger than that in the second semiconductor pattern 165. Accordingly, the grain boundaries existing within the first semiconductor pattern 162 may be reduced in comparison with the second semiconductor pattern 165. Also, since the mean grain sizes in the first semiconductor patterns 162 and the second semiconductor pattern 165 are different from each other, a discontinuous boundary surface may be formed between the first semiconductor pattern 162 and the second semiconductor pattern 165.

In the above-described structure, the inversion regions may be formed at the surface portion of the first semiconductor pattern 162 and the surface of the second semiconductor pattern 165 among the first semiconductor patterns 162 as describe above. When the charges move from the common source line CSL to the bit line BL, the charges may pass the semiconductor patterns 165 detouring to the surface portion of the first semiconductor pattern 162. Herein, even though the charges move from the common source line CSL of FIG. 1 to the bit line BL of FIG. 1 detouring to the first semiconductor pattern 162, since the crystallinity of the first semiconductor pattern 162 is better that that of the second semiconductor pattern 165, i.e., since the mean grain size in the first semiconductor pattern 162 is larger, the mobility of charges may be higher in the first semiconductor pattern 162 than in the second semiconductor pattern 165.

Also, even though the mean grain size is small in the second semiconductor pattern 165, if the thickness of the second semiconductor pattern 165 is smaller than the mean grain size in the first semiconductor pattern 162, the grain boundaries may be reduced. Thus, the mobility of charges in the thin second semiconductor pattern 165 may also be improved.

Figure 4:
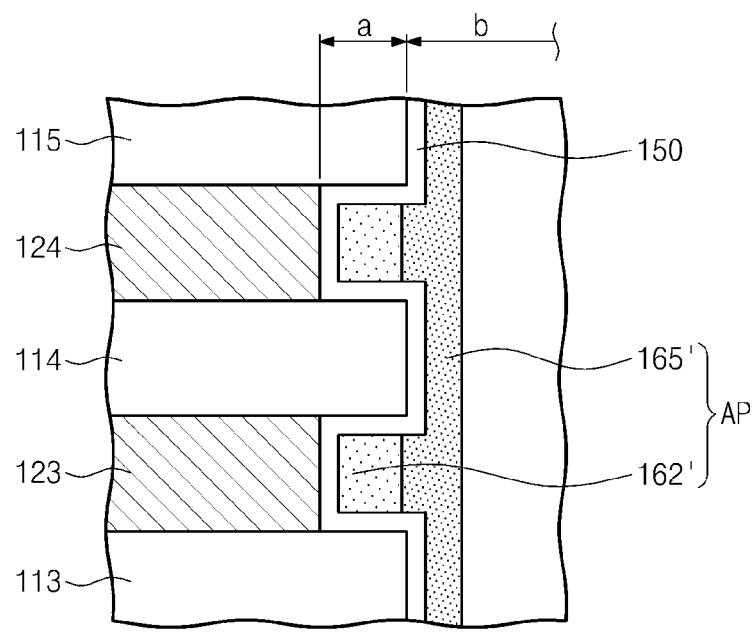

Meanwhile, according to another embodiment, as illustrated in FIG. 4, the active pillar AP may include the first and second semiconductor patterns 162' and 165'. The laser-annealed first semiconductor pattern 162' may be only partially formed in the recess region 'a' of the thin layer structure 130, and the second semiconductor pattern 165' formed by the deposition process may be formed in a remaining portion of the recess region 'a' and in the penetration region 'b' of the thin layer structure 130. That is, the second semiconductor pattern 165' may have a part protruding into the recess region 'a' to combine with the first semiconductor pattern 162'. In other words, the second semiconductor pattern 165' may have a first thickness, i.e., along the x-axis, in regions adjacent to the interlayer dielectric patterns 111 to 119 and may have a second thickness thicker than the first thickness in regions adjacent to the first semiconductor pattern 162'. In this structure, the boundary surface where the first semiconductor pattern 162 and the second semiconductor pattern 165 contact each other may be positioned within the recess region 'a' of the thin layer structure 130.

Figure 5:
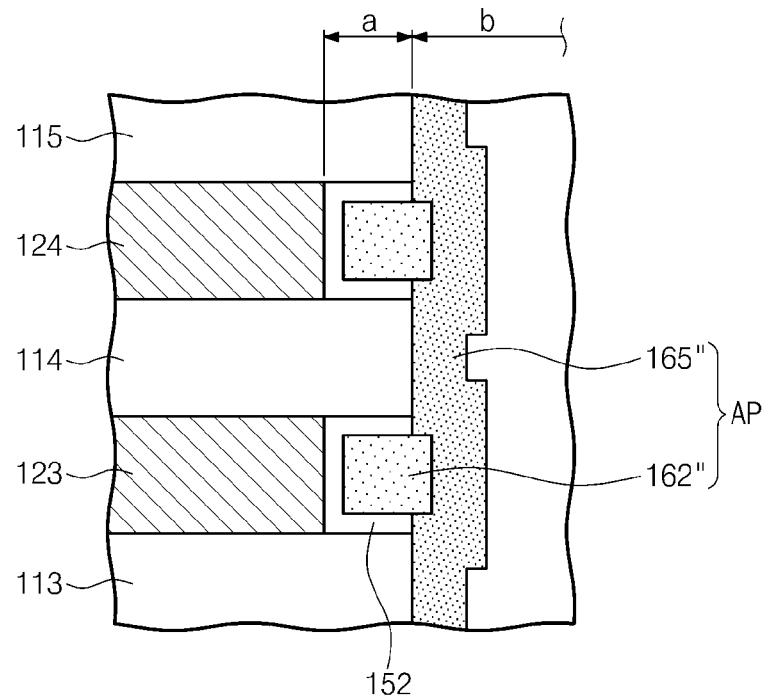

According to still another embodiment, as illustrated in FIG. 5, a first semiconductor pattern 162" may be protrude from the recess region 'a' to the penetration region 'b', and the second semiconductor pattern 165" may conformally cover the first semiconductor patterns 162" in the penetration region 'b' of the thin layer structure 130. Since the first semiconductor patterns 162" protrude into the penetration region 'b', the thickness of the second semiconductor pattern 165 at a contact part with the first semiconductor pattern 162" may be larger than that at a part adjacent to the interlayer dielectric patterns 111 to 119.

For example, according to the embodiment, the first and second semiconductor patterns 162 and 165 in the active pillar AP may have a same chemical composition. In another example, according to another embodiment, the first and second semiconductor patterns 162 and 165 may be formed of semiconductor materials having different chemical compositions. For instance, the first semiconductor pattern 162 may be formed of silicon (Si), and the second semiconductor pattern 165 may be formed of germanium (Ge) or silicon-germanium (SiGe).

Also, the active pillar AP may be doped with impurities to have a conductive type. Herein, doping concentrations for the first and second semiconductor patterns 162 and 165 may be different.

Referring to FIGS. 2 to 7, the data storage pattern 150 may be disposed between the gate conductive patterns 121 to 128 and the active pillar AP. The data storage pattern 150 may be the charge storage layer, and the charge storage layer may be one of the charge trap insulation layer and the insulation layer including the floating gate electrode or conductive nano dots. The charge storage layer may include sequentially-stacked blocking insulation layer, charge trap layer, and tunnel insulation layer. In the case that the data storage pattern 150 is the charge storage layer, data stored into the data storage pattern 150 may be changed using Fowler-Nordheim tunneling caused by a voltage difference between the active pillar AP and the gate conductive patterns 121 to 128. Meanwhile, the data storage pattern 150 may be a thin layer capable of storing data based on another operating principle (e.g., a thin layer for a phase-change memory or a thin layer for a variable-resistor memory).

According to the embodiment, the data storage pattern 150 may be the charge trap insulation layer. As illustrated in FIGS. 2 to 4, the charge trap insulation layer may be extended from an upper surface to a lower surface of the first semiconductor pattern 162 between the first semiconductor pattern 162 and the gate conductive patterns 121 to 128, e.g., the data storage pattern 150 may be formed conformally along sidewalls of the active pillar AP to separate between the active pillar AP and the thin layer structure 130. The charge trap insulation layer may extend between the active pillar AP and the interlayer dielectric patterns 111 to 119. That is, the second semiconductor pattern 165 of the active pillar AP may directly contact to the charge trap insulation layer.

Also, according to another embodiment, as illustrated in FIG. 5, a data storage pattern 152 may be partially formed among the interlayer dielectric patterns 111 to 119, so that adjacent data storage patterns 152 may be separated from each other vertically. In this case, the second semiconductor pattern 165 of the active pillar AP may directly contact the interlayer dielectric patterns 111 to 119. In the case that the data storage patterns 152 are separated from each other, charges trapped in the data storage patterns 152 may be prevented from spreading to neighboring data storage patterns 152.

Figure 6:
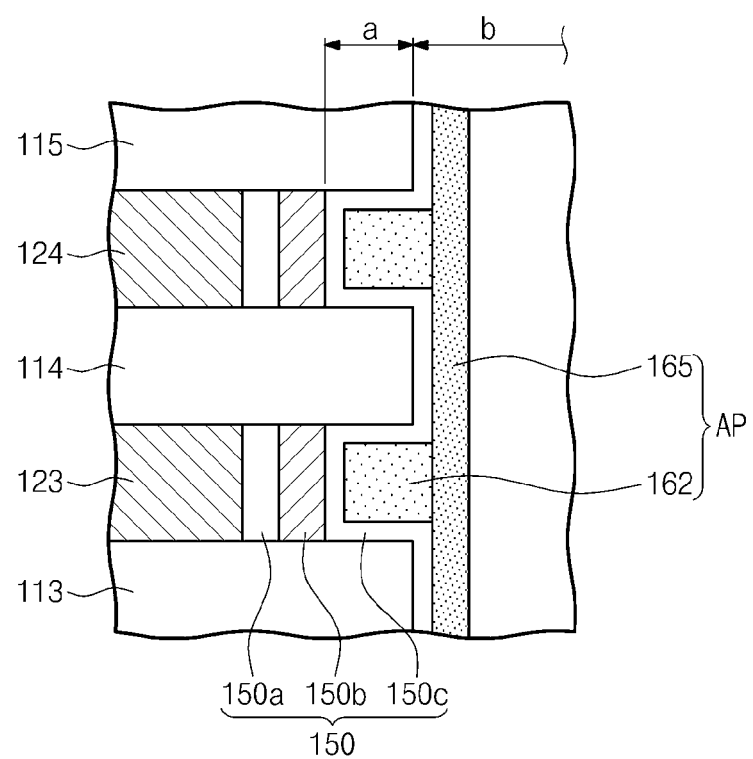

According to another embodiment, as illustrated in FIG. 6, the data storage pattern 150 includes a floating gate electrode 150b. The floating gate electrode 150b may be partially arranged between the gate conductive patterns 121 to 128 and the first semiconductor pattern 162 of the active pillar AP. Also, an inter-gate insulation layer 150a is disposed between the gate conductive patterns 121 to 128 and the floating gate electrode 150b, and a gate insulation layer 150c is disposed between the active pillar AP and the floating gate electrode 150b. The gate insulation layer 150c may extend between the upper surface and lower surface of the first semiconductor pattern 162 of the active pillar AP, and between the active pillar AP and the floating gate electrode 150b. The inter-gate insulation layer 150a may be formed, e.g., of an Oxide-Nitride-Oxide (ONO) layer. Otherwise, the inter-gate insulation layer 150a may include a high-dielectric-constant layer (e.g., a dielectric metal oxide layer such as a hafnium oxide layer or aluminum oxide layer) having a high dielectric constant in comparison with the gate insulation layer 150c. Also, the gate insulation layer 150c may be partially formed among the interlayer dielectric patterns 111 to 119 so that vertically-neighboring gate insulation layers 150c may be separated from each other. The gate insulation layer 150c may be formed of a silicon oxide layer. In detail, the gate insulation layer 150c may be a thermal oxide layer.

Hereinafter, referring to FIGS. 2 and 7 to 13, a method for manufacturing the three-dimensional semiconductor memory device according to the first embodiment of the inventive concept will be described.

Referring to FIG. 7, the thin layer structure 130 is formed on the substrate 100. The substrate 100 may include at least one of a material having semiconductor characteristics (e.g., silicon wafer), a dielectric material (e.g., glass), or semiconductor or conductor covered with a dielectric material.

The thin layer structure 130 may include the plurality of interlayer dielectrics 111 to 119 and the plurality of gate conductive layers 121 to 128. The interlayer dielectrics 111 to 119 and the gate conductive layers 121 to 128 may be alternately stacked on the substrate. For instance, the interlayer dielectrics 111 to 119 may be at least one of thermal oxide layer, silicon oxide layer, silicon nitride layer, and silicon oxynitride layer. The gate conductive layers 121 to 128 may be formed of at least one conductive material, so that they may be used as a gate electrode. For instance, the gate conductive layers 121 to 128 may include at least one of doped silicon, metal layer, metal nitride layer, and metal silicide.

According to this embodiment, the thin layer structure 130 may be formed by layering the lower gate conductive layers 121 and 122, intermediate gate conductive layers 123 to 126, and the upper gate conductive layers 127 and 128, and disposing the interlayer dielectrics 111 to 119 therebetween. The lower gate conductive layers 121 and 122 may be used as the ground selection line GSL0 to GSL2 in FIG. 1. The intermediate gate conductive layers 123 to 126 may be used as the word lines WL0 to WL3 in FIG. 1, and the upper gate conductive layers 127 and 128 may be used as the string selection lines SSL0 to SSL2.

Since the intermediate gate conductive layers 123 to 126 are used as the gate of the memory cell transistor according to the inventive concept, their thicknesses determine a channel length of the memory cell transistor. Since the intermediate gate conductive layers 123 to 126 are formed using the deposition method, the channel length may be more accurately controlled, e.g., in comparison with formation of gate conductive layers using a patterning technique. Also, since a direction of the length of the channel of the memory cell transistors is vertical to the substrate 100, a degree of integration of the semiconductor memory device according to the inventive concept is independent of the thickness of the intermediate gate conductive layers 123 to 126. Also, as described above, the gap between the intermediate gate conductive layers 123 to 126, i.e., the thickness of the gate interlayer dielectrics 111 to 119, may be formed to have a smaller range than the maximum width of the inversion region generated at the semiconductor pattern subsequently formed.

Meanwhile, each of the ground selection line GSL and the string selection line SSL may include vertically-neighboring gate conductive patterns 121 and 122 or 127 and 128, respectively. Also, according to another embodiment, the lower and upper gate conductive layers 121 and 122 or 127 and 128 used as the ground selection line GSL and the string selection line SSL may be formed to be thicker then the intermediate gate conductive layers 123 to 126.

The number of thin layers, their thicknesses, and their materials composing the thin layer structure 130 may be variously changed considering electrical characteristics of the memory cell transistor and technical difficulties for patterning them.

Figure 8:
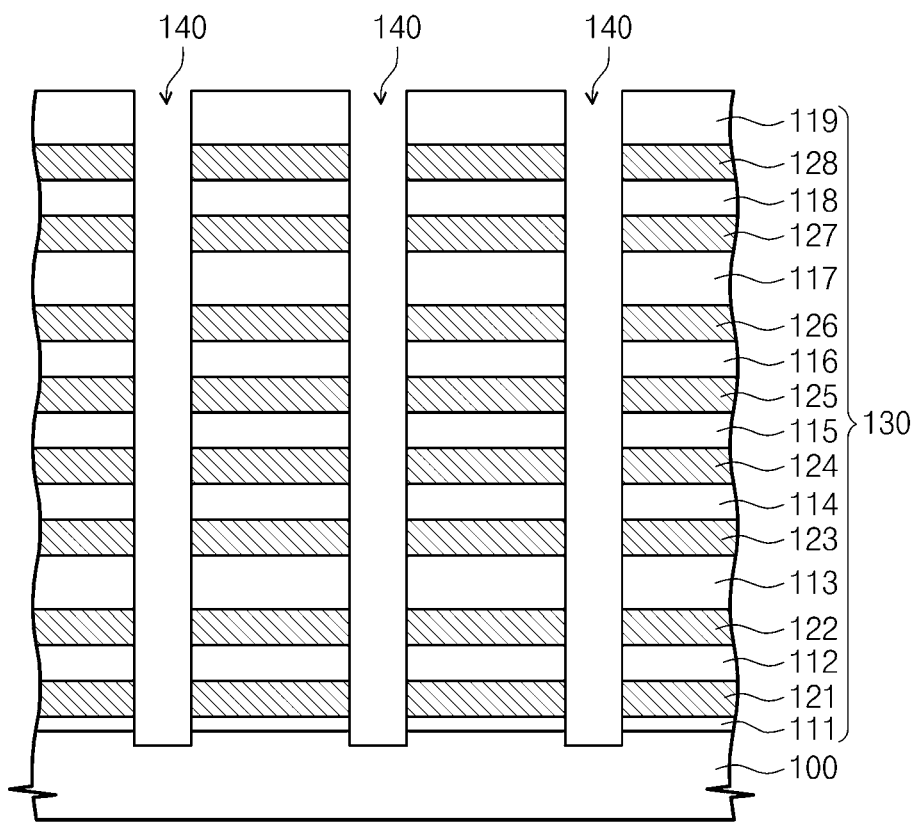

Referring to FIG. 8, first penetration regions 140, i.e., which expose the upper surface of the substrate 100, may be formed by patterning the thin layer structure 130.

In detail, an operation of forming the first penetration regions 140 may include an operation of forming a mask pattern (not illustrated) which defines a planar position of the first penetration regions 140 on the thin layer structure 130, and an operation of anisotropically etching the thin layer structure 130 using the mask pattern as an etch mask. The first penetration regions 140 may be two-dimensionally and regularly formed. For example, each of the first penetration regions 140 may be formed in a shape of a cylindrical or a rectangular parallelepiped hole. In another example, the first penetration regions 140 may be formed in a line or stripe shape instead of the hole shape. For example, the first penetration region 140 may have different widths according to a distance from the substrate 100 due to the anisotropic etching process. Also, while the first penetration regions 140 are formed, the upper surface of the substrate 100 exposed through the first penetration regions 140 may be recessed to a certain depth due to over etch.

Figure 9:
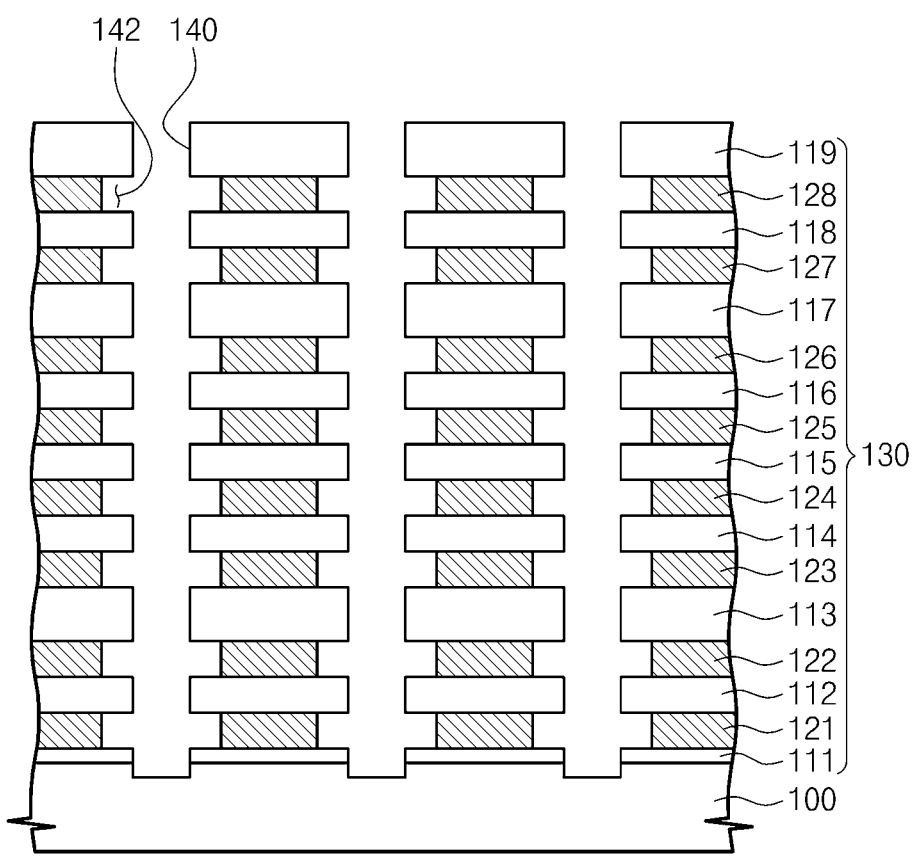

Referring to FIG. 9, by recessing the gate conductive layers 121 to 128 exposed to the first penetration regions 140, recess regions 142 are formed among the stacked interlayer dielectrics 111 to 119.

An operation of forming the recess regions 142 includes an isotropic or anisotropic etch process for selectively etching the gate conductive layers 121 to 128. For instance, if an etch solution whose etch selectivity to the gate conductive layers 121 to 128 is supplied to the first penetration region 140, parts of the gate conductive layers 121 to 128 may be selectively removed. The recess regions 142 formed in this manner may be extended from the first penetration region 140 in a direction vertical to a length direction of the first penetration region 140, i.e., along the x-axis. Herein, a width of the recess region 142 (i.e., a length extended from the first penetration region 140 in a vertical direction) may be determined according to a channel thickness required for the cell transistors of the semiconductor memory device.

Figure 10:
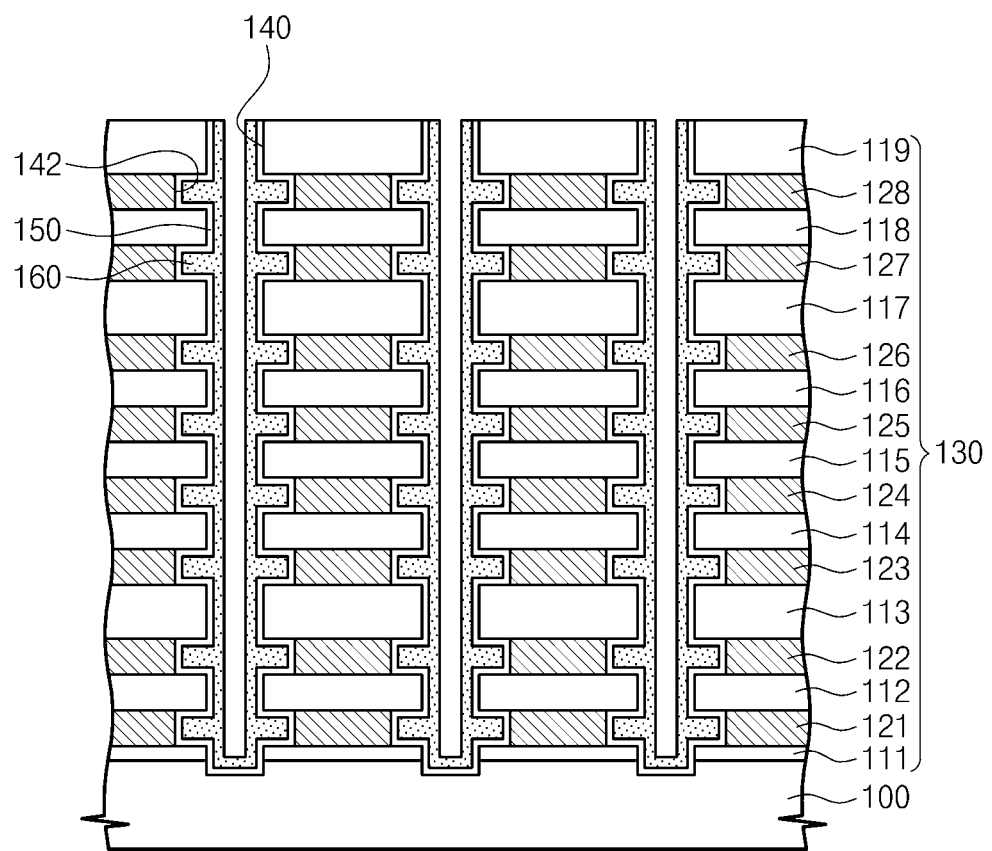

Referring to FIG. 10, the data storage layer 150 is conformally formed along the surfaces of the first penetration regions 140 and the recess regions 142. That is, the data storage layer 150 may be formed, e.g., conformally, on the sidewall of the gate conductive layers 121 to 128 exposed to the recess region 142, and the data storage layer 150 may be formed on the surface of the interlayer dielectrics 111 to 119 exposed to the first penetration region 140 and the recess regions 142.

The data storage layer 150 may be formed using a deposition technique (e.g., the CVD or Atomic Layer Deposition (ALD) technique) which provides good step coverage, and may be formed to a thinner thickness than a half of thickness of the recess regions 142. Accordingly, the data storage layer 150 may be formed to substantially conformally cover a resulting structure where the recess regions 142 are formed. Also, since the data storage layer 150 is formed using the deposition process, the data storage layer 150 may also be conformally formed on the upper surface of the substrate 100 exposed by the first penetration region 140.

According to the embodiment of the inventive concept for a flash memory, the data storage layer 150 may include the charge storage layer. For instance, the charge storage layer may include one of the charge trap insulation layer and the insulation layer including the floating gate electrode or conductive nano dots.

Also, according to the embodiment, the charge storage layer may include the sequentially-stacked blocking insulation layer, charge trap layer, and tunnel insulation layer. The blocking insulation layer may include at least one of silicon oxide layer, silicon nitride layer, silicon oxynitride layer, and high-dielectric-constant layer, and may include a plurality of layers. Herein, the high-dielectric-constant layer means a dielectric material having a dielectric constant higher than that of the silicon oxide layer and may include, e.g., a tantalum oxide layer, a titanium oxide layer, a hafnium oxide layer, a zirconium oxide layer, an aluminum oxide layer, an yttrium oxide layer, a niobium oxide layer, a cesium oxide layer, an indium oxide layer, an iridium oxide layer, a BST layer, and/or a PZT layer. The tunnel insulation layer may be formed of a material having a lower dielectric constant than that of the blocking insulation layer. The charge trap layer may be a dielectric thin layer, e.g., silicon nitride layer, having plentiful charge trap sites or a dielectric thin layer including conductive grains. According to the embodiment, the tunnel insulation layer may be a silicon oxide layer, the charge trap layer may be a silicon nitride layer, and the blocking insulation layer may be an insulation layer including an aluminum oxide layer.

Thereafter, as illustrated in FIG. 10, a first semiconductor layer 160 is formed within the recess regions 142 and the first penetration regions 140 where the data storage layer 150 is formed.

According to the embodiment, the first semiconductor layer 160 may be formed using the CVD or ALD technique. Accordingly, the first semiconductor layer 160 may be conformally formed within the first penetration region 140 filling the recess regions 142. In detail, the first semiconductor layer 160 may be deposited to a thickness larger than the half of thickness of the recess regions 142. Also, a planar width of the first penetration region 140 may be larger than the thickness of the recess region 142. In this case, the first semiconductor layer 160 may fill a part of the first penetration region 140 and define an empty region at a center portion of the first penetration region 140. Herein, the empty region may be opened upward.

The first semiconductor layer 160 may be formed by depositing an amorphous semiconductor layer or a polycrystalline semiconductor layer. The first semiconductor layer 160 may include silicon (Si) and/or germanium (Ge).

Meanwhile, according to another embodiment, the first semiconductor layer 160 may fully fill the first penetration region 140 through the deposition process. In this case, after depositing the first semiconductor layer 160, a planarization process may be performed to the first semiconductor layer 160. According to still another embodiment, the first semiconductor layer 160 may be formed within the first penetration regions 140 by performing an epitaxial process using the substrate 100 exposed by the first penetration regions 140 as a seed layer.

Figure 11:
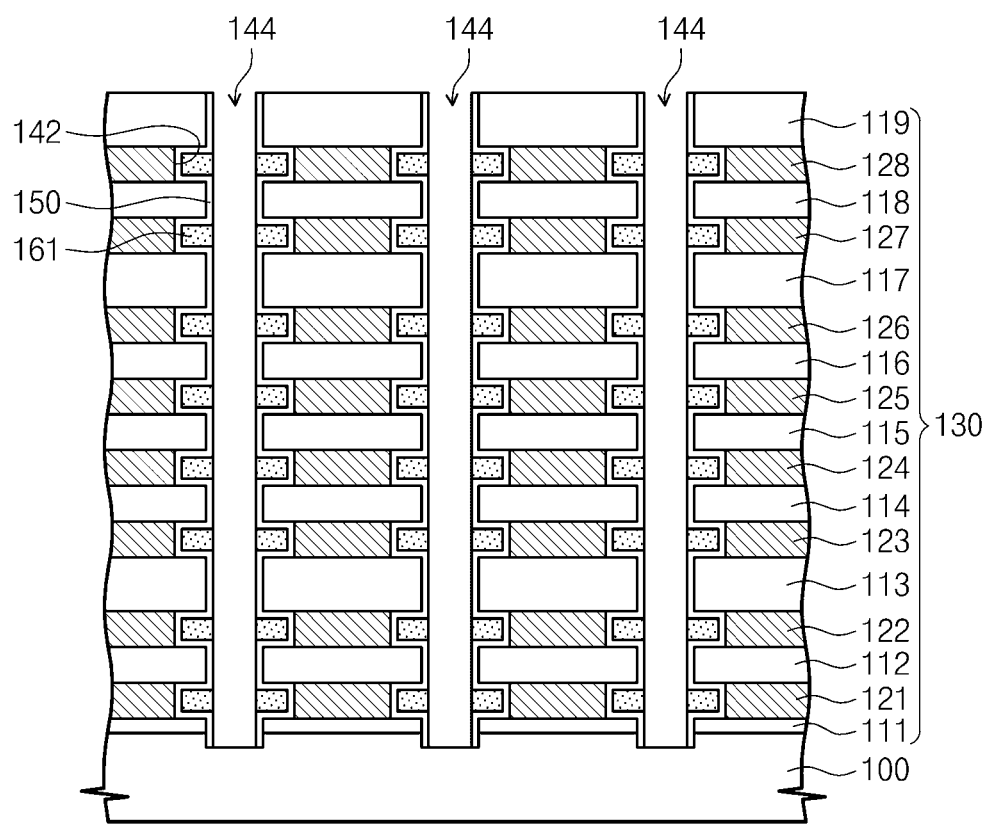

Referring to FIG. 11, the semiconductor layer 160 filling the first penetration region 140 may be etched to partially form the preliminary first semiconductor patterns 161 within the recess regions 142. According to the embodiment, the preliminary first semiconductor patterns 161 may be formed by performing the isotropic etching process on the first semiconductor layer 160 having the empty region.

In detail, the isotropic etching process may be performed until the preliminary first semiconductor patterns 161 are separated from each other along the y-axis. That is, by the isotropic etching process, a second penetration region 144 may be formed exposing the data storage layer 150 on the sidewall of the interlayer dielectrics 111 to 119 and on the substrate 100. For example, since the isotropic etching process is performed through the empty region, the first semiconductor layer 160 on sidewall and bottom parts of the empty region may be etched at the substantially same time. Since the isotropic etching process is performed through the empty region, the first semiconductor layer 160 may be conformally etched at the upper part and the lower part of the thin layer structure 130. Accordingly, horizontal thicknesses of the preliminary first semiconductor patterns 161 may be conformal. Also, the horizontal thicknesses of the preliminary first semiconductor patterns 161 may be varied according to an isotropic etching process time. For instance, the preliminary first semiconductor patterns 161 may be formed to only partially fill the recess region 142, as illustrated in FIG. 4.

After forming the preliminary first semiconductor patterns 161, the upper surface of the substrate 100 may be exposed by removing the data storage layer 150 from the upper surface of the substrate 100. For example, the data storage layer 150 may be removed by performing the isotropic etching process. During the isotropic etching process, the data storage 150 on the sidewalls of the interlayer dielectrics 111 to 119 may be removed together. In this case, as illustrated in FIG. 5, the data storage pattern 152 may be partially formed at each of the recess regions 142, i.e., the data storage patterns 152 separated from each other may be formed. In other words, the sidewalls of the interlayer dielectrics 111 to 119 and the upper surface of the substrate 100 may be exposed to the second penetration region 144.

According to another embodiment, forming the preliminary first semiconductor pattern 161 may include forming the second penetration region 144 by anisotropically etching the first semiconductor layer 160 which fills the first penetration region 140. In detail, forming the preliminary first semiconductor patterns 161 may include forming a mask pattern on the thin layer structure 130 for forming the second penetration region 144, and anisotropically etching the first semiconductor layer 160 using the mask pattern. The mask pattern may have openings exposing the upper surface of the first semiconductor layer 160 which fills the first penetration region 140.

According to the embodiment, the anisotropic etching process for forming the second penetration region 144 may expose the data storage layer 150 on the sidewalls of the interlayer dielectrics 111 to 119. Also, the anisotropic etching process for forming the second penetration region 144 may partially remove the data storage 150 on the upper surface of the substrate 100. Accordingly, the second penetration region 144 may partially expose the upper surface of the substrate 100.

According to another embodiment, the second penetration region 144 may expose the sidewalls of the interlayer dielectrics 111 to 119 and the upper surface of the substrate 100. In detail, the mask pattern used during the anisotropic etching process for forming the second penetration region 144 may have openings whose each width is larger than that of the first penetration region 140 and smaller than that of the recess region 142. If the first semiconductor layer 160 is anisotropically etched using such a mask pattern, the data storage layer 150 on the sidewalls of the interlayer dielectrics 111 to 119 may be removed. Accordingly, the second penetration region 144 may expose the sidewalls of the interlayer dielectrics 111 to 119 and the upper surface of the substrate 100. Also, since the second penetration region 144 is formed, the data storage pattern 152 may be partially formed within the recess region 142, as illustrated in FIG. 5. That is, the data storage pattern 152 is disposed between the gate conductive pattern and the preliminary first semiconductor pattern 161, and may be exposed to the upper and lower surfaces of the preliminary first semiconductor pattern 161.

As described above, the preliminary first semiconductor patterns 161 within the recess region 142 may have an amorphous structure, a single-crystalline structure, and/or a polycrystalline structure. When a semiconductor pattern has a polycrystalline structure, the semiconductor pattern may include many grains and, therefore, many grain boundaries. As grain size decreases, grain boundaries increase and cause degradation of charge mobility in the semiconductor memory device, i.e., in the semiconductor pattern where the channel region is formed. Therefore, according to example embodiments, when the preliminary first semiconductor pattern 161 has a polycrystalline structure, the size of grains in may be increased in order to improve the mobility of charges in the first semiconductor pattern 162. Also, the first semiconductor pattern 162 may be formed to include conformal-sized grains to provide improved electrical characteristics, e.g., as compared to a semiconductor pattern formed using the CVD technique and, therefore, having a non-conformal grain size.

Accordingly, in the embodiments of the inventive concept, the size of grains in the first semiconductor pattern 162 is increased, i.e., the preliminary first semiconductor pattern 161 may be re-crystallized, so that the grain boundaries may be reduced. Therefore, the mobility of charges in the first semiconductor pattern 162 may be increased.

In detail, as illustrated in FIG. 11, the preliminary first semiconductor patterns 161 partially formed at the recess regions 142 may be re-crystallized by laser-annealing to form the first semiconductor patterns 162. As such, the size of grains of the first semiconductor pattern 162 of polycrystalline structure may be increased by the laser-annealing process. If the preliminary first semiconductor pattern 161 has an amorphous structure, a resultant first semiconductor pattern 162, i.e., after re-crystallization, may have a single-crystalline structure. Re-crystallization of the first semiconductor pattern 162 may be performed by, e.g., Solid Phase Crystallization (SPC), Metal Induced Crystallization (MIC), or Rapid Thermal Annealing (RTA).

The laser-annealing process for recrystallizing the first semiconductor pattern 162 may be performed after forming the first semiconductor layer 160 within the recess regions 142 and the first penetration region 140, as illustrated in FIG. 10. Also, without forming the recess regions 142, the first semiconductor layer 160 in the first penetration region 140 may be laser-annealed.

However, since a height of the first semiconductor layer 160 within the first penetration region 140 is substantially the same as that of the thin layer structure 130, it may be difficult to provide laser to the first semiconductor layer 160 with uniform energy density from the upper part to the lower part of the first semiconductor layer 160. In other words, when the first semiconductor layer 160 filling the first penetration region 140 is laser-annealed, the energy density of the laser may be reduced from the upper part to the lower part of the first semiconductor layer 160. Accordingly, it may be difficult for the first semiconductor layer 160 to be conformally laser-annealed. Therefore, it may be difficult to conformally improve the crystallinity of the recess regions 142 and the first semiconductor layer 160 filling the first penetration region 140.

Figure 12:
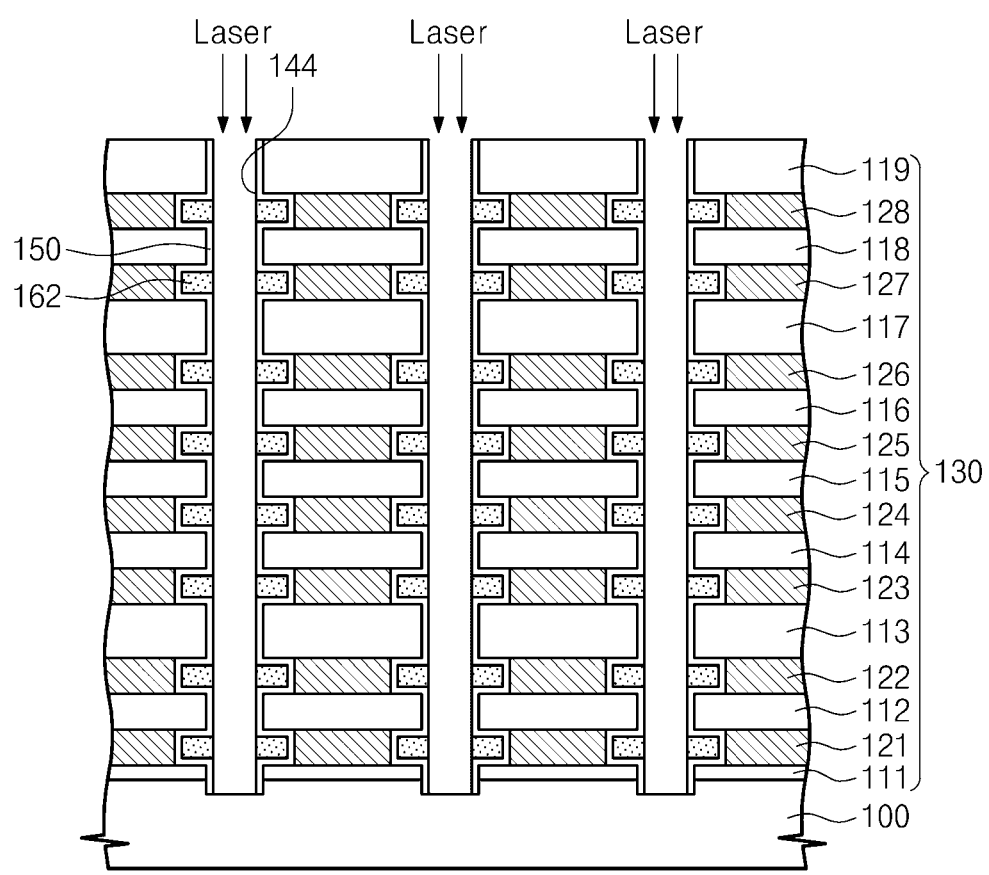

Referring to FIG. 12, according to the embodiments of the inventive concept, after the preliminary first semiconductor pattern 161 is partially formed at the recess region 142, i.e., after forming the second penetration region 144, the first semiconductor patterns 162 may be formed by laser-annealing the preliminary first semiconductor patterns 161. For the laser-annealing process of recrystallizing the first semiconductor pattern 162, if a laser having predetermined energy is irradiated to the first semiconductor pattern 162, continuous state changes of the first semiconductor pattern 162 may occur, i.e., the first semiconductor pattern 162 is phase-transitioned to liquid and then recrystallized being rapidly cooled.

In detail, the laser-annealing process may be performed by directly irradiating a laser beam having energy density for sufficiently melting the preliminary first semiconductor pattern 161. Also, the laser energy density, the laser beam profile, the number of pulses of the laser beam, temperature of the substrate 100, and deposition condition and method of the first semiconductor layer 160 may affect the crystallinity of the first semiconductor pattern 162. For instance, for the laser-annealing, an excimer laser or argon (Ar) laser, i.e., a kind of a gas laser, may be used as the laser beam. The laser-annealing process may be performed within a short time of about 30 nano seconds to about 200 nano seconds. Also, the laser beam energy density may be varied according to the thickness of the first semiconductor pattern 162, a frequency of the laser beam, a laser beam annealing time, the deposition condition and method of the first semiconductor layer 160, and the temperature of the substrate 100.

Thereafter, through a supercooling process of the preliminary first semiconductor pattern 161 transitioned to liquid, nucleation of grains may occur, e.g., the grain nuclei may be vertically and horizontally grown. The liquid semiconductor pattern may be supercooled at a lower temperature than a melting temperature of a semiconductor layer. If the liquid semiconductor pattern is cooled and its solidification is started, the grains may be grown around the grain nuclei so that the first semiconductor patter 162 is recrystallized. In the recrystallized first semiconductor pattern 162, the grain size may vary according to the laser energy density and cooling speed during the laser-annealing process.

According to the embodiments of the inventive concept, for the laser-annealing process, the laser beam may be irradiated to the second penetration region 144 which exposes the first semiconductor patterns 162. Therefore, the laser beam may be provided directly and conformally to the first semiconductor patterns 162 during the laser-annealing process. Accordingly, the crystallinity of the first semiconductor pattern 162 of the lower part of the thin layer structure 130 and that of the first semiconductor pattern 162 of the upper part of the thin layer structure 130 may be conformally improved. That is, the mean grain size in the recrystallized first semiconductor pattern 162 of the lower part of the thin layer structure 130 may similar to that in the recrystallized first semiconductor pattern 162 of the upper part of the thin layer structure 130. Also, due to the laser-annealing process, the grain size in the first semiconductor pattern 162 may be increased in comparison with not-performing the laser-annealing process, and the number of grains may be reduced. In other words, the mean grain size in the first semiconductor pattern 162 after the laser-annealing process may be larger than that in the first semiconductor pattern 162 before the laser-annealing process. Therefore, the grain size in the first semiconductor pattern 162 is increased to reduce grain boundaries, and thus, the mobility of charges in the first semiconductor pattern 162 may be increased.

Referring to FIG. 13, the second semiconductor pattern 165 contacting the first semiconductor patterns 162 and the substrate 100 may be formed within the second penetration region 144.

In detail, the second semiconductor pattern 165 may be conformally formed within the second penetration region 144 using a deposition technique. The second semiconductor pattern 165 may be formed in the hollow cylindrical shape or the cylindrical shell shape. The inside of the second semiconductor pattern 165 may be filled with a dielectric material. The second semiconductor pattern 165 may include silicon (Si), germanium (Ge), or their compound. The second semiconductor pattern 165 may be formed of the same material as that of the first semiconductor layer 160 or different material from that of the first semiconductor layer 160.

Meanwhile, the thickness of the second semiconductor pattern 165 (i.e., thickness of shell) may be thinner than the width of the inversion region which is to be formed at the second semiconductor pattern 165 or may be smaller than the average length of the silicon grains composing the polycrystalline silicon. In the case that the thickness of the second semiconductor pattern 165 is substantially the same as the width of the inversion region, i.e., which is to be formed at the second semiconductor pattern 165, the whole sidewall part of the second semiconductor pattern 165 may be fully inversed when the three-dimensional semiconductor memory device is operated.

Also, the second semiconductor pattern 165 is formed to have the same conductive type as that of the substrate to which the second semiconductor pattern 165 is contacted. As a result, since the second semiconductor pattern 165 does not constitute a diode with the substrate, the second semiconductor pattern 165 may be equipotential with the substrate.

According to the embodiment, after the second semiconductor pattern 165 of the hollow cylindrical shape is formed, a surface treatment process may be performed on the second semiconductor pattern 165. As the surface treatment process, the thermal oxidation process or radical oxidation process may be performed. Through the surface treatment process, an oxide passivation layer may be formed on an inner side surface of the second semiconductor pattern 165 (i.e., rear surface of the channel). The oxide passivation layer formed through the surface treatment process may reduce or eliminate defects on the surface of the second semiconductor pattern 165.

Thereafter, the buried dielectric pattern 170 including a dielectric material is formed within the second penetration region 144 where the second semiconductor pattern 165 is formed. The buried dielectric pattern 170 may be formed to fill the second penetration region 144 where the second semiconductor pattern 165 is formed and may include at least one dielectric material. For instance, the buried dielectric pattern 170 may be a silicon oxide layer or a dielectric material formed using a Spin On Glass (SOG) technique. That is, the buried dielectric pattern 170 may be a CVD-oxide layer, a PE-oxide layer, a HDP oxide layer, or a SOG layer.

Thereafter, the impurity region D may be formed on the buried dielectric pattern 170 and the second semiconductor pattern 165. Also, bit lines 185 which electrically connect the second semiconductor patterns 165 may be formed on the thin layer structure 130. The bit lines 185 may be formed in a direction crossing the second penetration region 144 or the string selection line patterned as a line form. Meanwhile, the bit lines 180 may be connected to the second semiconductor patterns 165 by a contact plug (not illustrated).

Hereinafter, referring to FIGS. 14 to 17, a method for manufacturing the three-dimensional semiconductor memory device illustrated in FIG. 6 will be described in detail. According to this embodiment, the manufacturing method is similar to that of the first embodiment except for the method of forming the data storage patterns. Accordingly, for conciseness, explanations of overlapped technical features are omitted below.

As described above with reference to FIGS. 7 to 9, the thin layer structure 130 is formed on the substrate 100, and the first penetration regions 140, i.e., which penetrate the thin layer structure 130 and expose the substrate 100, are formed.

Thereafter, by recessing the gate conductive layers 121 to 128 exposed to the first penetration region 140, first recess regions 141*a* are formed among the stacked interlayer dielectrics 111 to 119. Herein, a width of the first recess region 141*a* may be larger than that of the recess region 142 described referring to FIG. 9. Also, for forming the first recess regions 141*a*, the anisotropic or isotropic etching process may be performed selectively etching the gate conductive layers 121 to 128 as described above referring to FIG. 9.

Figure 15:
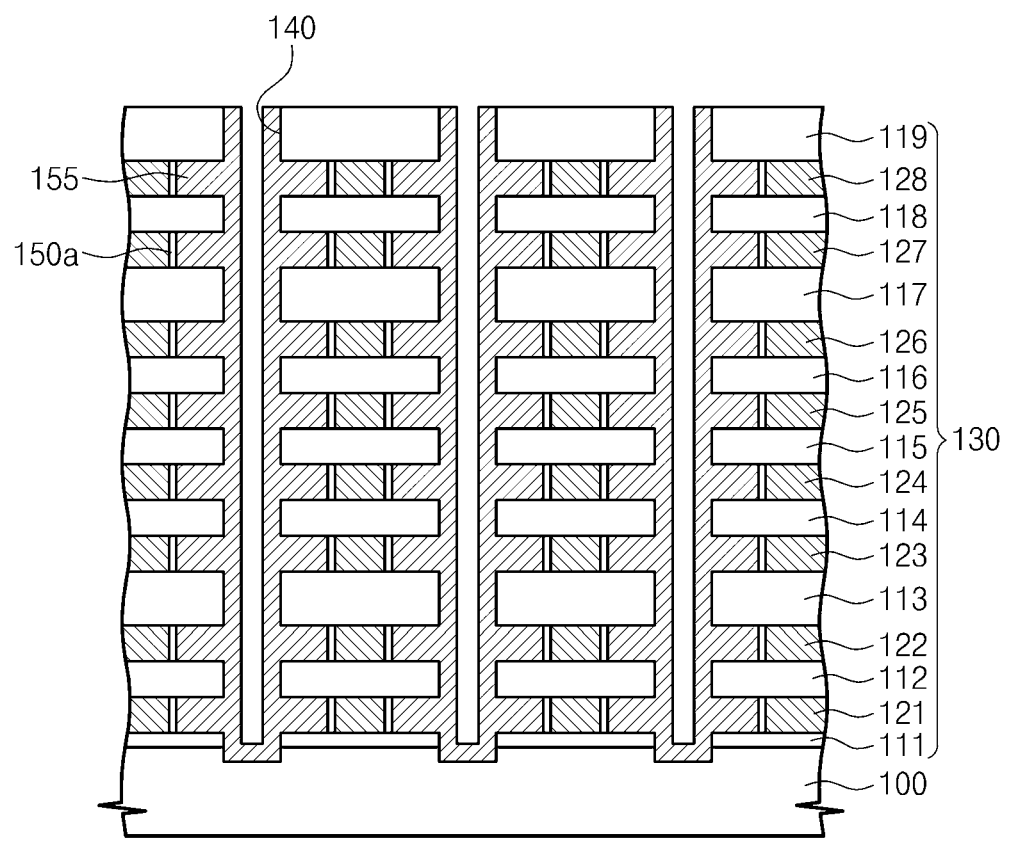

Referring to FIG. 15, the inter-gate insulation layer 150*a* is selectively formed on the sidewalls of the gate conductive layers 121 to 128 exposed to the first recess region 141*a*. The inter-gate insulation layer 150*a* may include at least one of silicon oxide layer, silicon nitride layer, silicon oxynitride layer, and high-dielectric-constant layer and may include a plurality of layers. According to the embodiment, the inter-gate insulation layer 150*a* may be formed of an ONO layer. Otherwise, the inter-gate insulation layer 150*a* may include a high-dielectric-constant layer (e.g., a dielectric metal oxide layer such as a hafnium oxide layer or aluminum oxide layer) having a high dielectric constant in comparison with the gate insulation layer 150*c*. According to another embodiment, the inter-gate insulation layer 150*a* may be formed by thermal-oxidizing the sidewalls of the gate conductive layers 121 to 128 exposed to the first recess region 141*a*. For example, the inter-gate insulation layer 150*a* may be formed of silicon oxide layer ($SiO_2$) or silicon oxynitride layer (SiON). In another example, the inter-gate insulation layer 150*a* may be formed of multi-layers including a high-dielectric-constant material, e.g., $Al_2O_3$, $HfO_2$, $ZrO_2$, $La_2O_3$, $Ta_2O_3$, $TiO_2$, $SrTiO_3$(STO), (Ba, Sr)$TiO_3$(BST), and/or their combination.

Thereafter, a floating gate conductive layer 155 is formed within the first recess regions 141*a* where the inter-gate insulation layer 150*a* is formed and the first penetration region 140. The floating gate conductive layer 155 may be formed using a deposition technique (e.g., the CVD or ALD technique) which provides good step coverage. According to the embodiment, the floating gate conductive layer 155 may be conformally formed on an inner wall of the first penetration region 140 filling the first recess regions 141*a*. That is, the floating gate conductive layer 155 may define an empty region covering the sidewall and bottom of the first penetration region 140. The floating gate conductive layer 155 is formed of at least one conductive material to be used as the gate electrode. For instance, the floating gate conductive layer 155 may be formed of doped polycrystalline silicon or a metal material.

Figure 16:
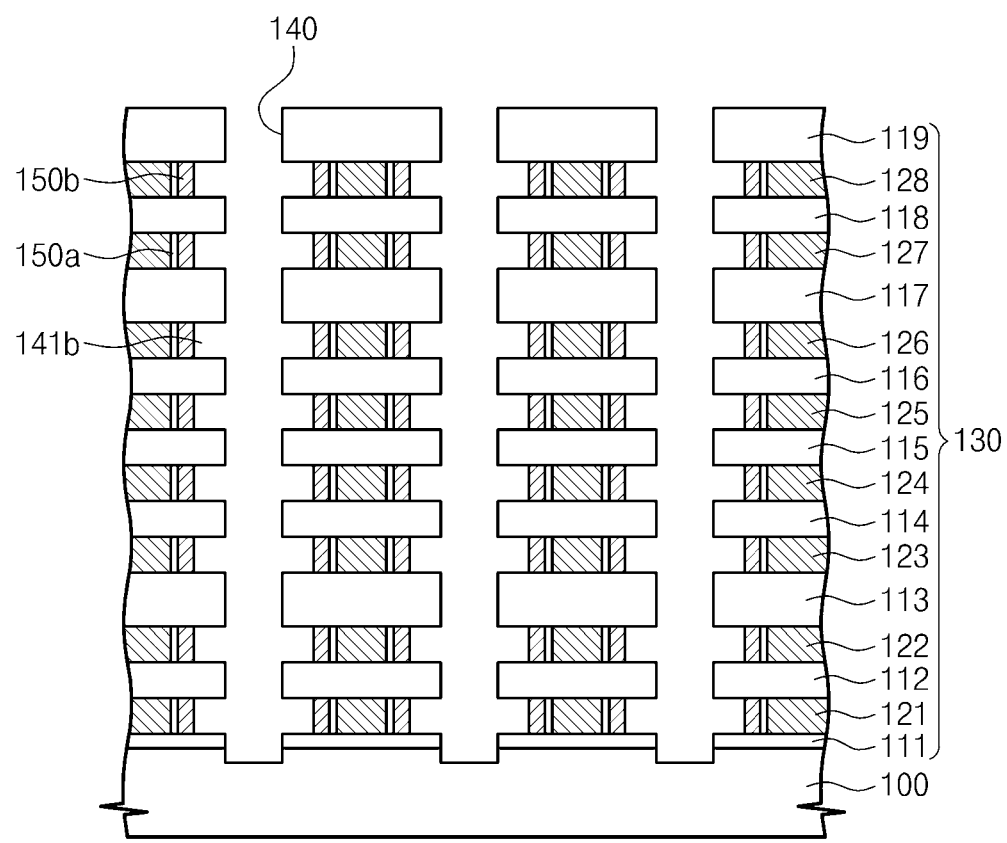

Referring to FIG. 16, by removing the floating gate conductive layer 155 which fills the first penetration region 140 and by forming second recess regions 141*b* among the interlayer dielectrics 111 to 119, a floating gate electrode 150*b* is formed.

In detail, forming the floating gate electrode 150*b* includes re-forming the first penetration region 140 which exposes the sidewalls of the interlayer dielectrics 111 to 119 and the upper surface of the substrate 100 by patterning the floating gate conductive layer 155 which fills the first penetration region 140. Also, forming the floating gate electrode 150*b* includes forming the second recess regions 141*b* among the stacked interlayer dielectrics 111 to 119 by recessing the floating gate conductive layer 155 exposed to the first penetration region 140. Herein, for forming the second recess regions 141*b*, the anisotropic or isotropic etching process may be performed selectively etching the floating gate conductive layer 155. For instance, if an etch solution whose etch selectivity to the floating gate conductive layer 155 is high is provided to the first penetration region 140, a part of the floating gate conductive layer 155 may selectively be removed. Herein, a recess depth of the second recess region 141*b* may be controlled by appropriately adjusting recipe of the isotropic etching process. The second recess regions 141*b* formed in this manner may be extended from the first penetration region 140 in a direction vertical to a length direction of the first penetration region 140. Herein, the depth of the second recess region 141*b* (a length extended in a vertical direction from the first penetration region 140) may be controlled according to the channel thickness of the transistor and may be substantially the same as the depth of the recess region 141 described referring to FIG. 9.

Figure 17:
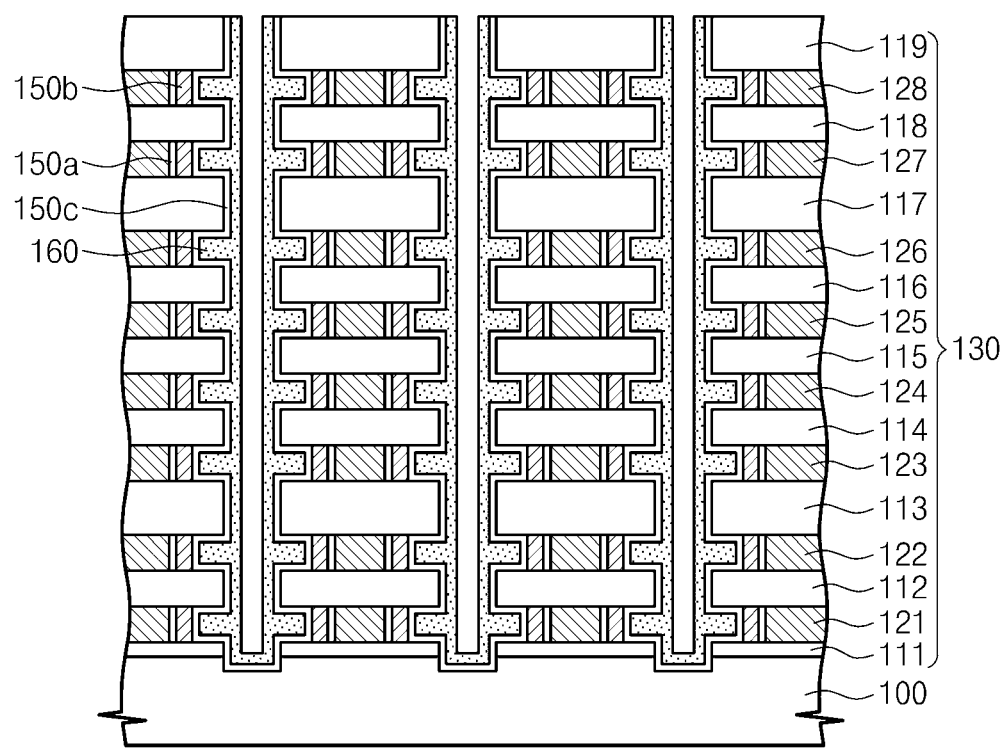

Referring to FIG. 17, the gate insulation layer 150*c* is conformally formed along the surfaces of the first penetration region 140 and the second recess regions 141*b*, and the first semiconductor layer 160 is formed on the gate insulation layer 150*c*.

That is, the gate insulation layer 150*c* may be formed on the sidewall of the floating gate electrode 150*b* exposed to the second recess region 141*b*. Also, the gate insulation layer 150*c* may be conformally formed within the first penetration region 140 and the second recess regions 141*b*. Also, the first semiconductor layer 160 may be formed within the second recess regions 141*b* and the first penetration regions 140 using the CVD or ALD technique. Herein, as described above referring to FIG. 10, the first semiconductor layer 160 may be conformally formed in the first penetrating region 140 filling the second recess regions 141*b* so that the empty region may be defined. Thereafter, as described above referring to FIGS. 11 to 13, the first semiconductor patterns 162 may be recrystallized and the second semiconductor pattern 165 may be formed.

Hereinafter, a three-dimensional semiconductor memory device according to a second embodiment of the inventive concept will be described in detail referring to FIGS. 18 to 24. For conciseness, explanations of technical features overlapped with the first embodiment are omitted.

Figure 18:
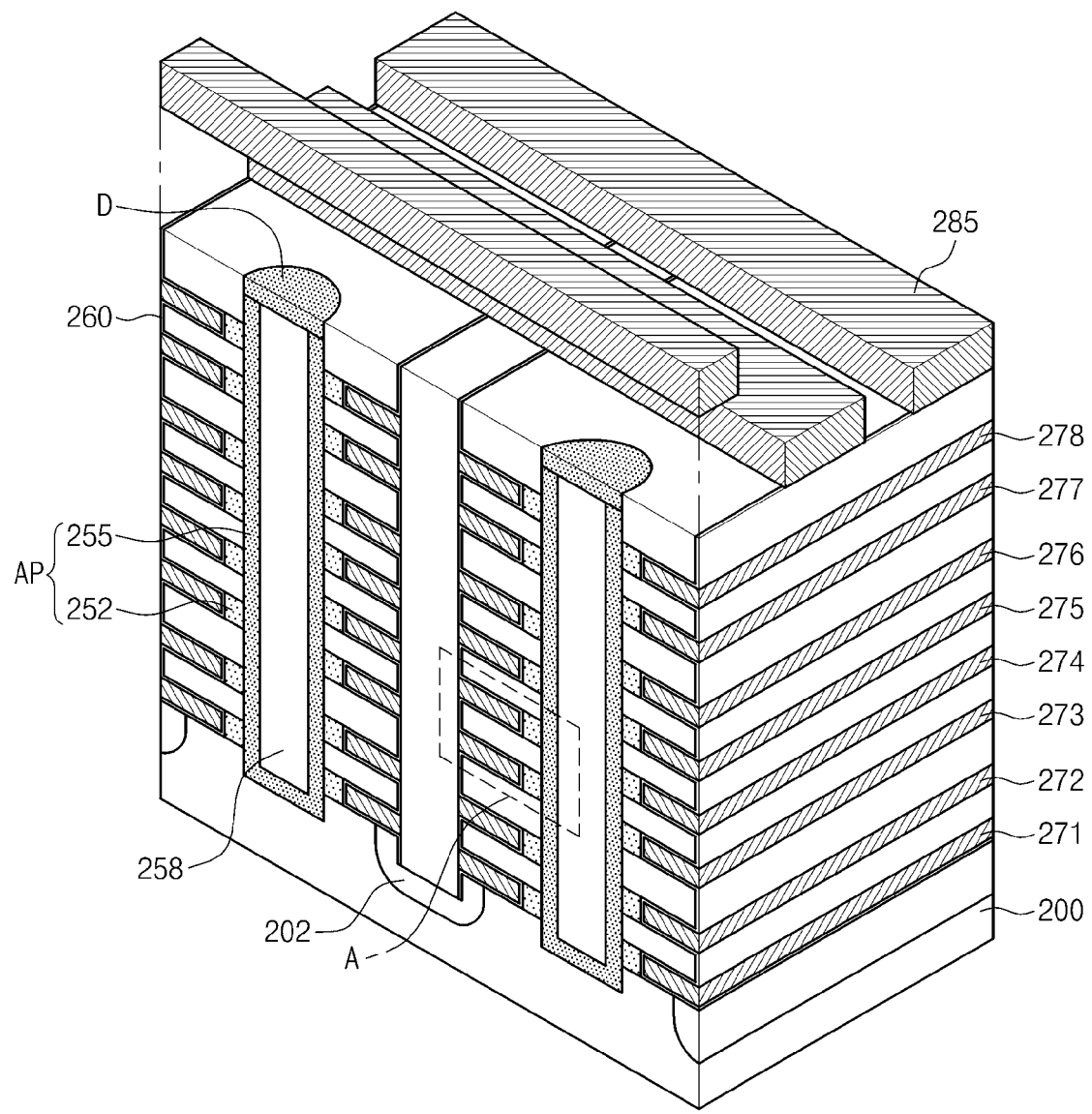
FIG. 18 illustrates a perspective view of the three-dimensional semiconductor memory device according to a second embodiment of the inventive concept.

Referring to FIG. 18, the three-dimensional semiconductor memory device includes a thin layer structure, i.e., where interlayer dielectric patterns 211 to 219 (FIG. 25) and gate conductive patterns 271 to 278 are alternately and repeatedly stacked on a substrate 200, and an active layer AP connected to the substrate 200 and penetrating the thin layer structure. According to the embodiment, the gate conductive patterns 271 to 278 may have a line form.

In the thin layer structure, recess regions 'a' may be defined among the gate conductive patterns 271 to 278, and may be horizontally separated from each other. The recess regions 'a' may be defined by the vertically-neighboring interlayer dielectric patterns 211 to 219 and the gate conductive patterns 271 to 278 therebetween. Also, in the thin layer structure, a penetration region 'b' may be defined among the horizontally-separated interlayer dielectric patterns 211 to 219.

As described above, the active pillar AP includes a plurality of first semiconductor patterns 252 and a second semiconductor pattern 255. The first semiconductor patterns 252 are partially formed among the interlayer dielectric patterns 211 to 219 and adjacent to sidewalls of the gate conductive patterns 271 to 278. The second semiconductor pattern 255 contacts the first semiconductor patterns 252 and penetrates the thin layer structure. In this embodiment, the second semiconductor pattern 255 of the active pillar AP may be directly contacted to the sidewalls of the interlayer dielectrics 211 to 219. Also, for improving the mobility of charges in the active pillar AP when the semiconductor memory device is operated, the first semiconductor pattern 252 of the active pillar AP is formed of semiconductor material which is laser-annealed and recrystallized. In the recrystallized semiconductor material, the grain size may be increased in comparison with that before the recrystallization as described above referring to FIGS. 2 and 3. Accordingly, the mean grain size of the first semiconductor pattern 252 may be larger than that of the second semiconductor pattern 255. Therefore, the active pillar AP may have a discontinuous boundary surface between the first semiconductor pattern 252 and the second semiconductor pattern 255.

Figure 19:
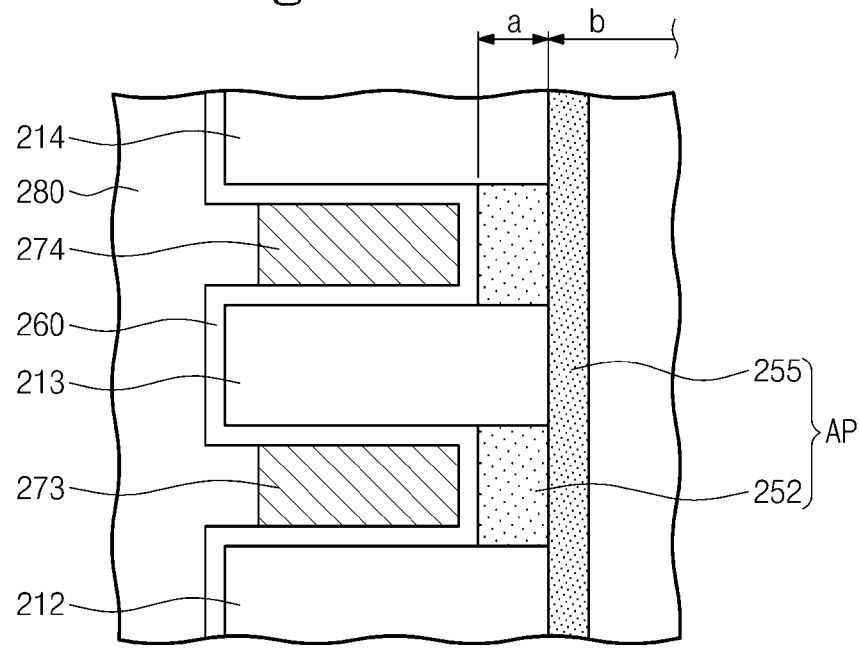
FIGS. 19 to 24 illustrate diagrams of a part of the three-dimensional semiconductor memory device according to the second embodiment of the inventive concept and magnifying a part 'A' of FIG. 18.
Figure 20:
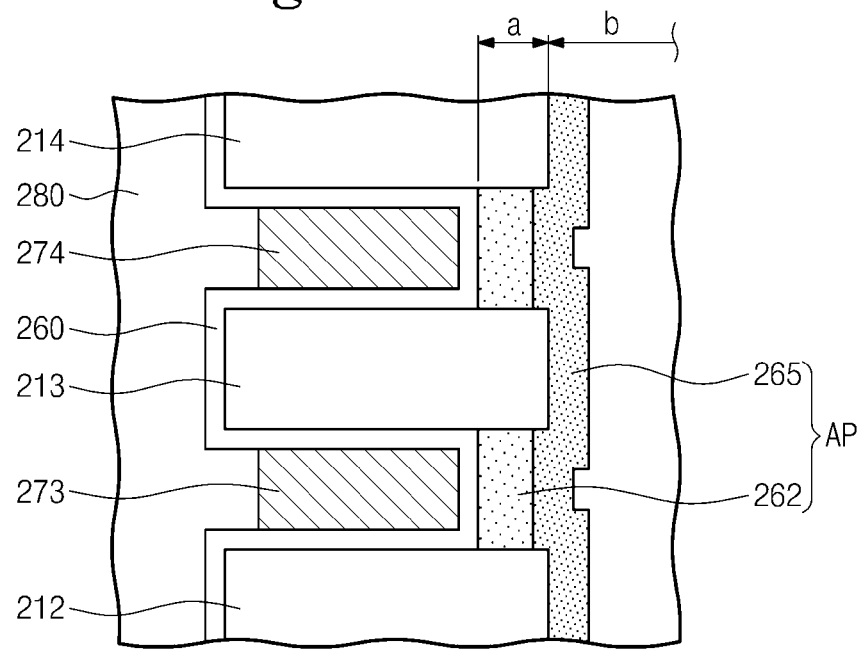

According to the embodiments, as illustrated in FIGS. 19 and 20, a horizontal width of the first semiconductor pattern 252 of the active pillar AP may be smaller than or substantially the same as a depth of the recess region 'a' of the thin layer structure. Herein, the depth of the recess region 'a' may be a distance between sidewalls of the vertically-adjacent interlayer dielectric and gate conductive pattern. Also, the horizontal width of the first semiconductor pattern 252 of the active pillar AP may be larger than the depth of the recess region 'a'.

Also, a data storage pattern 260 may be disposed between the active pillar and the gate conductive patterns 271 to 278. In detail, the data storage pattern 260 may be disposed between the first semiconductor pattern 252 of the active pillar AP and the gate conductive patterns 271 to 278. The data storage pattern 260 may be a charge storage layer, and the charge storage layer may be one of a charge trap insulation layer and an insulation layer including a floating gate electrode or conductive nano dots. Also, the charge storage layer may include sequentially-stacked blocking insulation layer, charge trap layer, and tunnel insulation layer. In the case that the data storage pattern 260 is the charge storage layer, data stored into the data storage pattern 260 may be changed using Fowler-Nordheim tunneling caused by a voltage difference between the active pillar AP and the gate conductive patterns 271 to 278. Meanwhile, the data storage pattern 260 may be a thin layer capable of storing data based on another operating principle (e.g., a thin layer for a phase-change memory or a thin layer for a variable-resistor memory).

According to the embodiment, the data storage pattern 260 may be the charge trap insulation layer. As illustrated in FIGS. 19 and 20, the charge trap insulation layer may be extended to upper and lower surfaces of the gate conductive patterns 271 to 278 between the active pillar AP and the gate conductive patterns 271 to 278. Also, the charge trap insulation layer may be extended to the sidewalls of the interlayer dielectrics 211 to 219.

Figure 21:
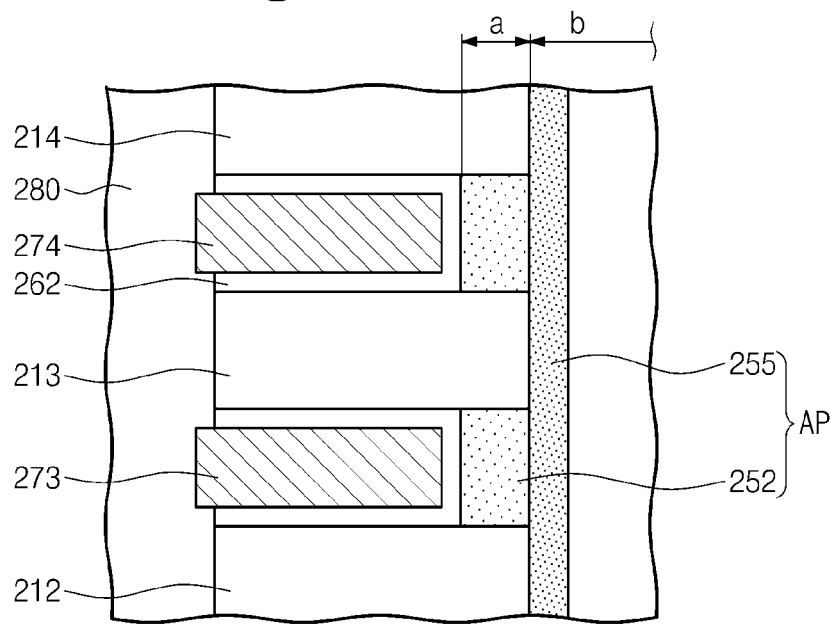

According to another embodiment, as illustrated in FIG. 21, a data storage pattern 262 may be partially formed among the interlayer dielectric patterns 211 to 219 so that the data storage pattern 262 may be separated from a vertically-adjacent another data storage pattern 262. Each of the data storage patterns 262 partially formed among the interlayer dielectrics 211 to 219 may be extended to the upper and lower surfaces of the gate conductive patterns 271 to 278 between the active pillar AP and the gate conductive patterns 271 to 278. In the case that the data storage patterns 262 are separated from each other, spreading of charges trapped in the data storage patterns 262 to neighboring data storage patterns 262 may be prevented or substantially minimized. In the case the data storage patterns 262 are vertically separated from each other, as illustrated, the gate conductive patterns 271 to 278 may have a wider horizontal width than that of the data storage pattern 262.

Figure 22:
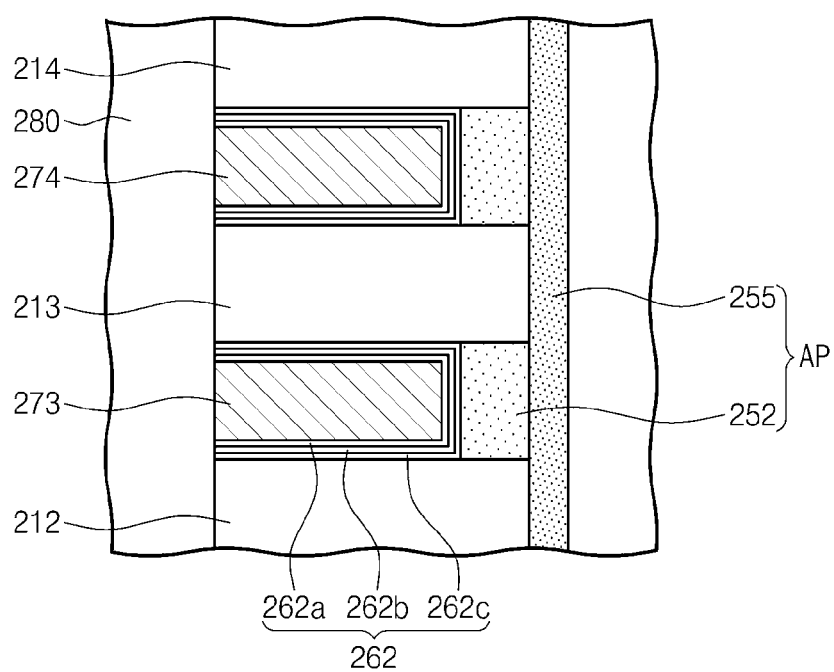

Also, the data storage pattern illustrated in FIGS. 19 to 21 may include sequentially-stacked blocking insulation layer 262a, charge trap layer 262b, and tunnel insulation layer 262c as illustrated in FIG. 22. Herein, the blocking insulation layer 262a may contact the gate conductive patterns 271 to 278, and the tunnel insulation layer 262c may contact the first semiconductor pattern 252.

Figure 23:
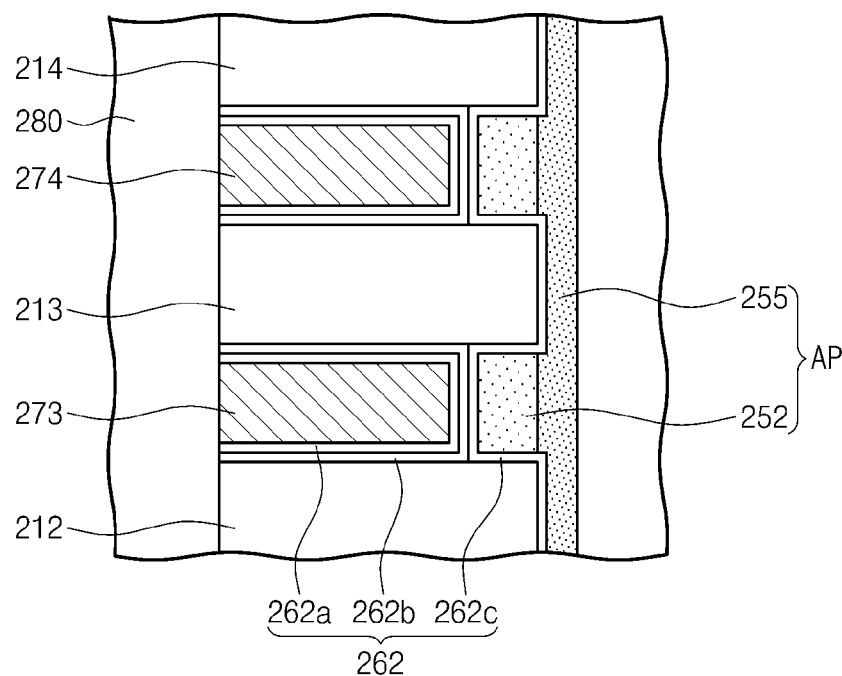

According to another embodiment, the blocking insulation layer 262a, charge trap layer 262b, and tunnel insulation layer 262c may be formed as illustrated in FIG. 23. That is, between the gate conductive patterns 271 to 278 and the first semiconductor pattern 252, the blocking insulation layer 262a, charge trap layer 262b, and tunnel insulation layer 262c may be sequentially disposed. Herein, the blocking insulation layer 262a and the charge trap layer 262b may be extended to the upper and lower surfaces of the gate conductive patterns 271 to 278, and the tunnel insulation layer 262c may be extended to the upper and lower surfaces of the first semiconductor pattern 252.

Figure 24:
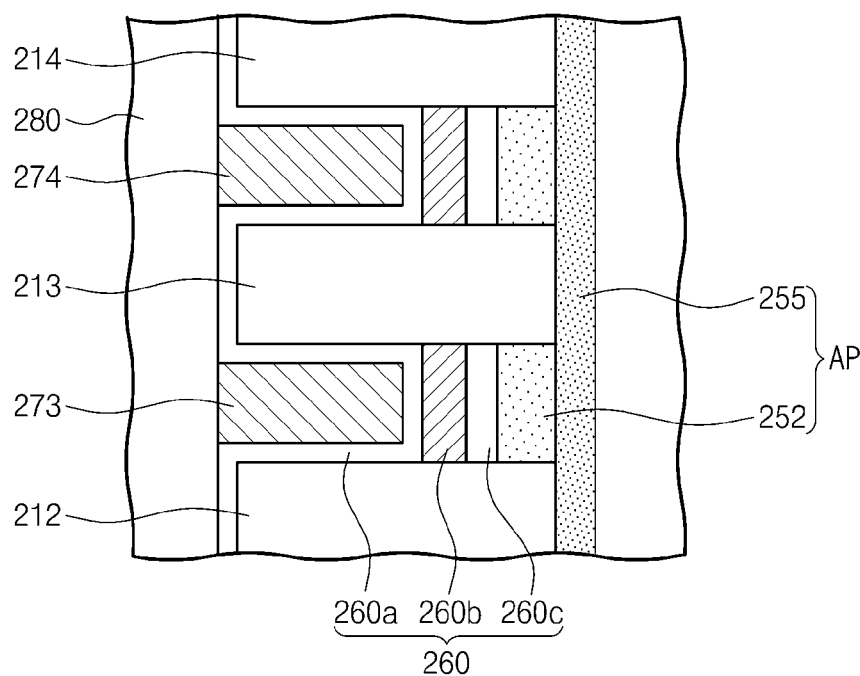

According to still another embodiment, the data storage pattern 260 includes a floating gate electrode 260b, as illustrated in FIG. 24. The floating gate electrode 260b may be partially arranged between the gate conductive patterns 271 to 278 and the first semiconductor pattern 252 of the active pillar AP. Also, an inter-gate insulation layer 260a is disposed between the gate conductive patterns 271 to 278, and a gate insulation layer 260c is disposed between the active pillar AP and the floating gate electrode 260b. Herein, the inter-gate insulation layer 260a may be extended to the upper and lower surfaces of the gate conductive patterns 271 to 278 between the floating gate electrode 260b and the gate conductive patterns 271 to 278. The inter-gate insulation layer 150a may include at least one of silicon oxide layer, silicon nitride layer, silicon oxynitride layer, and high-dielectric-constant layer and may include a plurality of layers. According to the embodiment, the inter-gate insulation layer 260a may be formed of an ONO layer. Otherwise, the inter-gate insulation layer 260a may include a high-dielectric-constant layer (e.g., a dielectric metal oxide layer such as a hafnium oxide layer or aluminum oxide layer) having a high dielectric constant in comparison with the gate insulation layer 260c. Meanwhile, the data storage pattern 260 may be a thin layer capable of storing data based on another operating principle (e.g., a thin layer for a phase-change memory or a thin layer for a variable-resistor memory).

Hereinafter, referring to FIGS. 25 to 35, a method for manufacturing the three-dimensional semiconductor memory device according to the second embodiment of the inventive concept will be described.

Figure 25:
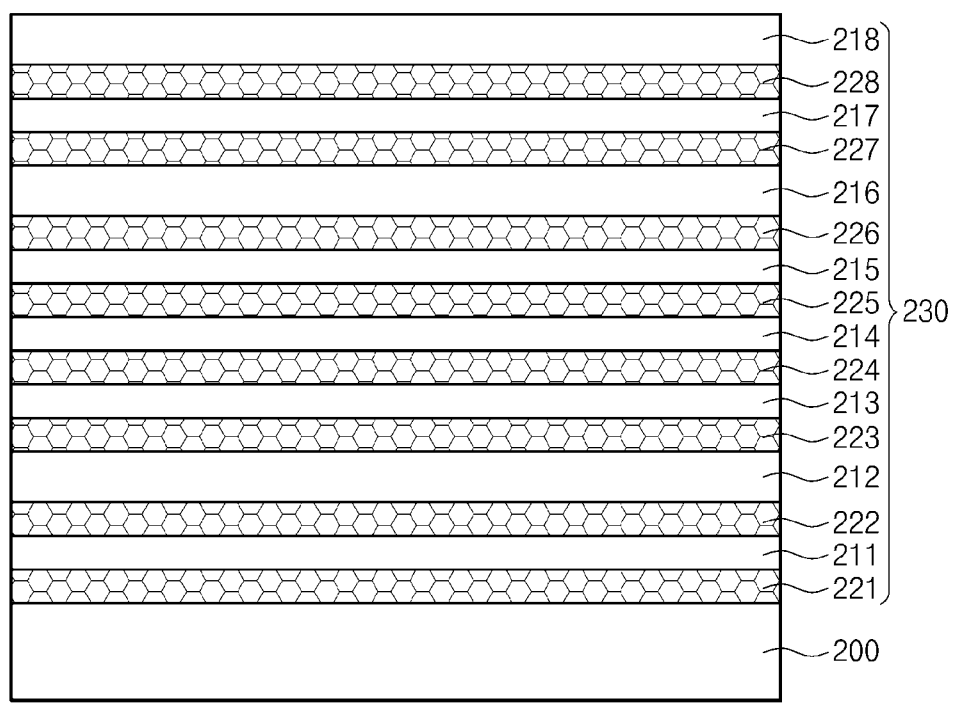
FIGS. 25 to 35 illustrate cross-sectional views of stages in a method for manufacturing the three-dimensional semiconductor memory device according to the second embodiment of the inventive concept.

Referring to FIG. 25, a thin layer structure 230 may be formed on the substrate 200. The substrate 200 may include a material having semiconductor characteristics (e.g., silicon wafer), a dielectric material (e.g., glass), and/or a semiconductor or conductor covered with a dielectric material.

The thin layer structure 230 may include a plurality of interlayer dielectrics 211 to 219 and a plurality of sacrificial layers 221 to 228. As illustrated in FIG. 25, the interlayer dielectrics 211 to 219 and the sacrificial layers 221 to 228 may be alternately and repeatedly stacked. The interlayer dielectrics 211 to 219 and the sacrificial layers 221 to 228 may be formed of materials selected to have an etch selectivity. For instance, the interlayer dielectrics 211 to 219 may be at least one of silicon oxide layer and silicon nitride layer, and the sacrificial layers 221 to 228 may be formed of different material from that of an insulation layer selected from silicon layer, silicon oxide layer, silicon carbide, and silicon nitride layer.

Figure 26:
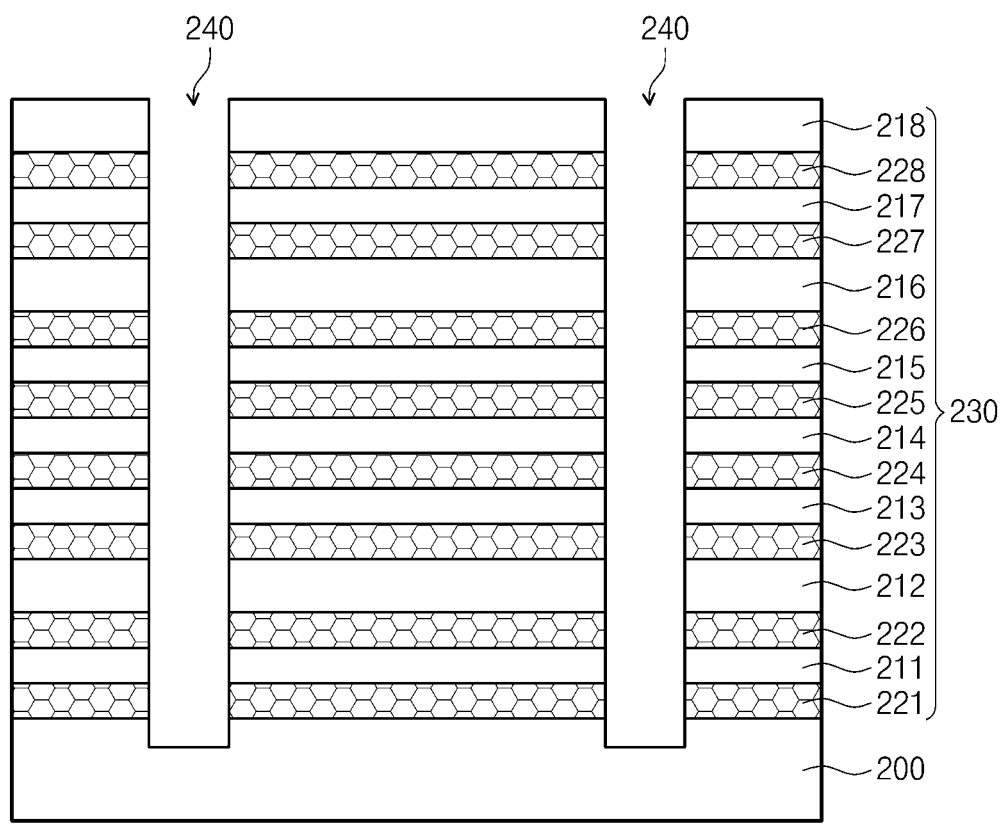

Referring to FIG. 26, a plurality of penetration regions 240 which expose the upper surface of the substrate 200 are formed by patterning the thin layer structure 230. According to the embodiment, each of the first penetration regions 240 may be formed in a shape of a cylindrical or a rectangular parallelepiped hole. According to another embodiment, the first penetration regions 240 may be formed in a line or a stripe shape instead of the hole shape. In detail, an operation of forming the first penetration regions 240 may include an operation of forming a mask pattern (not illustrated) which defines a planar position of openings on the thin layer structure 230 and an operation of anisotropically etching the thin layer structure 230 using the mask pattern as an etch mask.

Figure 27:
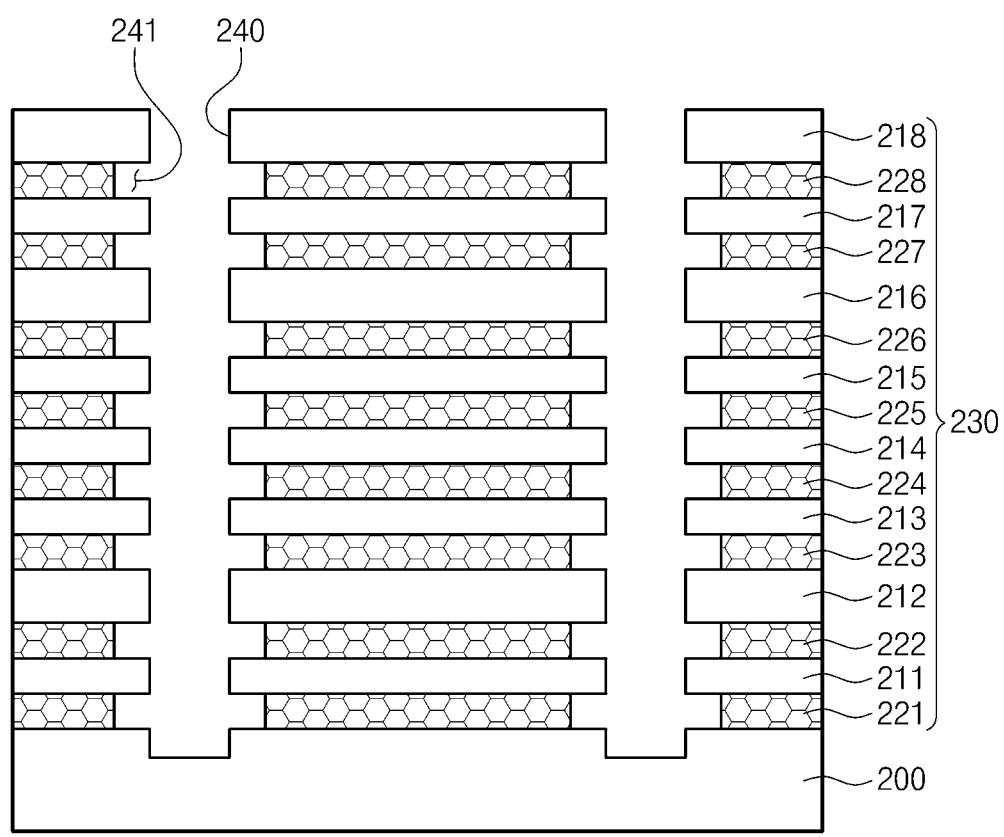

Referring to FIG. 27, first recess regions 241 are formed among the stacked interlayer dielectrics 211 to 219 by recessing the sacrificial layers 221 to 228 exposed to the first penetration region 240. Herein, forming the first recess regions 241 make the sacrificial layers 221 to 228 remain among the interlayer dielectrics 211 to 219. An operation of forming the first recess regions 241 includes the anisotropic or isotropic etching process for selectively etching the sacrificial layers 221 to 228. For instance, the operation of forming the first recess regions 241 may include an operation of isotropically etching the sacrificial layers 221 to 228 using an etch recipe which has an etch selectivity to the interlayer dielectrics 211 to 219. For instance, in the case that the sacrificial layers 221 to 228 are silicon nitride layers and insulation layers 210 are silicon oxide layers, the etching process may be performed using an etch solution including phosphoric acid.

The first recess regions 241 formed in this manner may be extended from the first penetration region 240 in a vertical direction to a length of the first penetration region 240. A depth of the first recess region 241 (a length extended in a vertical direction from the first penetration region 240) may be adjusted according to the channel thickness of the transistor.

Figure 28:
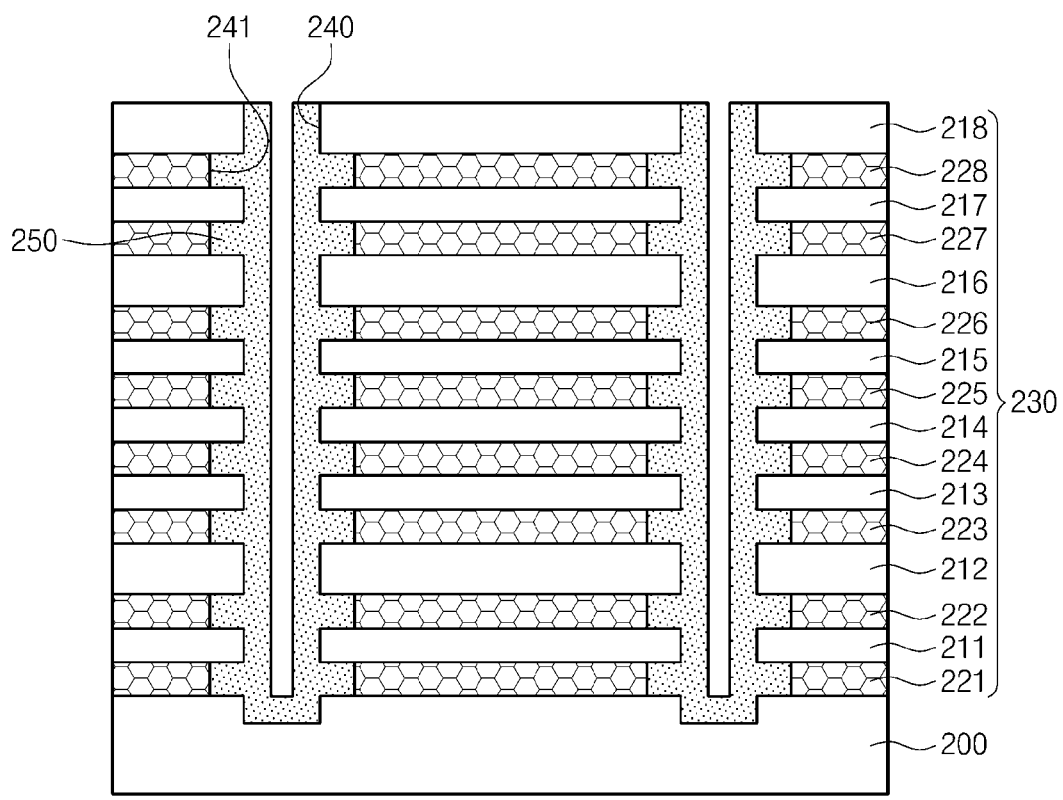

Referring to FIG. 28, a first semiconductor layer 250 is formed within the first penetration regions 240 and the first recess regions 241.

The first semiconductor layer 250 may fill the first recess regions 241 and the first penetration regions 240 using the CVD or ALD technique. The first semiconductor layer 250 filling the first recess regions 241 may be directly contacted to the sidewalls of the sacrificial layers 221 to 228. Also, the first semiconductor layer 250 may be formed of an amorphous semiconductor layer or a polycrystalline semiconductor layer. The first semiconductor layer 250 may include silicon (Si) and/or germanium (Ge).

According to the embodiment, the first semiconductor layer 250 may be formed using the CVD or ALD technique. Accordingly, the first semiconductor layer 250 may be conformally formed within the first penetration region 240 filling the first recess regions 241. In detail, the first semiconductor layer 250 may be deposited to a thickness larger than a half of thickness of the first recess regions 241. Also, a planar width of the first penetration region 240 may be larger than the thickness of the first recess region 241. In this case, the first semiconductor layer 250 may fill a part of the first penetration region 240 and define an empty region at a center portion of the first penetration region 240. Herein, the empty region may be opened upward.

Meanwhile, according to another embodiment, the first semiconductor layer 250 may fully fill the first penetration region 240 through the deposition process. In this case, after depositing the first semiconductor layer 250, a planarization process may be performed to the first semiconductor layer 250. According to still another embodiment, the first semiconductor layer 250 may be formed within the first penetration regions 240 by performing an epitaxial process using the substrate 200 exposed by the first penetration regions 240 as a seed layer.

Figure 29:
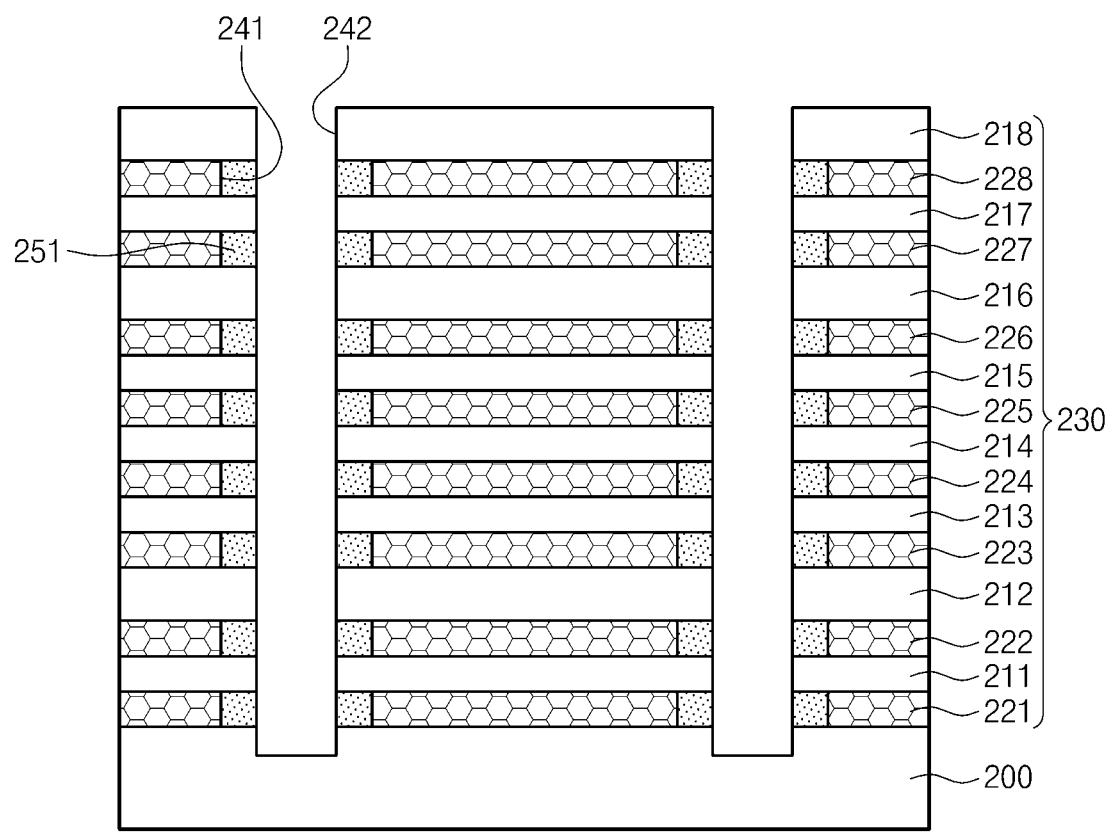

Referring to FIG. 29, by etching the semiconductor layer 250 filling the first penetration region 240, a first semiconductor pattern 251 is partially formed within the first recess regions 241.

According to the embodiment, forming the first semiconductor pattern 251 includes forming a second penetration region 242 which is substantially the same as the first penetrate region 240. That is, the second penetration region 242 may expose the sidewalls of the interlayer dielectrics 211 to 219 and the upper surface of the substrate 200.

According to the embodiment, the first semiconductor patterns 251 may be formed by performing the isotropic etching process to the first semiconductor layer 250 having the empty region. The isotropic etching process may be performed until the first semiconductor patterns 251 are separated from each other. That is, by the isotropic etching process, the second penetration region 144 may be formed exposing the sidewalls of the interlayer dielectrics 211 to 219 and the upper surface of the substrate 200. Herein, since the isotropic etching process is performed through the empty region, the first semiconductor layer 250 of sidewall and bottom parts of the empty region may be etched at the substantially same time. Since the isotropic etching process is performed through the empty region, the first semiconductor layer 250 may be conformally etched at the upper part and the lower part of the thin layer structure 230. Accordingly, horizontal thicknesses of the first semiconductor patterns 251 may be conformal. Also, the horizontal thicknesses of the first semiconductor patterns 251 may be varied according to an isotropic etching process time. For instance, the first semiconductor patterns 251 may be formed to partially fill the recess region 241 as illustrated in FIG. 20.

According to another embodiment, forming the second penetration region 242 may include forming the mask pattern (not illustrated) which defines the planar position of openings on the thin layer structure 230 and anisotropically etching the thin layer structure 230 using the mask pattern as an etch mask. The second penetration region 242 formed in this manner may expose the sidewalls of the interlayer dielectrics 211 to 219 and the upper surface of the substrate 200. Herein, the mask pattern used for forming the second penetration region 242 may have a width larger than that of the first penetration region 240 and smaller than that of the first recess region 241.

Figure 30:
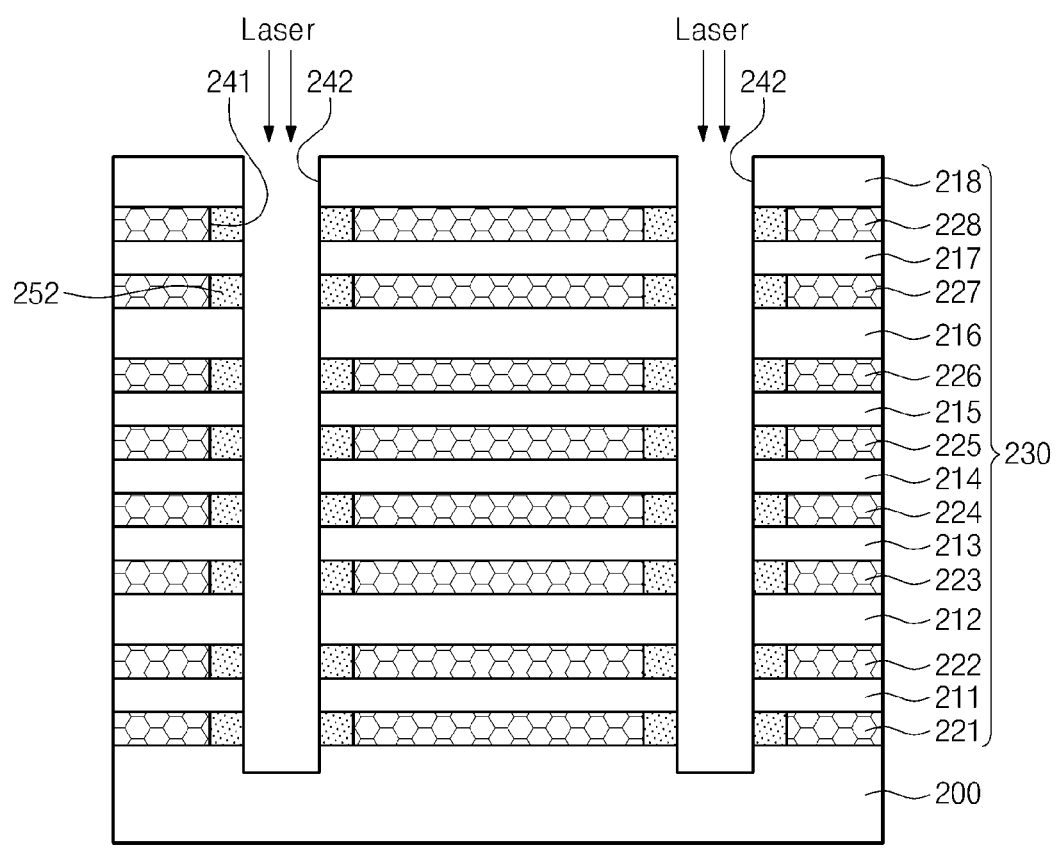

As described above, the first semiconductor patterns 251 within the first recess region 241 may have an amorphous, single-crystalline, and/or polycrystalline structure. Herein, if the first semiconductor patterns 251 have a polycrystalline structure and include many grains, i.e., many grain boundaries, the first semiconductor patterns 251 may be recrystallized by laser-annealing, as illustrated in FIG. 30, to form the recrystallized first semiconductor pattern 252. The first semiconductor pattern 251 of polycrystalline structure may have a larger grain size after the recrystallization. That is, the mean grain size of the recrystallized first semiconductor pattern 252 may be larger than that of the first semiconductor pattern 251 before the recrystallization. If the first semiconductor pattern 251 has an amorphous structure, a single-crystalline structure may be obtained by the laser-annealing process.

Laser-annealing the first semiconductor pattern 251 includes irradiating laser to the second penetration region 242 where the sidewalls of the first semiconductor patterns 251 are exposed as described above referring to FIG. 12. Accordingly, the laser may be directly irradiated to the first semiconductor patterns 251. Also, if the laser is irradiated to the first semiconductor pattern 251, continuous state changes of the first semiconductor pattern 251 may occur, i.e., the first semiconductor pattern 251 is phase-transitioned to liquid and then recrystallized being rapidly cooled. Accordingly, the grain size in the recrystallized first semiconductor pattern 252 may be increased in comparison with not-performing the laser-annealing process, and the number of grains in the recrystallized first semiconductor pattern 252 may be reduced. In other words, the mean grain size in the recrystallized first semiconductor pattern 252 after the laser-annealing process may be larger than that in the first semiconductor pattern 251 before the laser-annealing process. That is, the grain boundaries in the recrystallized first semiconductor pattern 252 may be reduced after the laser-annealing process.

Figure 31:
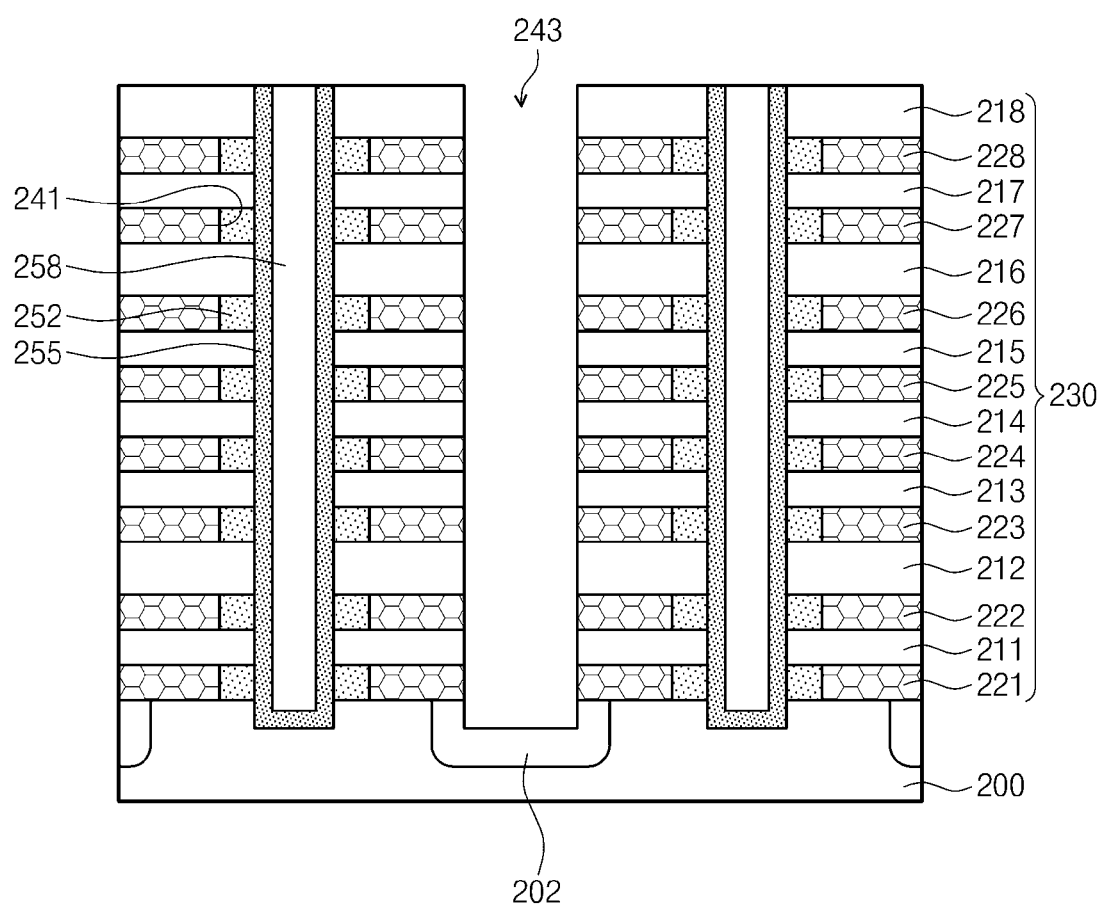

Referring to FIG. 31, the second semiconductor pattern 255 contacting the first semiconductor patterns 252 and the substrate 200 is formed within the second penetration region 242. As described above referring to FIG. 13, the second semiconductor pattern 255 may be conformally formed within the second penetration region 242 using a techniques. The second semiconductor pattern 255 may be formed in the hollow cylindrical shape or cylindrical shell shape, and a buried insulation pattern 258 may fill the second semiconductor pattern 255. Also, the second semiconductor pattern 255 is formed to have the same conductive type as that of the substrate to which the second semiconductor pattern 255 is contacted. Also, after the second semiconductor pattern 255 of the hollow cylindrical shape is formed, the surface treatment process may be performed to the second semiconductor pattern 255.

Thereafter, a third penetration region 243 is formed among the second semiconductor patterns 255 penetrating the thin layer structure 230. The third penetration region 243 may be formed to expose the sidewalls of the sacrificial layers 221 to 228 and interlayer dielectrics 211 to 219 being separated from the second semiconductor pattern 255. For a horizontal shape, the third penetration region 243 may be formed in a line or rectangular shape. For a vertical depth, the third penetration region 243 may be formed to expose the upper surface of the substrate 200. Due to the anisotropic etching process for forming the third penetration region 243, the upper surface of the substrate 200 exposed to the third penetration region 243 may be recessed.

According to the embodiment, after forming the third penetration region 243, an impurity region (conductive region 202), which may be used as the common source line, may be partially formed within the substrate 200. The impurity region 202 may be formed through an ion injection process using the thin layer structure 230 where the third penetration region 243 is formed as an ion mask.

Figure 32:
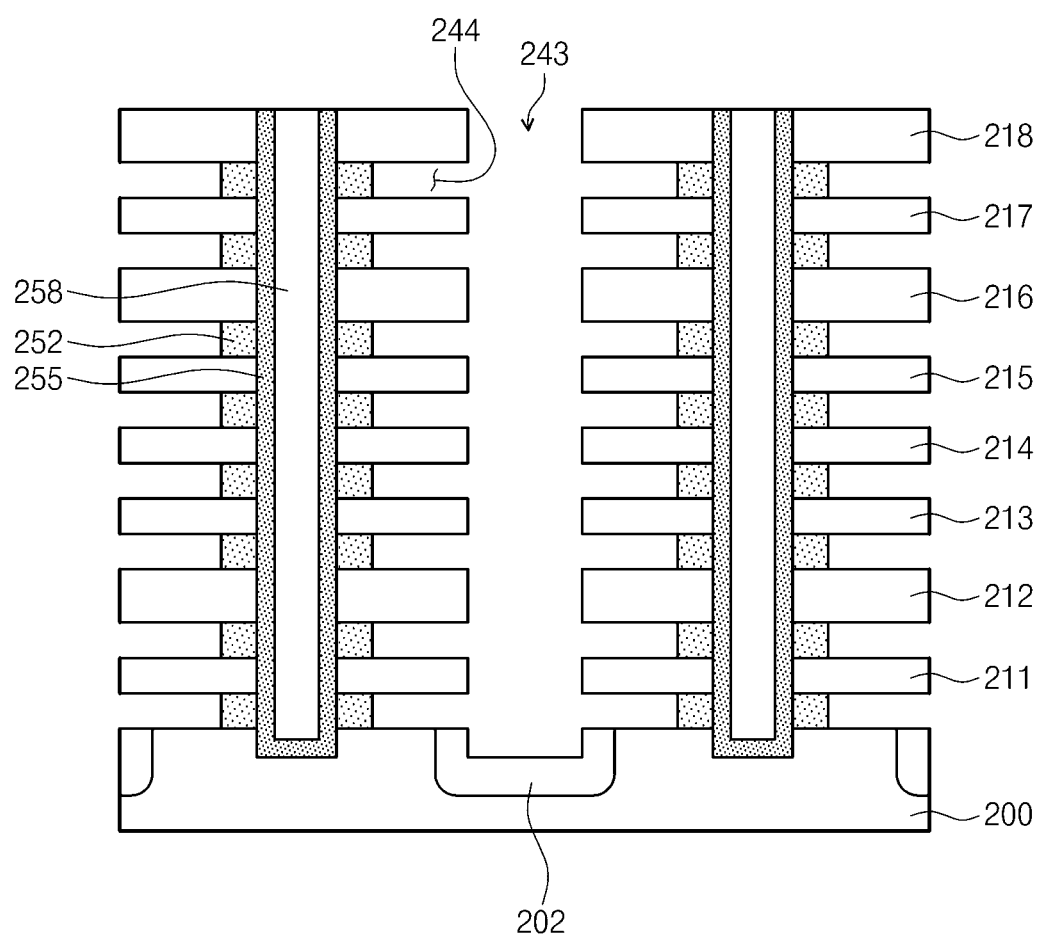

Referring to FIG. 32, by selectively removing the sacrificial layers 221 to 228 exposed to the third penetration region 243, the second recess regions 244 are formed among the interlayer dielectric 211 to 219. The second recess regions 244 may be horizontally extended from the third penetration region 243 to between the interlayer dielectrics 211 to 219, and may expose the sidewalls of the recrystallized first semiconductor patterns 252. Forming the second recess regions 244 may include isotropically etching the sacrificial layers 221 to 228 using an etch recipe which has an etch selectivity to the interlayer dielectrics 211 to 219. Herein, the sacrificial layers 221 to 228 may be completely removed by the isotropic etching process. For instance, in the case that the sacrificial layers 221 to 228 are silicon nitride layers and the interlayer dielectrics 211 to 219 are silicon oxide layers, the etching process may be performed using an etch solution including phosphoric acid.

Figure 33:
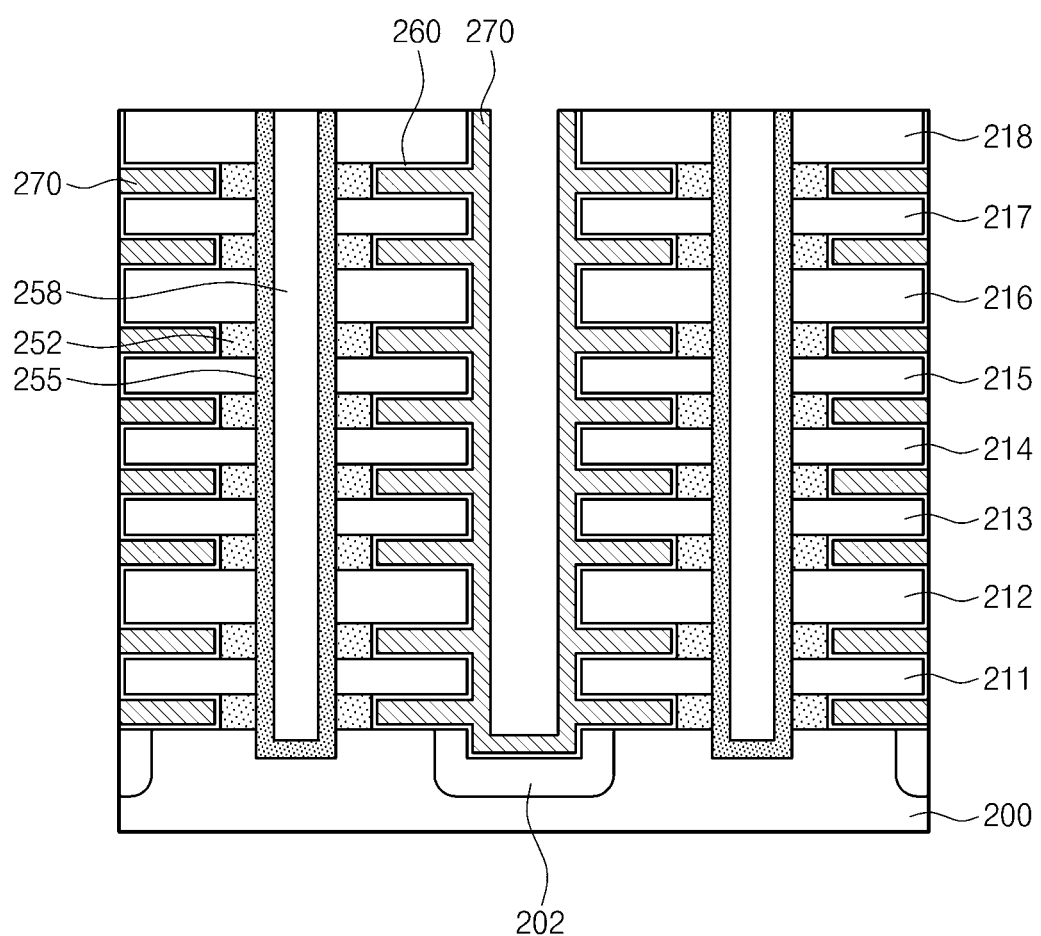

Referring to FIG. 33, the data storage layer 260 is conformally formed along the surfaces of the third penetration regions 243 and the second recess regions 244. Herein, the data storage layer 260 may be the charge trap insulation layer. In detail, the data storage layer 260 may be formed using the deposition technique (e.g., the CVD or ALD technique) which provides good step coverage as described above referring to FIG. 10 and may be formed to a thinner thickness than a half of the thickness of the second recess regions 244. Accordingly, the data storage layer 260 may be formed to substantially and conformally cover the thin layer structure 230 where the second recess regions 244 are formed. That is, the data storage layer 260 may be formed on the sidewalls of the first semiconductor patterns 252 exposed to the second recess region 244, and the data storage layer 260 may be conformally formed on the surfaces of the interlayer dielectrics 211 to 219 exposed to the third penetration region 243 and the second recess regions 244.

Thereafter, a gate conductive layer 270 is formed within the third penetration region 243 and the second recess regions 244 where the data storage layer 260 is formed.

According to the embodiment, the gate conductive layer 270 may be formed using the CVD or ALD technique. Accordingly, the gate conductive layer 270 may be conformally formed within the third penetration region 243 filling the second recess regions 244. In detail, the gate conductive layer 270 may be deposited to a thickness larger than the half of the thickness of the second recess region 244. Also, a planar width of the third penetration region 243 may be larger than the thickness of the second recess region 244. In this case, the gate conductive layer 270 may fill a part of the third penetration region 243 and define an empty region at a center portion of the third penetration region 243. Herein, the empty region may be opened upward The conductive layer 270 may include at least one of doped silicon, tungsten, metal nitride layers and metal silicides. Meanwhile, since the inventive concept is not limited to a flash memory device, the material and structure of the gate conductive layer 270 may be variously changed.

Figure 34:
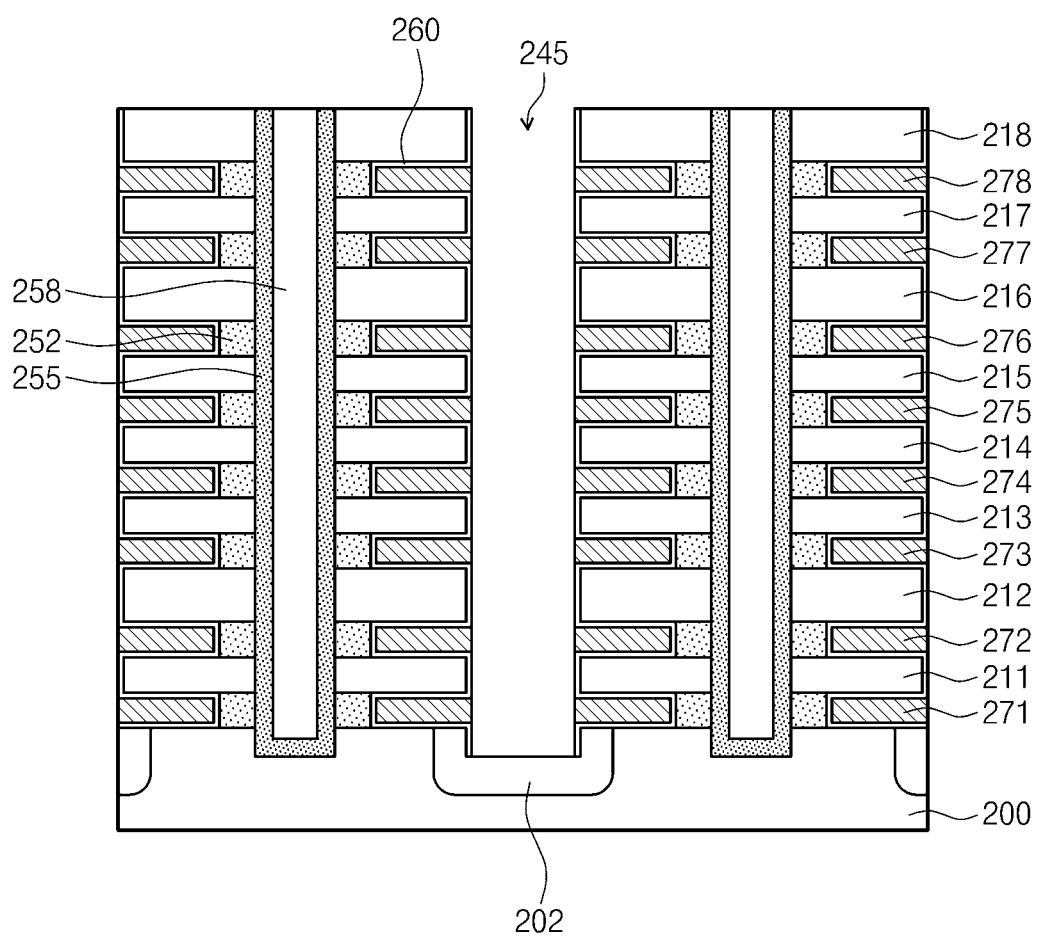

Referring to FIG. 34, by removing the gate conductive layer 270 within the third penetration region 243, gate conductive patterns 271 to 278 are partially formed at each of the second recess regions 244.

According to the embodiment, the gate conductive patterns 271 to 278 may be formed performing the isotropic etching process to the gate conductive pattern 270 having the empty region. The isotropic etching process may be performed until the gate conductive patterns 271 to 278 are separated from each other. That is, by the isotropic etching process, the data storage layer 260 on the sidewalls of the interlayer dielectrics 211 to 219 and the upper surface of the substrate 200 may be exposed. Herein, since the isotropic etching process is performed through the empty region, the gate conductive layer 270 on the sidewall and bottom of the empty region may be removed at the substantially same time. Since the isotropic etching process is performed through the empty region, the gate conductive layer 270 may be conformally etched at the upper part and the lower part of the thin layer structure 230. Accordingly, horizontal thicknesses of the gate conductive patterns 271 to 278 may be conformal. Also, the horizontal thicknesses of the gate conductive patterns 271 to 278 may be varied according to the isotropic etching process time. For instance, the gate conductive patterns 271 to 278 may be formed to partially fill the second recess region 244 as illustrated in FIGS. 19 and 20.

After forming the gate conductive patterns 271 to 278, the upper surface of the substrate 200 is exposed by removing the data storage layer 260 on the upper surface of the substrate 200. Herein, the data storage layer 260 may be removed by performing the isotropic etching process. During the isotropic etching process, the data storage 260 on the sidewalls of the interlayer dielectrics 211 to 219 may be removed together. In this case, as illustrated in FIGS. 21 and 22, the data storage pattern may be partially formed at each of the recess regions 244. That is, the data storage patterns separated from each other may be formed.

According to another embodiment, forming the gate conductive patterns 271 to 278 includes forming a fourth penetration region 245 by anisotropically etching the gate conductive pattern 270 which fills the third penetration region 243. In detail, forming the fourth penetration region 245 may include anisotropically etching the gate conductive layer using a mask pattern which is additionally formed on the uppermost insulation layer of the thin layer structure 230 as an etch mask. The mask pattern may have openings exposing the upper surface of the gate conductive layer 270 which fills the third penetration region 243.

According to the embodiment, the fourth penetration region 245 may expose the surface of the data storage layer 260 on the sidewalls of the interlayer dielectrics 211 to 219 and the upper surface of the substrate 200. In this case, after forming the fourth penetration region 245 exposing the data storage layer 260 and the upper surface of the substrate 200, a process for selectively removing the data storage layer 260 on the sidewalls of the interlayer dielectrics 211 to 219 may be further performed. For the process of removing the data storage layer 260, an etch solution or etch gas which has an etch selectivity to the gate conductive layer may be used. For instance, in the case that the data storage layer 260 on the sidewalls of the interlayer dielectrics 211 to 219 are removed through the isotropic etching process, etch solutions such as HF, $O_3$/HF, phosphoric acid, sulfuric acid, and LAL. Also, for removing the data storage layer 260, a fluoride-based etch solution and the etch solution of phosphoric acid or sulfuric acid may be sequentially used.

According to still another embodiment, the fourth penetration region 245 may expose the sidewalls of the interlayer dielectrics 211 to 219 and the upper surface of the substrate 200. Forming such the fourth penetration region 245 may be performed by forming a mask pattern having an opening on the thin layer structure 230, where a width of the opening is larger than that of the third penetration region 243 and smaller than that of the second recess region 244, and by anisotropically etching the gate conductive layer using the mask pattern. Herein, since the data storage layer 260 on the sidewalls of the interlayer dielectrics 211 to 219 is exposed, the data storage layer 260 on the sidewalls of the interlayer dielectrics 211 to 219 may be removed during the anisotropic etching process.

Since the gate conductive patterns 271 to 278 and the data storage patterns are formed in this manner, the gate conductive patterns 271 to 278 may be three-dimensionally arranged on the substrate 200, and the data storage pattern may be formed at each of the gate conductive patterns 271 to 278. Since the gate storage patterns are vertically and horizontally separated from each other, the charges trapped in the data storage patterns may be prevented from spreading to neighboring cells and being lost.

Figure 35:
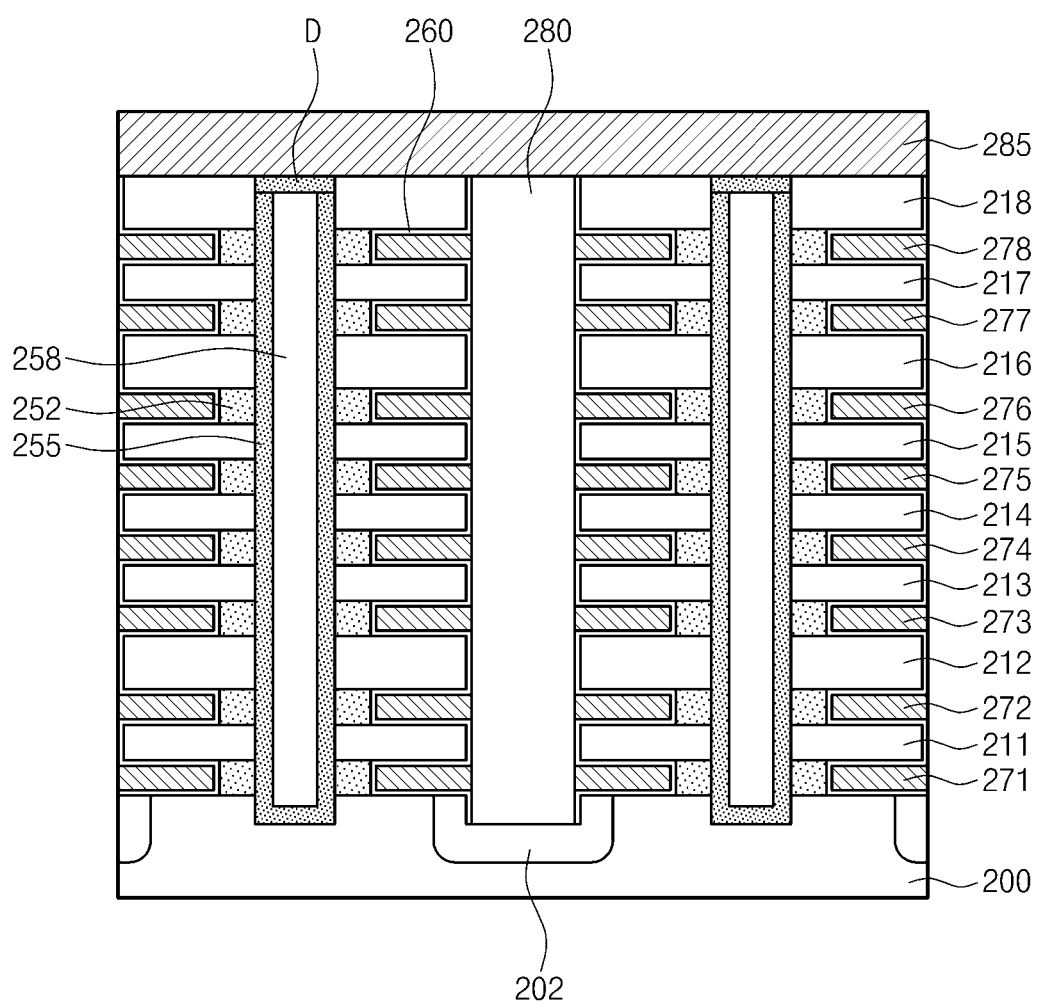

Thereafter, as illustrated in FIG. 35, an electrode isolation pattern 280 is formed filling the fourth penetration region 245 with a dielectric material. The electrode isolation pattern 280 may be at least one of silicon oxide layer, silicon nitride layer, and silicon oxynitirde layer.

Thereafter, an impurity region D may be formed on the second semiconductor pattern 255. Also, bit lines 285 which electrically connect the second semiconductor patterns 255 may be formed on the thin layer structure 230. The bit lines 285 may be formed in a direction crossing the string selection line patterned as a line form as illustrated. Meanwhile, the bit lines 285 may be connected to the second semiconductor patterns 255 by a contact plug (not illustrated).

Hereinafter, referring to FIGS. 36 to 43, a method for manufacturing the three-dimensional semiconductor memory device illustrated in FIG. 24 will be described in detail. According to this embodiment, the data storage patterns include a floating gate electrode, and the manufacturing method is similar to that of the second embodiment except for the method of forming the floating gate electrode. Accordingly, for conciseness, explanations of overlapped technical features are omitted below.

As described above referring to FIGS. 25 and 26, the thin layer structure 230 where the interlayer dielectrics 211 to 219 and the sacrificial layers 221 to 228 are alternately stacked is formed on the substrate 200, and the first penetration regions 240 which penetrate the thin layer structure 230 and expose the substrate 200 are formed.

Figure 36:
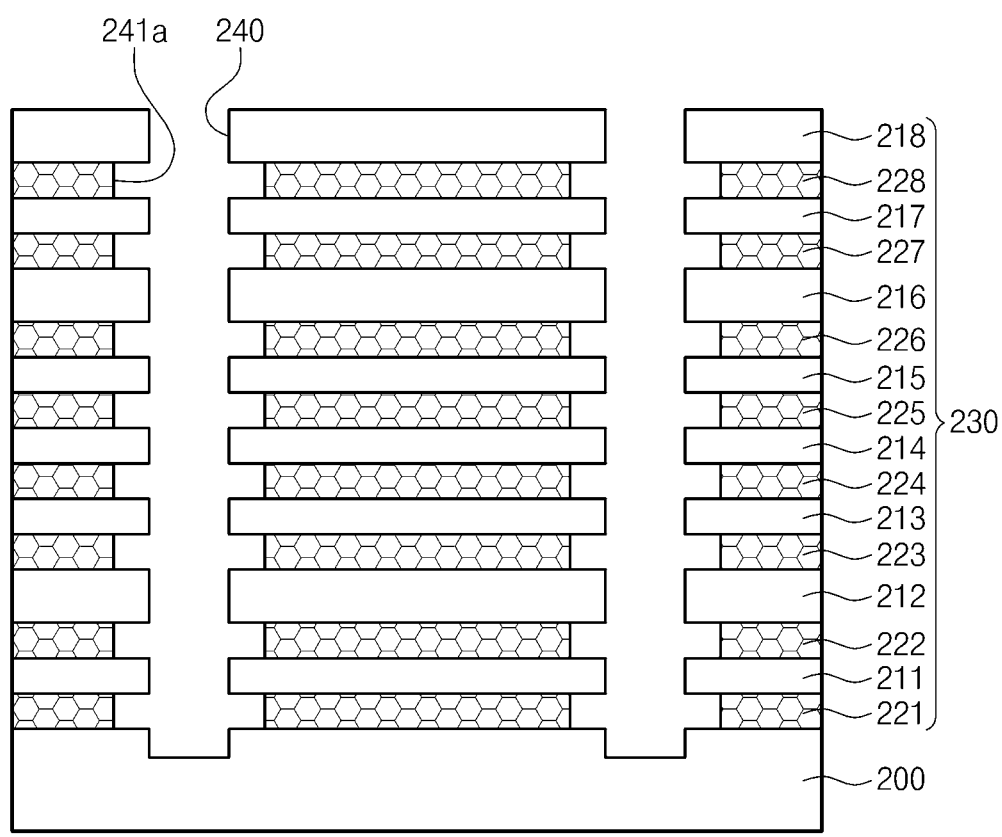
FIGS. 36 to 43 illustrate cross-sectional views for of stages in a method for manufacturing the three-dimensional semiconductor memory device illustrated in FIG. 24.

Thereafter, as illustrated in FIG. 36, by recessing the sacrificial layers 221 to 228 exposed to the first penetration region 240, first recess regions 241a are formed among the stacked interlayer dielectrics 211 to 219. Herein, a width of the first recess region 241a may be larger than that of the first recess region 241 described referring to FIG. 27. Also, forming the first recess regions 241a includes the anisotropic or isotropic etching process for selectively etching the sacrificial layers 221 to 228 as illustrated in FIG. 27.

Figure 37:
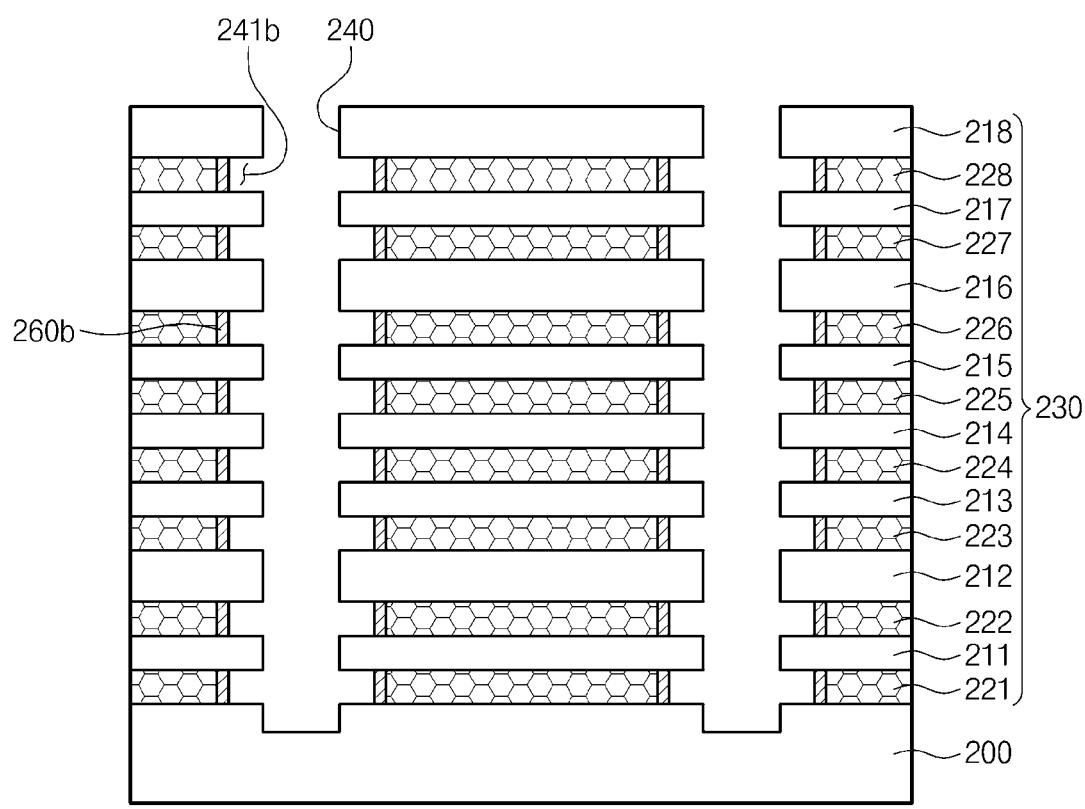

Referring to FIG. 37, a floating gate electrode 260b is partially formed at each of the first recess regions 241a. Forming the floating gate electrode 260b includes forming a floating gate conductive layer 265 within the first recess regions 241a and the first penetration regions 240 and forming second recess regions 241b among the interlayer dielectrics 211 to 219 by etching the floating gate conductive layer 265.

In detail, the floating gate conductive layer 265 within the first recess regions 241a and the first penetration region 240 may be formed using a deposition technique (e.g., the CVD or ALD technique) which provides good step coverage. The floating gate conductive layer 265 may be formed of, e.g., conductive material such as doped polycrystalline silicon or metal material. According to the embodiment, the gloating gate conductive layer 265 may be conformally formed within the first penetration region 240 filling the second recess regions 241b as described above referring to FIG. 15. The floating gate conductive layer 265 may fill a part of the first penetration region 240 and define an empty region at a central portion of the first penetration region 240. Herein, the empty region may be opened upward.

Also, for forming the second recess regions 241b, the anisotropic or isotropic etching process for selectively etching the floating gate conductive layer 265 may be performed. For instance, if an etch solution whose etch selectivity to the floating gate conductive layer 265 is high is applied to the empty region defined in the floating gate conductive layer 265, a part of the floating gate conductive layer 265 may be selectively removed. Herein, a depth of the second recess region 241b may be controlled by appropriately adjusting recipe of the isotropic etching process. The second recess regions 241b formed in this manner may be extended from the first penetration region 240 in a direction vertical to a length direction of the first penetration region 240. Since the second recess regions 241b are formed, the floating gate electrodes 260b vertically separated from each other may be formed among the interlayer dielectrics 211 to 219.

Figure 38:
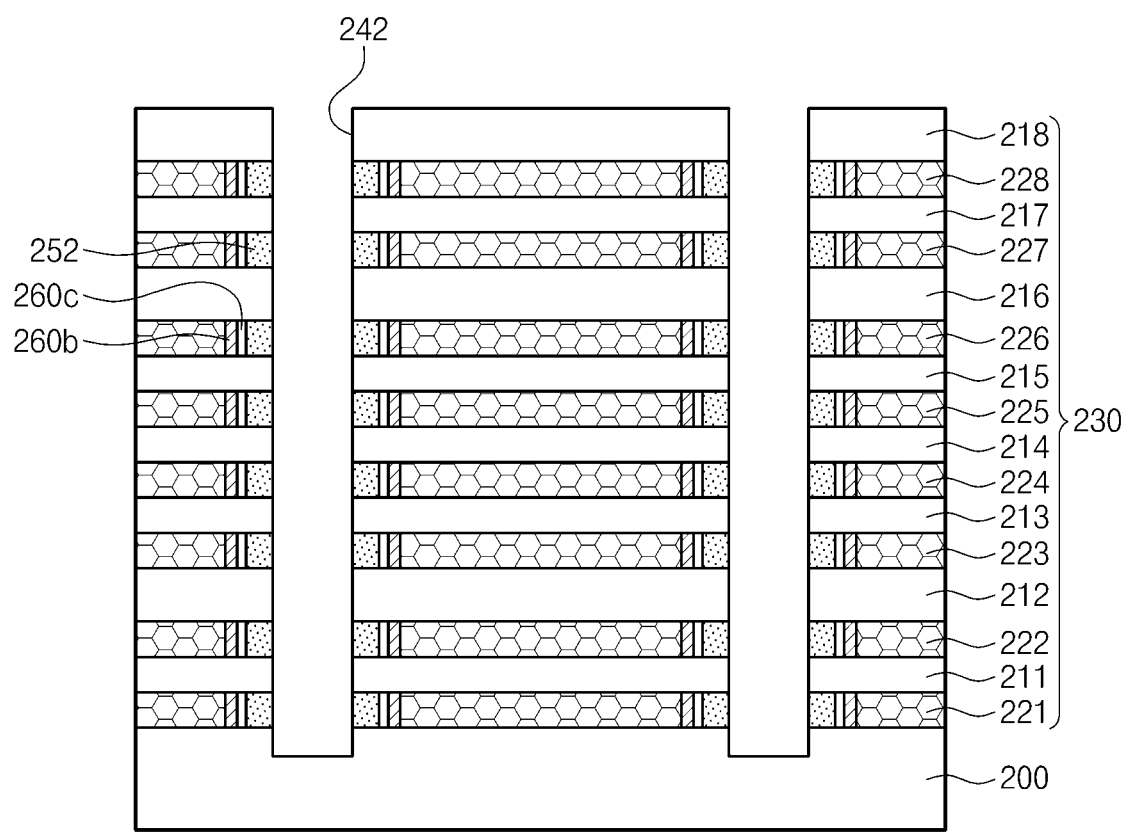

Referring to FIG. 38, a gate insulation layer 260c is selectively formed on the sidewall of the floating gate electrode 260b exposed to the second recess regions 241b. The gate insulation layer 260c may be formed by thermally oxidizing the sidewall of the floating gate electrode 260b.

Thereafter, the first semiconductor pattern 251 is formed at each of the second recess regions 241b where the gate insulation layer 260c is formed. Forming the first semiconductor pattern 251 includes forming the first semiconductor layer within the second recess region 241b and the first penetration region 240 and partially forming the first semiconductor patterns 251 at each of the second recess regions 241b by patterning the first semiconductor layer as above described referring to FIG. 29. The first semiconductor layer may be formed using the CVD or ALD technique, and the first semiconductor layer may be conformally formed within the first penetration regions 240 filling the second recess regions 241b as above described referring to FIG. 29. The first semiconductor layer within the second recess regions 241b may be directly contacted to the gate insulation layer 260c.

Forming the first semiconductor patterns 251 partially may be performed by performing the isotropic etching process to the first semiconductor layer 250 as described above referring to FIG. 29. Since the first semiconductor layer 250 is isotropically etched, the second penetration region 242 where the sidewalls of the interlayer dielectrics 211 to 219 and the upper surface of the substrate 200 are exposed may be formed as describe above referring to FIG. 29. Thereafter, as described above referring to FIG. 30, by laser-annealing the first semiconductor patterns 251 exposed to the second penetration region 242, the first semiconductor patterns 251 are recrystallized.

Figure 39:
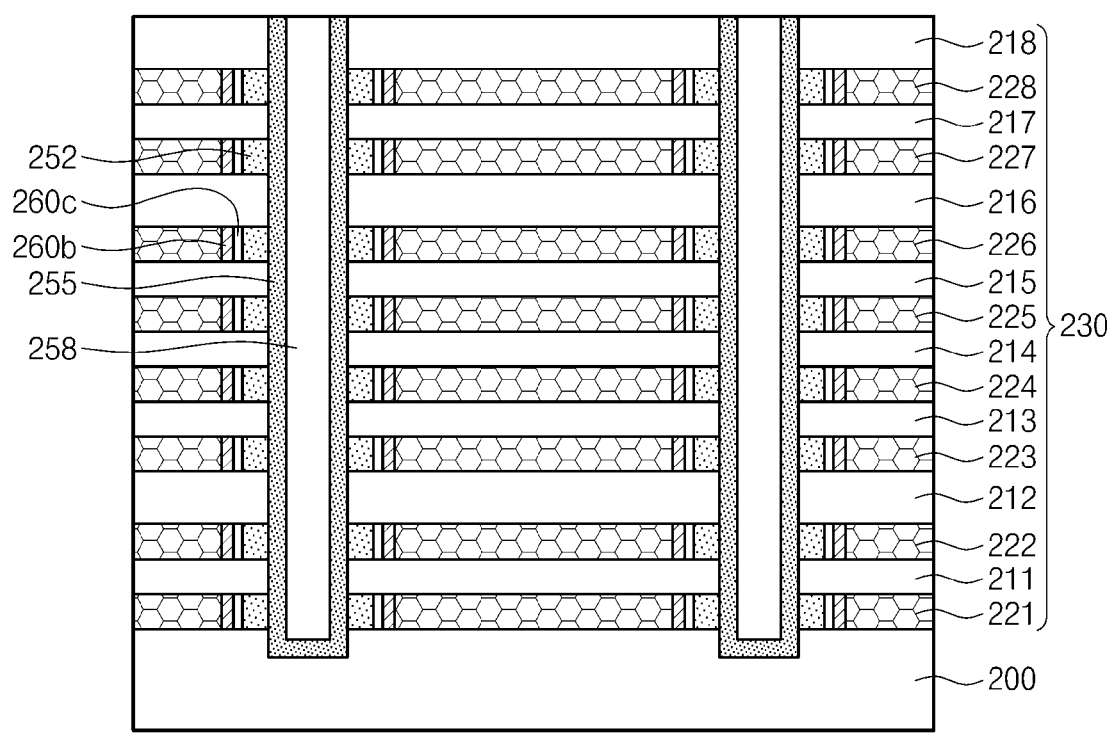

Thereafter, referring to FIG. 39, the recrystallized first semiconductor patterns 252 and the second semiconductor pattern 255 contacting the substrate 200 are formed within the second penetration region 242. Forming the second semiconductor pattern 255 may be performed in the similar manner described above referring to FIG. 31.

Figure 40:
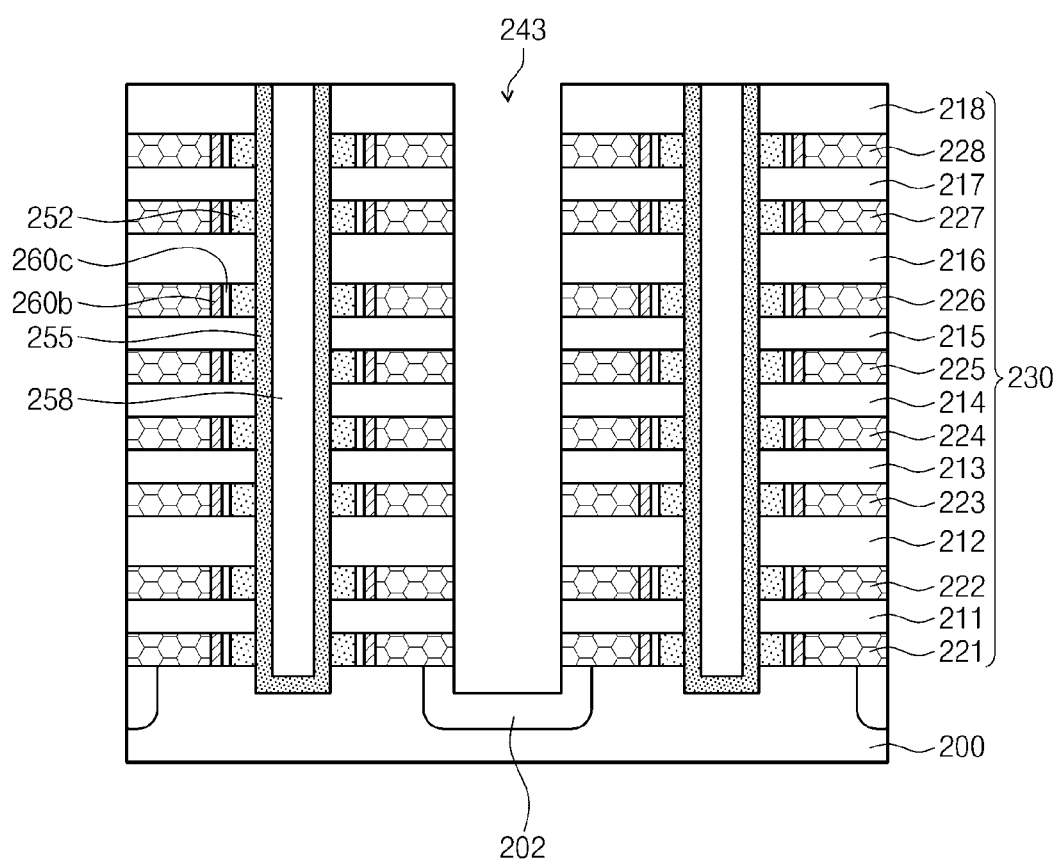

Referring to FIG. 40, the third penetration region 243 is formed penetrating the thin layer structure 230 among the second semiconductor patterns 255.

Figure 41:
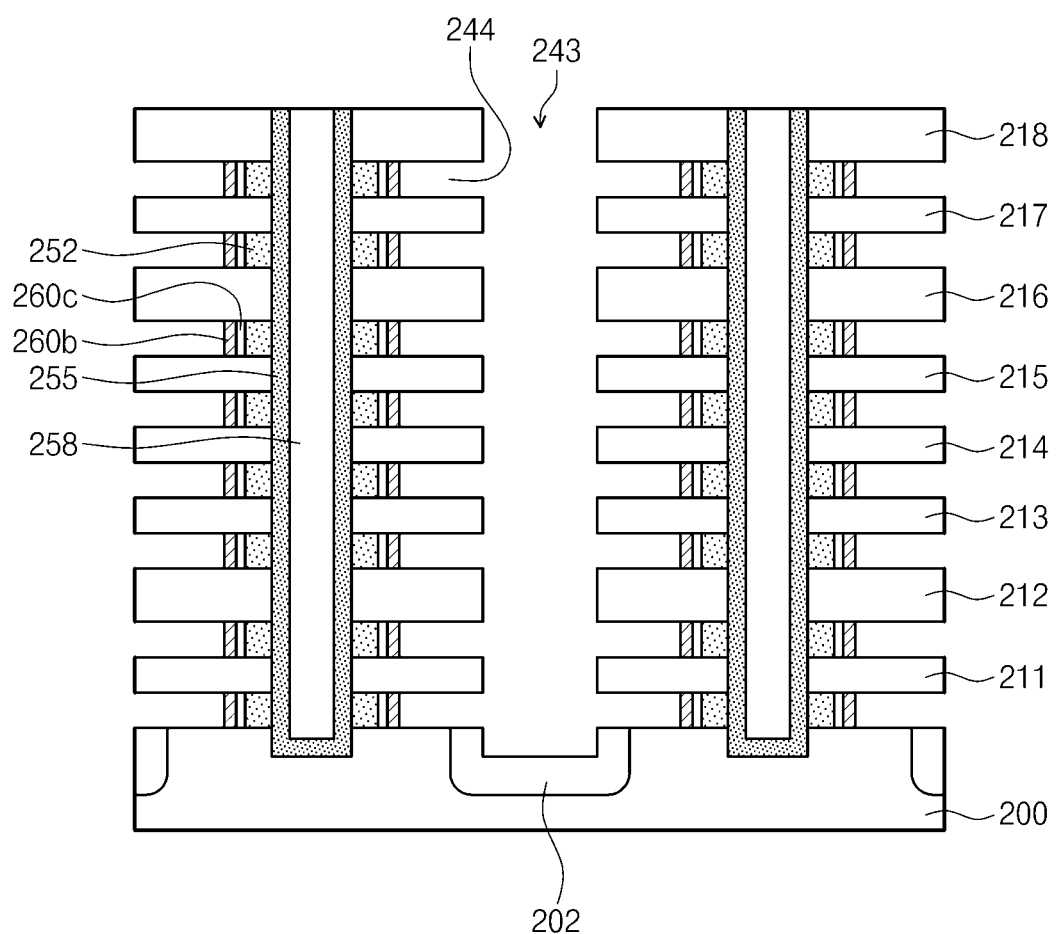

Referring to FIG. 41, by selectively removing the sacrificial layers 221 to 228 exposed to the third penetration region 243, third recess regions 244 are formed among the interlayer dielectrics 211 to 219. Forming the third recess regions 244 may include isotropically etching the sacrificial layers 221 to 228 using an etch recipe which has an etch selectivity to the interlayer dielectrics 211 to 219 as described above referring to FIG. 32. Herein, the third recess regions 244 may expose the sidewall of the floating gate electrode 260b.

Figure 42:
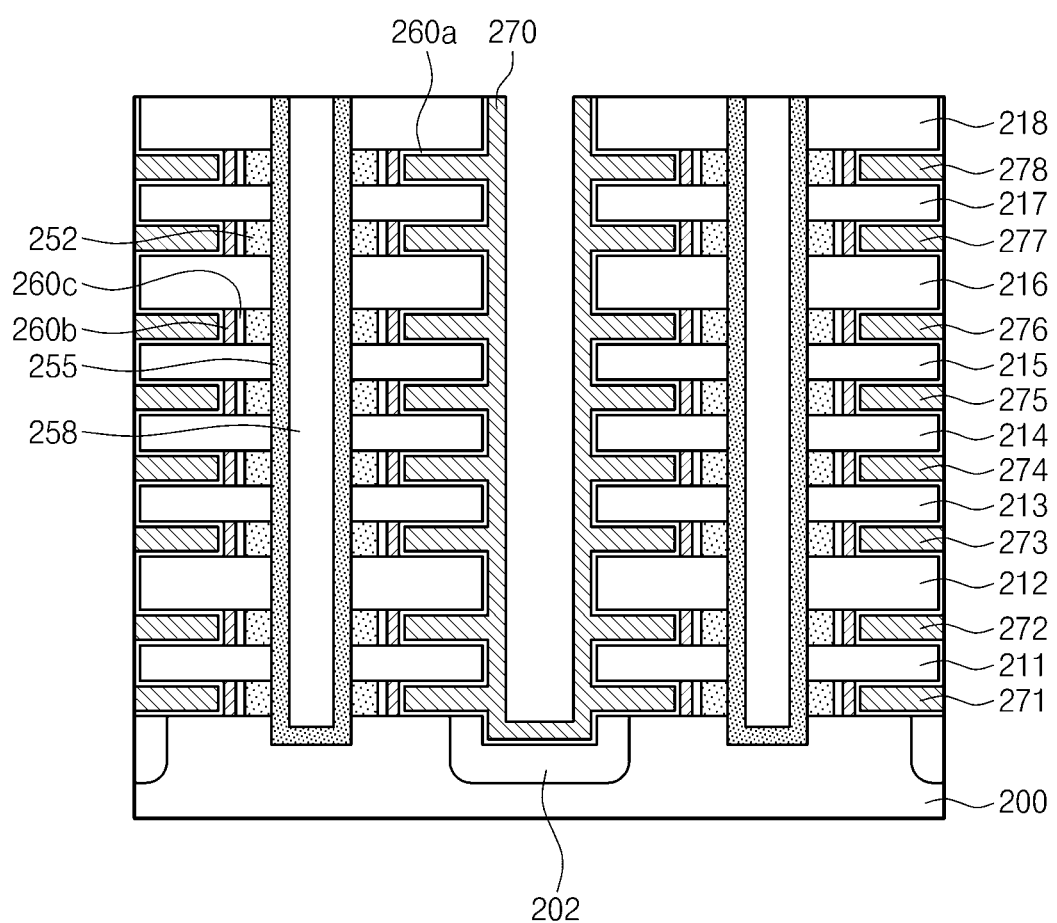

Referring to FIG. 42, the inter-gate insulation layer 260a and the gate conductive layer 270 are sequentially formed within the third recess regions 244 and the third penetration region 243. The inter-gate insulation layer 260a and the gate conductive layer 270 may be formed using the deposition technique (e.g., the CVD or ALD technique) which provides good step coverage.

The inter-gate insulation layer 260a may be formed to a thinner thickness than a half of the thickness of the third recess regions 244. Accordingly, the inter-gate insulation layer 260a may be formed to conformally cover the thin layer structure where the third recess regions 244 and the third penetration region 243 are formed. The inter-gate insulation layer 260a may be formed of, e.g., silicon oxide layer ($SiO_2$) or silicon oxynitiride layer (SiON). Also, the inter-gate insulation layer 260a may be formed to multi-layers depositing a high-dielectric-constant material such as $Al_2O_3$, $HfO_2$, $ZrO_2$, $La_2O_3$, $Ta_2O_3$, $TiO_2$, $SrTiO_3$(STO), and $(Ba, Sr)TiO_3$(BST) or their combination.

The gate conductive layer 270 may be conformally formed within the third penetration region 243 filling the third recess regions 244 where the inter-gate insulation layer 260a is formed. The gate conductive layer 270 may include at least one of doped silicon, tungsten, metal nitride layers and metal silicides.

Figure 43:
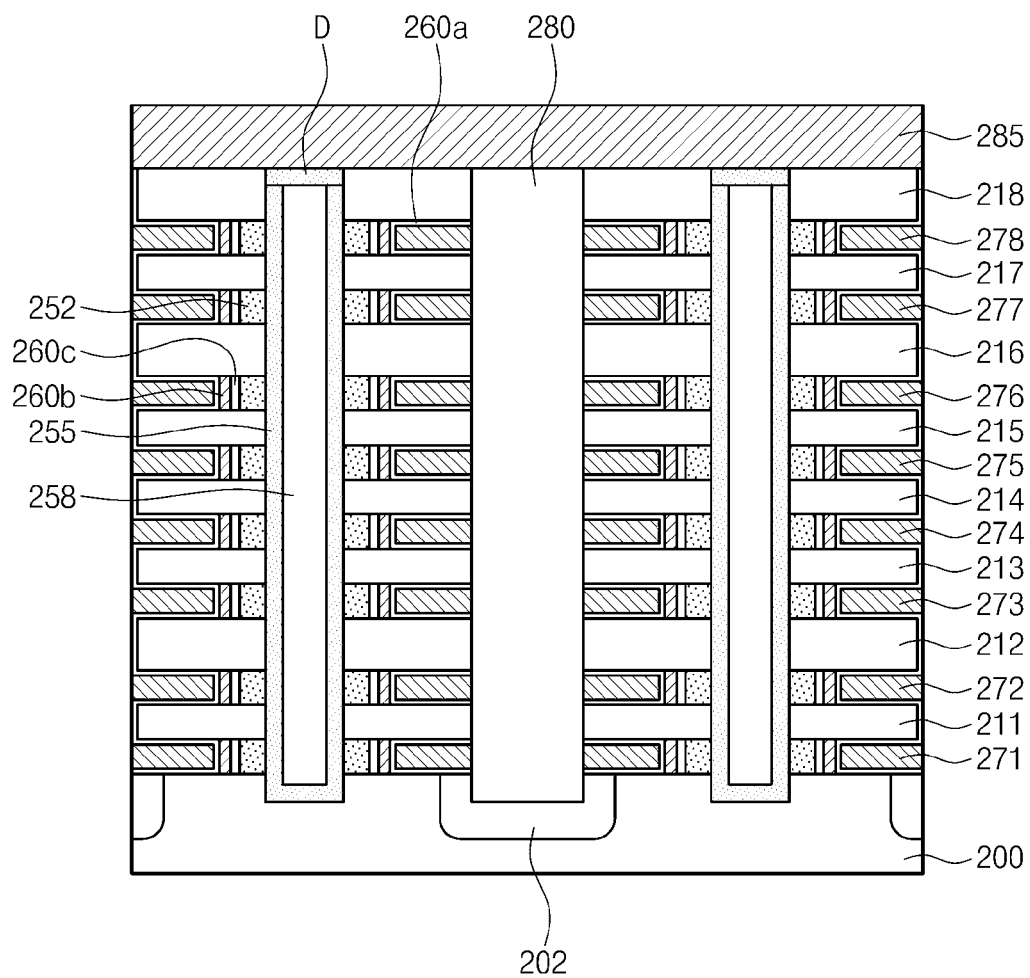

Thereafter, referring to FIG. 43, by removing the gate conductive layer 270 which fills the third penetration region 243, the gate conductive patterns 271 to 278 are partially formed at each of the third recess regions 244. Forming the gate conductive patterns 271 to 278 includes forming the fourth penetration region 245 by isotropically etching the gate conductive layer 270 which fills the third penetration region 243 as described above referring to FIG. 34. According to the embodiment, the fourth penetration region 245 may expose the surface of the gate insulation layer 260c on the sidewalls of the interlayer dielectrics 211 to 219 and the upper surface of the substrate 200. Thereafter, by filling the fourth penetration region 245 with a dielectric material, the electrode isolation pattern 280 is formed, and the bit lines 285 which electrically connect the second semiconductor patterns 255 are formed on the thin layer structure 230.

Figure 44:
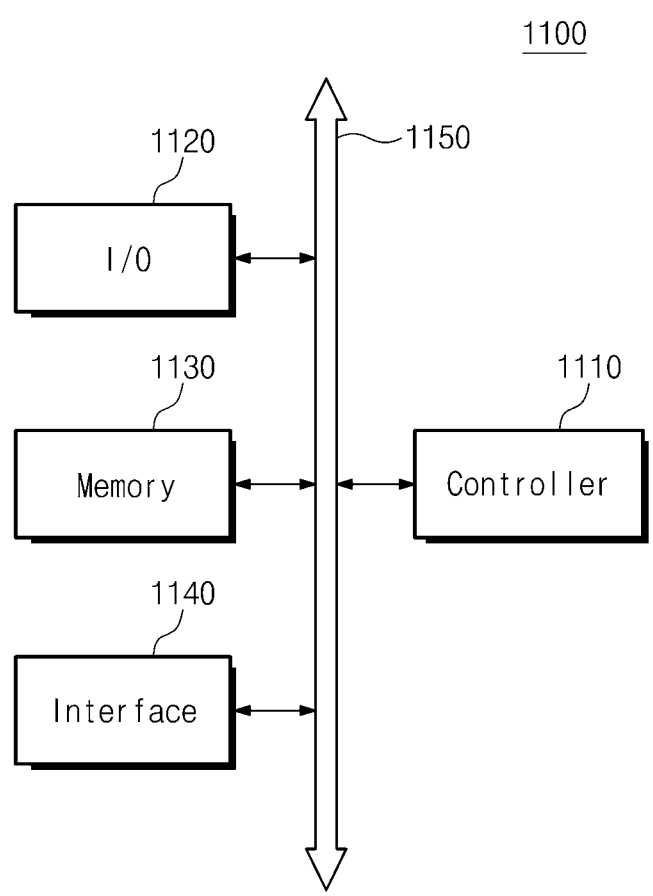
FIG. 44 illustrates a block diagram of a memory system which includes a semiconductor memory device according to the embodiments of the inventive concept.

FIG. 44 is a block diagram illustrating a memory system which includes a semiconductor memory device manufactured according to the manufacturing method of the embodiments of the inventive concept.

Referring to FIG. 44, a memory system 1100 may be applicable to PDAs, portable computers, web tablets, wireless phones, mobile phones, digital music players, memory card, or any devices capable of transmitting/receiving data in a wireless environment.

The memory system 1100 includes a controller 1110, an input/output device 1120 such as a keypad, a keyboard, and display, a memory 1130, an interface 1140, and a bus 1150. The memory 1130 and the interface 1140 communicate with each other through the bus 1150.

The controller 1110 includes at least one microprocessor, digital signal processor, microcontroller, or another similar processing device. The memory 1130 may be used for storing a command performed by the controller. The input/output device 1120 may receive data or signal from the outside of the memory system 1100 or may output data or signal to the outside of the memory system 1100. For instance, the input/output device 1120 may include the keyboard, keypad, or display device.

The memory 1130 includes a nonvolatile memory device according to the embodiments of the inventive concept. The memory 1130 may further include volatile memories capable of random access and other various kinds of memories.

The interface 1140 serves to transmit data to a communication network or receive data from the communication network.

Figure 45:
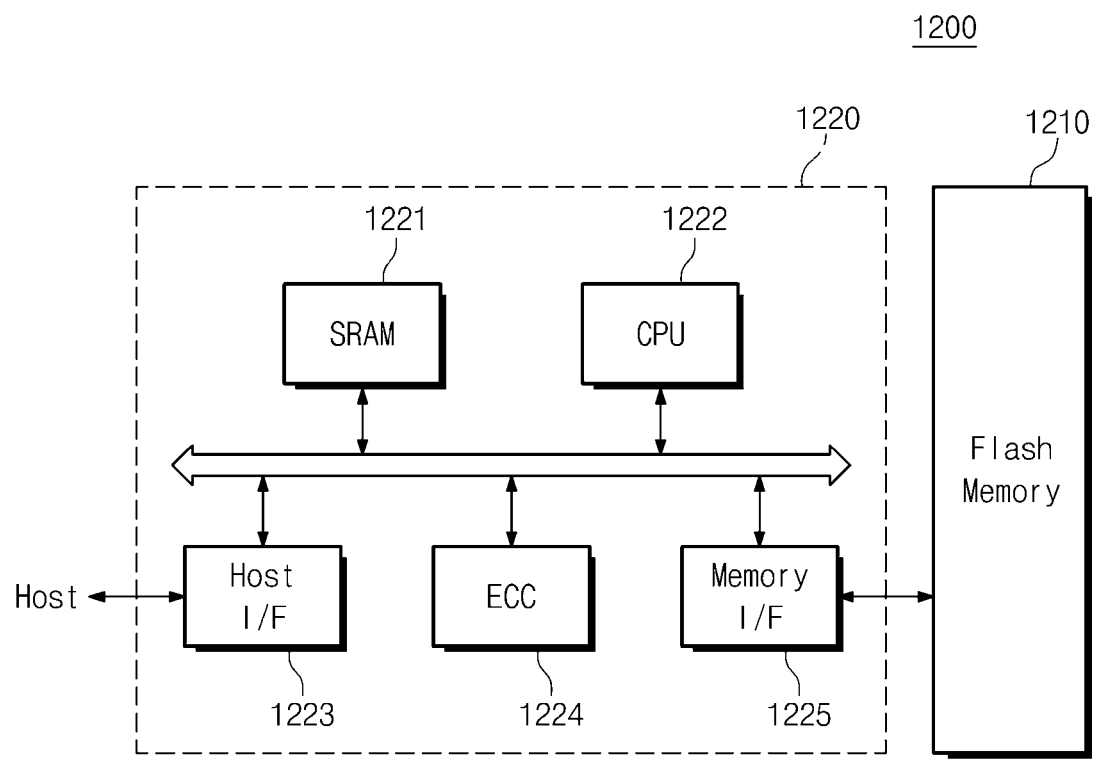
FIG. 45 illustrates a block diagram of a memory card provided with a semiconductor memory device according to the embodiments of the inventive concept.

FIG. 45 is a block diagram illustrating a memory card provided with a semiconductor memory device manufactured according to the manufacturing method of the embodiments of the inventive concept.

Referring to FIG. 45, a memory card 1200 for supporting mass data storage includes a flash memory device 1210 according to the inventive concept. The memory card 1200 according to the inventive concept includes a memory controller 1220 for controlling various data exchanges between a host and the flash memory device 1210.

An SRAM 1221 is used as an operating memory of a processing unit 1222. A host interface 1223 is provided with a data exchange protocol of the host connected to the memory card 1200. An error correction block 1224 detects and corrects errors of data read out from the flash memory device 1210. A memory interface 1225 interfaces with the flash memory device 1210. The processing unit 1222 performs various control operations for data exchange of the memory controller 1220. Although not illustrated in the drawing, the memory card 1200 may be further provided with a ROM (not illustrated) for storing code data for interfacing with the host.

Figure 46:
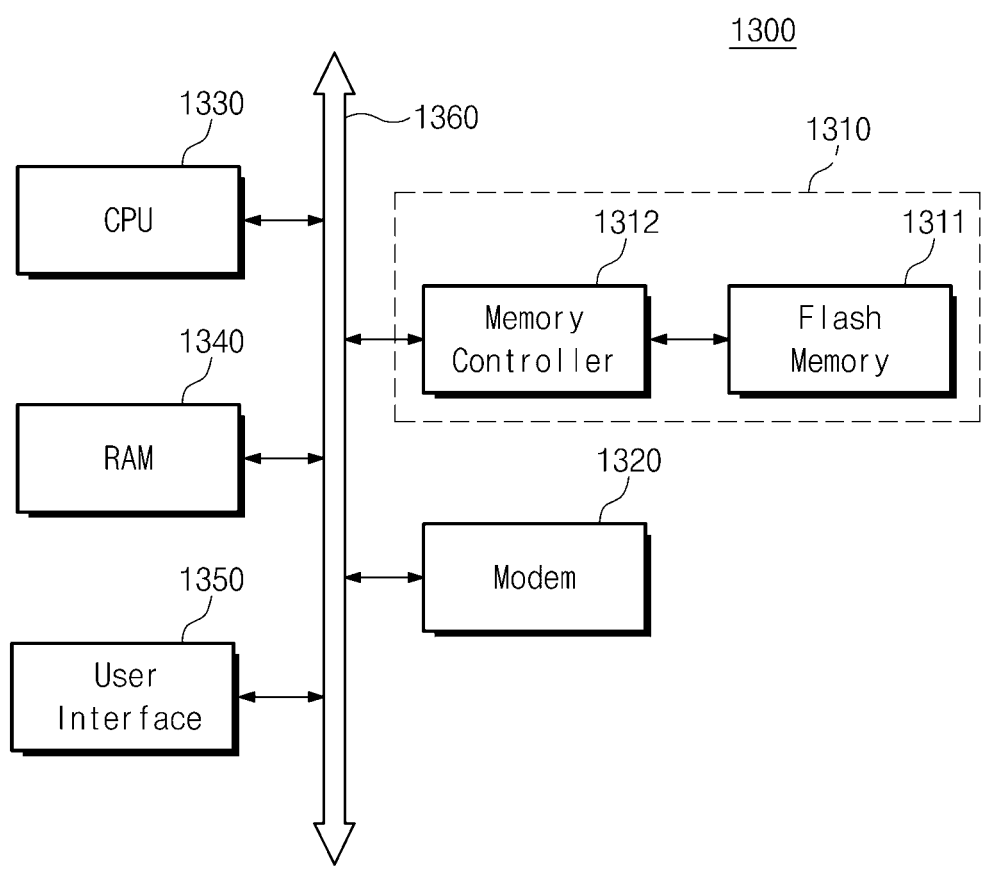
FIG. 46 illustrates a block diagram of an information processing system provided with a semiconductor memory device according to the embodiments of the inventive concept.

FIG. 46 is a block diagram illustrating an information processing system provided with a semiconductor memory device manufactured according to the manufacturing method of the embodiments of the inventive concept.

Referring to FIG. 46, a flash memory system 1310 according to the inventive concept is included in an information processing system such as a mobile device or a desktop computer. An information processing system 1300 according to the inventive concept includes a modem 1320, a Central Processing Unit (CPU) 1330, a RAM 1340, and a user interface 1350 electrically connected to the flash memory system 1310 and respective system bus 1360. The flash memory system 1310 may have the substantially same configuration as the above-mentioned memory system or flash memory system. Data processed by the CPU 1330 or inputted from the outside are stored into the flash memory system 1310. Herein, the above-described flash memory system 1310 may be structured with a semiconductor disk device (SSD). In this case, the information processing system 1300 may stably store mass data in the flash memory system 1310. And, as reliability is increased, the flash memory system 1310 may save resources consumed for correcting errors so that it provides a high speed of data exchange function to the information processing system 1300. Although not illustrated, it is clear that the information processing system 1300 according to the inventive concept may be further provided with an application chipset, a Camera Image Processor (CIS) and an input/output device.

The flash memory device or the memory system according to the inventive concept may be mounted in various types of packages. Examples of the packages of the flash memory device or the memory system include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

According to the embodiment, in the three-dimensional semiconductor memory device, the crystallinity of parts of the semiconductor pattern used as the channel region of MOS transistors can be improved. In detail, by directly irradiating laser to the parts of the semiconductor pattern adjacent to the stacked conductive patterns for recrystallization, the grain size can be increased in the parts of the semiconductor pattern where the channel region is formed. Therefore, the grain boundaries are reduced in the channel region so that the mobility of charges can be improved when the three-dimensional semiconductor memory device is operated.

Therefore, in the three-dimensional semiconductor memory device, operating speed for reading and writing data from/to memory cells can be improved.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A three-dimensional semiconductor memory device, comprising:
   a stacked structure including a plurality of conductive patterns;
   an active pillar penetrating the stacked structure; and
   a data storage pattern between the active pillar and the conductive patterns,
   wherein the active pillar includes a vertical semiconductor pattern penetrating the stacked structure and protruding semiconductor patterns between the vertical semiconductor pattern and the data storage pattern, the protruding semiconductor patterns having a different crystalline structure from that of the vertical semiconductor pattern.

2. The three-dimensional semiconductor memory device as claimed in claim 1, wherein the active pillar includes a discontinuous boundary surface between the vertical semiconductor pattern and the protruding semiconductor patterns.

3. The three-dimensional semiconductor memory device as claimed in claim 1, wherein a mean grain size in the protruding semiconductor pattern is larger than the mean grain size in the vertical semiconductor pattern.

4. The three-dimensional semiconductor memory device as claimed in claim 1, wherein the stacked structure includes insulation patterns between the conductive patterns, the vertical semiconductor pattern including a first thickness adjacent to the insulation patterns and a second thickness, thicker than the first thickness, adjacent to the conductive pattern.

5. The three-dimensional semiconductor memory device as claimed in claim 1, wherein the protruding semiconductor patterns have ring shapes surrounding the vertical semiconductor pattern.

6. The three-dimensional semiconductor memory device as claimed in claim 1, wherein the vertical semiconductor pattern has a hollow cylinder shape or a pillar shape.

7. The three-dimensional semiconductor memory device as claimed in claim 1, wherein the data storage pattern includes a plurality of data storage patterns at least partially separated from each other along a vertical direction.

8. The three-dimensional semiconductor memory device as claimed in claim 7, wherein the data storage pattern further comprises:
- a gate insulation layer contacting the protruding semiconductor pattern;
- an inter-gate insulation layer contacting the conductive pattern; and
- a floating gate electrode between the gate insulation layer and the inter-gate insulation layer.

9. The three-dimensional semiconductor memory device as claimed in claim 7, wherein the data storage patterns are completely separated from each other, each data storage pattern extending along an upper surface and a lower surface of the protruding semiconductor pattern.

10. The three-dimensional semiconductor memory device as claimed in claim 7, wherein the data storage patterns are completely separated from each other, each data storage pattern extending along an upper surface and a lower surface of the conductive pattern.

* * * * *